(12) United States Patent
Kim

(10) Patent No.: US 9,525,025 B2
(45) Date of Patent: Dec. 20, 2016

(54) SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

(71) Applicant: SK hynix Inc., Gyeonggi-do (KR)

(72) Inventor: Seung-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/858,905

(22) Filed: Sep. 18, 2015

(65) Prior Publication Data
US 2016/0307999 A1  Oct. 20, 2016

(30) Foreign Application Priority Data

Apr. 20, 2015 (KR) ........................ 10-2015-0055435

(51) Int. Cl.
| | | |
|---|---|---|
| H01L 27/108 | (2006.01) | |
| H01L 21/764 | (2006.01) | |
| H01L 29/06 | (2006.01) | |
| H01L 29/423 | (2006.01) | |
| H01L 29/78 | (2006.01) | |
| H01L 27/112 | (2006.01) | |

(52) U.S. Cl.
CPC ......... *H01L 29/0653* (2013.01); *H01L 21/764* (2013.01); *H01L 27/10876* (2013.01); *H01L 27/10885* (2013.01); *H01L 27/10891* (2013.01); *H01L 27/11286* (2013.01); *H01L 29/0638* (2013.01); *H01L 29/4236* (2013.01); *H01L 29/7827* (2013.01)

(58) Field of Classification Search
CPC ................... H01L 27/10876; H01L 27/10823; H01L 27/10885; H01L 21/764; H01L 29/4236; H01L 27/10891
See application file for complete search history.

(56) References Cited

U.S. PATENT DOCUMENTS

| | | | | |
|---|---|---|---|---|
| 2011/0068384 A1* | 3/2011 | Kim | .................... | H01L 27/0207 257/302 |
| 2011/0284939 A1* | 11/2011 | Chung | .............. | H01L 27/10805 257/296 |
| 2011/0309425 A1* | 12/2011 | Purayath | ............... | H01L 21/764 257/316 |
| 2012/0037975 A1* | 2/2012 | Cho | ...................... | H01L 21/764 257/321 |
| 2012/0217570 A1* | 8/2012 | Kim | .................. | H01L 27/10876 257/324 |
| 2013/0126816 A1* | 5/2013 | Tang | ................... | H01L 27/2463 257/3 |
| 2013/0187220 A1* | 7/2013 | Surthi | ................... | H01L 21/764 257/329 |

(Continued)

*Primary Examiner* — Marvin Payen
*Assistant Examiner* — Jeremy Joy
(74) *Attorney, Agent, or Firm* — IP & T Group LLP

(57) ABSTRACT

A semiconductor device including a substrate including an active region and a device isolation region that isolates the active region, and a buried bit line and a buried gate electrode formed in the substrate. The device isolation region includes a first device isolation region extending in a first direction and a second device isolation region extending in a second direction crossing with the first direction and having an formed air gap.

18 Claims, 62 Drawing Sheets

(56) References Cited

U.S. PATENT DOCUMENTS

| | | | |
|---|---|---|---|
| 2014/0015027 A1* | 1/2014 | Mikasa | H01L 29/66666 257/296 |
| 2014/0027916 A1* | 1/2014 | Lee | H01L 21/764 257/773 |
| 2014/0061742 A1* | 3/2014 | Nishitani | H01L 27/10814 257/296 |
| 2014/0070306 A1 | 3/2014 | Surthi | |
| 2014/0112050 A1* | 4/2014 | Park | H01L 27/10882 365/72 |
| 2014/0179073 A1 | 6/2014 | Kim | |
| 2014/0254243 A1* | 9/2014 | Moon | G11C 13/0002 365/148 |
| 2015/0126013 A1* | 5/2015 | Hwang | H01L 27/10888 438/381 |

* cited by examiner

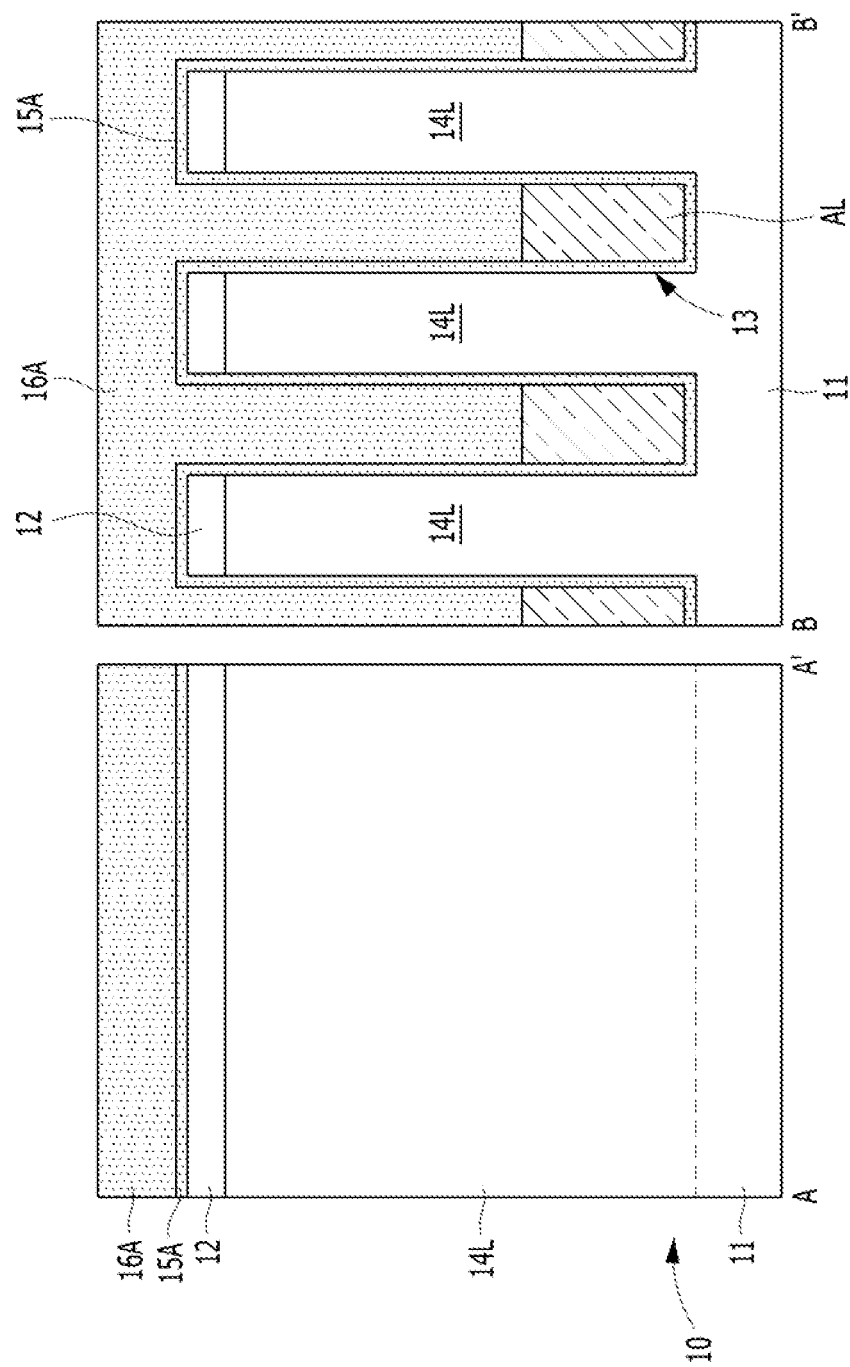

SEMICONDUCTOR DEVICE HAVING AIR GAP AND METHOD FOR MANUFACTURING THE SAME, MEMORY CELL HAVING THE SAME AND ELECTRONIC DEVICE HAVING THE SAME

CROSS-REFERENCE TO RELATED APPLICATIONS

The present application claims priority of Korean Patent Application No. 10-2015-0055435, filed on Apr. 20, 2015, which is incorporated herein by reference in its entirety.

BACKGROUND

1. Field

Exemplary embodiments of the present invention relate to a semiconductor device, and more particularly, to a semiconductor device having an air gap, a method for manufacturing the same, a memory cell having the same, and an electronic device having the same.

2. Description of the Related Art

As semiconductor devices become more highly integrated, parasitic capacitance between neighboring conductive structures exerts more influence on the performance of the semiconductor device.

SUMMARY

An embodiment of the present invention is directed to a semiconductor device having suppressed parasitic capacitance between neighboring conductive structures and a method for manufacturing the same.

Another embodiment of the present invention is directed to a memory cell having improved refresh characteristics.

Still another embodiment of the present invention is directed to an electronic device with improved performance.

In accordance with an embodiment of the present invention, a semiconductor device may include an active region, and a device isolation region that isolates the active region and a buried bit line and a buried gate electrode formed in the semiconductor substrate, The device isolation region may comprise a first device isolation region extending in a first direction and a second device isolation region extending in a second direction crossing with the first direction, and having an air gap.

The active region may have a length in the first direction and a width in the second direction, the first device isolation region may be positioned between neighboring active regions in the second direction, and the second device isolation region may be positioned between neighboring active regions in the first direction. The semiconductor device may further comprise a first isolation trench extending in the first direction, the first device isolation region may be formed in the first isolation trench. The semiconductor device may further comprise a second isolation trench extending in the second direction, the second device isolation region may be formed in the second isolation trench. The second isolation trench may comprise an upper isolation trench and a lower isolation trench that may have a bulb shape and may be wider than the upper isolation trench, the air gap may be formed in the lower isolation trench. The semiconductor device may further comprise a gate trench comprising a bottom surface, a first side surface and a second side surface opposite to the first side surface, the buried gate electrode may be formed in the gate trench. The gate trench may comprise a first trench extending in the second direction and second and third trenches stemming from the first trench and extending in the first direction. The buried gate electrode may comprise a first electrode buried in the first trench of the gate trench a second electrode buried in the second trench of the gate trench and a third electrode buried in the third trench of the gate trench. The semiconductor device may further comprise a bit line trench extending in a third direction crossing with the first and second directions, the buried bit line may be formed in the bit line trench. The semiconductor device may further comprise a body trench under the buried bit line and a punch-through prevention layer formed in the body trench, the punch-through prevention layer may be positioned in the active region. The active region comprises a body and a pillar vertically extending over the body, and the pillar may comprise a first junction region electrically coupled to the bit line a second junction region vertically positioned relative to the first junction region and a channel positioned between the first and second junction regions, and overlapping with the buried gate electrode. The semiconductor device may further comprise a memory element electrically coupled to the second junction region.

In accordance with another embodiment of the present invention, a semiconductor device may include a semiconductor substrate including an active region, and a device isolation region that isolates the active region and a buried bit line and a buried gate electrode formed in the substrate, the device isolation region may comprise a first device isolation region extending in a first direction and having a first air gap and a second device isolation region extending in a second direction crossing with the first direction, and having a second air gap, and the active region may be defined by the first and second device isolation regions.

The active region may have a length in the first direction and a width in the second direction, the first device isolation region may be positioned between neighboring active regions in the second direction, and the second device isolation region may be positioned between neighboring active regions in the first direction. The semiconductor substrate comprises a line type first isolation trench extending in the first direction, and the first device isolation region may be formed in the first isolation trench. The semiconductor substrate further comprises a second isolation trench extending in the second direction, and the second device isolation region may be formed in the second isolation trench. The second isolation trench may comprise an upper isolation trench and a lower isolation trench that may have a bulb shape and may be wider than the upper isolation trench, and the first air gap may be formed in the lower isolation trench. The semiconductor substrate further comprises a gate trench comprising a bottom surface, a first side surface and a second side surface opposite to the first side surface, and the gate electrode may be formed in the gate trench. The gate trench may comprise a first trench extending in the first direction and a second trench and a third trench stemming from the first trench and extending in the second direction crossing with the first direction. The gate electrode may comprise a first electrode formed in the first trench of the gate trench a second electrode formed in the second trench of the gate trench and a third electrode formed in the third trench of the gate trench. The semiconductor substrate further comprises a bit line trench extending in a third direction crossing with the first and second directions, and the buried bit line may be formed in the bit line trench. The semiconductor device may further comprise a body trench under the buried bit line and a punch-through prevention layer formed in the body trench. The semiconductor substrate further comprises a pillar may comprise a first junction region electrically coupled to the buried bit line a second junction region vertically positioned relative to the first junction region and a vertical channel positioned between the first and second junction regions, and overlapping with the gate electrode. The semiconductor device may further comprise a memory element electrically coupled to the second junction region.

In accordance with yet another embodiment of the present invention, a method for manufacturing a semiconductor device may include a forming a line type active region by etching a semiconductor substrate; forming a line type active region by etching a semiconductor substrate forming a plurality of island type active regions and an isolation trench by cutting the line type active region forming a device isolation region having an air gap in the isolation trench and forming a buried bit line and a buried gate electrode formed in the island type active region.

The forming the isolation trench may comprise forming an upper isolation trench by etching the line type active region forming a spacer on sidewalls of the upper isolation trench and forming a bulb type lower isolation trench by isotropic etching a bottom surface of the upper isolation trench through the spacer as an etch mask. The forming the device isolation region may comprise forming a liner layer over a surface of the isolation trench to form an air gap in the lower isolation trench by the liner layer and forming an isolation dielectric layer over the liner layer.

In accordance with still another embodiment of the present invention, a method for manufacturing a semiconductor device may include forming a line type active region and a first isolation trench by etching a semiconductor substrate forming a first device isolation region comprising a recessed preliminary air layer in the first isolation trench forming a plurality of island type active regions and a second isolation trench by cutting the line type active region and the first isolation trench forming a second device isolation region having a first air gap in the second isolation trench forming a buried bit line and a buried gate electrode formed in the island type active region and forming a second air gap in the first device isolation region by removing the recessed preliminary air layer.

The forming the first device isolation region may comprise forming a liner layer over a surface of the first isolation trench forming a preliminary air layer filling the first isolation trench over the liner layer forming a recessed preliminary air layer by recessing the preliminary air layer and filling an isolation dielectric layer over the recessed preliminary air layer. The recessed preliminary air layer may be formed of silicon germanium. The forming the second device isolation region may comprise forming an upper isolation trench by etching the line type active region forming a spacer on sidewalls of the upper isolation trench forming a bulb type lower isolation trench by isotropic etching a bottom surface of the upper isolation trench through the spacer as an etch mask forming a liner layer over a surface of the lower isolation trench to form a first air gap in the lower isolation trench by the liner layer and forming an isolation dielectric layer over the liner layer. The forming the buried bit line and the buried gate electrode may comprise forming a bit line trench and a pair of preliminary pillars spaced apart from each other according to the bit line trench by etching the Island type active region and the first and second device isolation regions forming the buried bit line in the bit line trench forming a gate trench and a pair of pillars spaced apart from each other by the gate trench by etching the preliminary pillars and forming the buried gate electrode overlapping with sidewalls of the pillars and formed in the gate trench. The forming the gate trench comprises forming a first trench extending in the first direction, and second and third trenches stemming from the first trench and extending in the second direction crossing with the first direction by performing a wet widening process that exposes side surfaces of the pillars. The forming the buried gate electrode comprises forming the buried gate electrode to comprise a first electrode buried in the first trench of the gate trench, a second electrode buried in the second trench of the gate trench, and a third electrode buried in the third trench of the gate trench.

BRIEF DESCRIPTION OF THE DRAWINGS

FIGS. 10A to 10G are views illustrating a method for manufacturing a semiconductor device in accordance with an embodiment.

DETAILED DESCRIPTION

Figure 1:
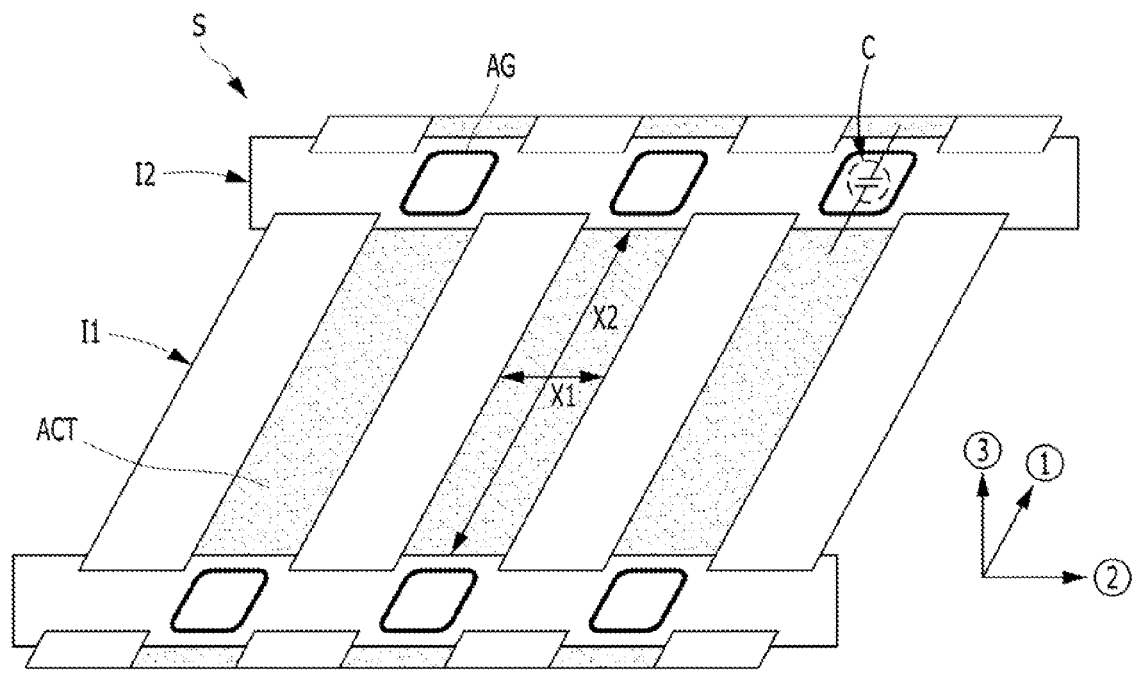
FIG. 1 is a cross-sectional view illustrating a device isolation region in accordance with a first embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is stated as being "on" a second layer or "on" a substrate, it not only refers to a where the first layer is formed directly on the second layer or the substrate but also to where a third layer exists between the first and second layers or the substrate.

FIG. 1 is a cross-sectional view illustrating a device isolation region in accordance with a first embodiment.

Referring to FIG. 1, a device isolation region and an active region ACT may be formed in a substrate S. The device isolation region may include first and second device isolation regions I1 and I2. The active region ACT may be defined by the first and second device isolation regions I1 and I2. The first device isolation region I1 may extend in a first direction ①, and the second device isolation region I2 may extend in a second direction ② crossing with the first direction. The first device isolation region I1 may become discontinuous by the second device isolation region I2. The first and second device isolation regions I1 and I2 may be shallow trench isolation (STI) regions which are formed by trench etching. The first and second device isolation regions I1 and I2 may be formed by filling a dielectric material in isolation trenches, respectively. The first and second device isolation regions I1 and I2 may be formed of the same material or different materials. For example, each of the first and second device isolation regions I1 and I2 may include one or more of silicon oxide, silicon nitride and a combination thereof. The second device isolation region I2 may have an air gap AG.

The active region ACT may be an island type active region. A plurality of active regions ACT may be arrayed in the first and second directions ① and ②, and the first device isolation region I1 may be interposed between the neighboring active regions ACT in the second direction. The plurality of active regions ACT may be spaced apart from each other with first and second uniform intervals in the first and second directions, respectively, and may be approximately the same size. The active regions ACT may extend in the first direction and the second direction. The second device isolation region I2 may be positioned between the plurality of active regions ACT in the first direction. The first device isolation region I1 may be positioned between the plurality of active regions ACT in the second direction. Hereinafter, descriptions will be given for one of the active regions ACT.

In accordance with FIG. 1, the second device isolation region I2 having the air gap AG may be positioned between the neighboring active regions ACT in the first direction. Thus, parasitic capacitance C between the neighboring active regions ACT may be reduced.

Various semiconductor devices may be formed in the active region ACT.

Hereinafter, an example of a semiconductor device in accordance with the first embodiment will be described.

Figure 2A:
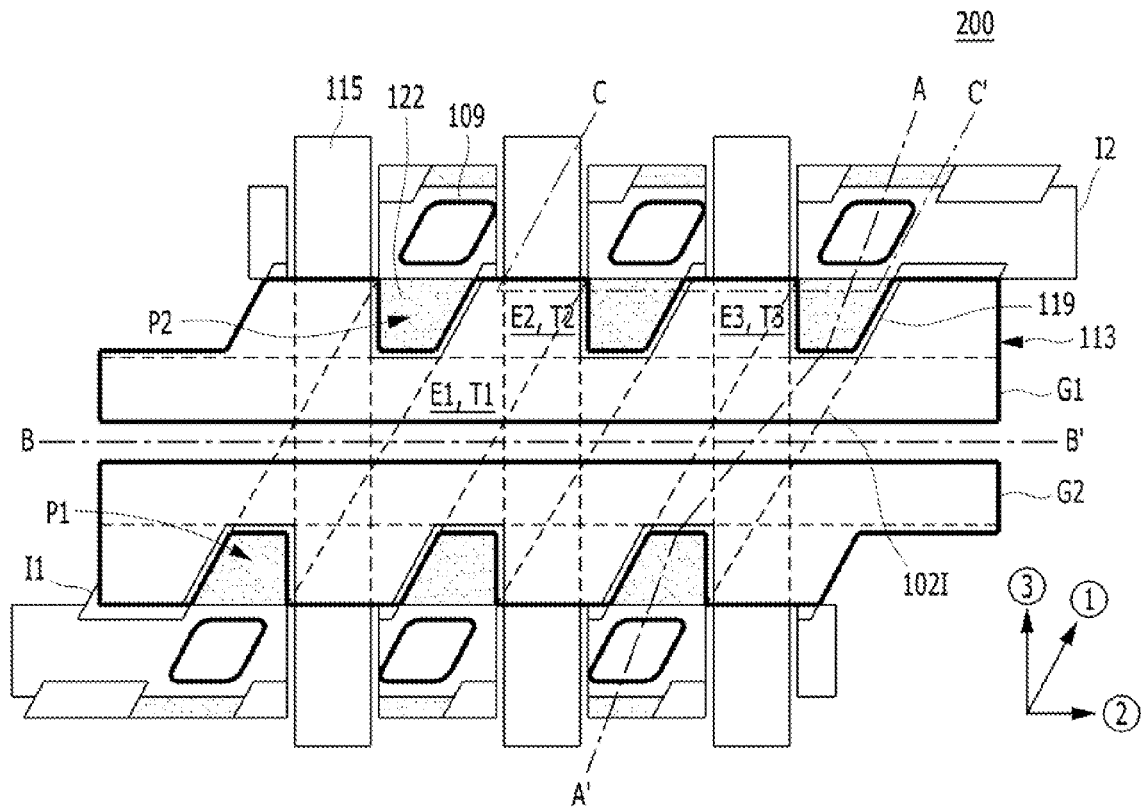
FIG. 2A is a plan view illustrating a semiconductor device in accordance with a first embodiment.
Figure 2B:
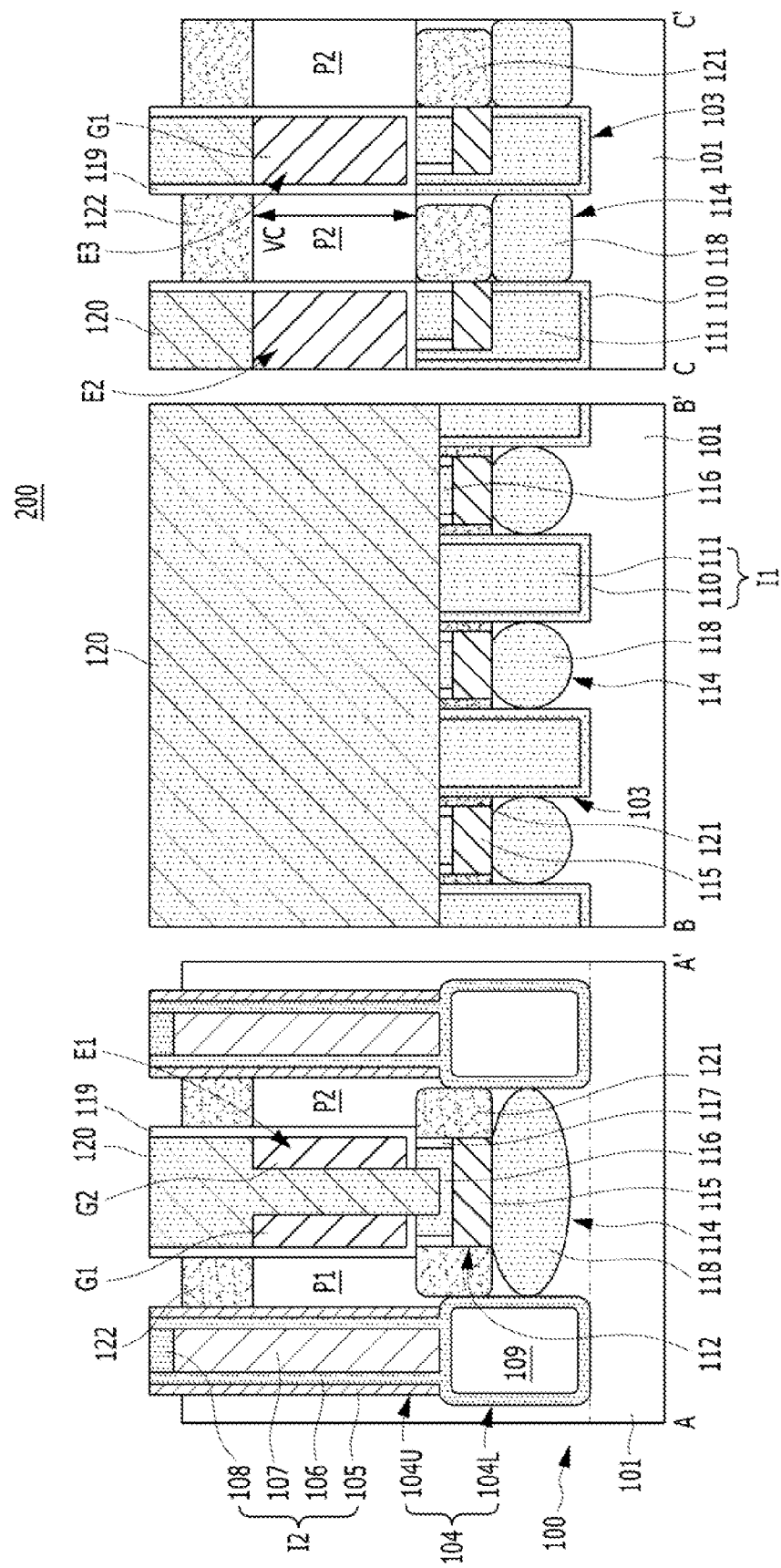
FIG. 2B is a cross-sectional view taken along the line A-A', B-B' and C-C' of FIG. 2A.

FIG. 2A is a plan view of a semiconductor device in accordance with the first embodiment. FIG. 2B is a cross-sectional view taken along the line A-A', B-B' and C-C' of FIG. 2A. A semiconductor device 200 may include a memory cell.

The semiconductor device 200 may include a substrate 100. The substrate 100 may include a semiconductor substrate. The substrate 100 may be formed of a silicon-containing material. The substrate 100 may include one or more of silicon, monocrystalline silicon, polysilicon, amorphous silicon, silicon germanium, monocrystalline silicon germanium, polycrystalline silicon germanium, carbon-doped silicon, a combination thereof, and a multi-layer thereof. The substrate 100 may include a semiconductor material such as germanium. The substrate 100 may include one or more of III/V group semiconductor materials, for example, a compound semiconductor substrate such as GaAs. The substrate 100 may include a silicon-on-insulator (SOI) substrate.

A device isolation region and an active region 102I may be formed in substrate 100. The device isolation region may include a first and second device isolation regions I1 and I2. The active region 102I may be defined by the first and second device isolation regions I1 and I2. A part of the substrate 100 under the active region 102I may become a bulk 101. The first device isolation region I1 may extend in a first direction ①, and the second device isolation region I2 may extend in a second direction ② crossing with the first direction ①. The first device isolation region I1 may become discontinuous by the second device isolation region I2. The first and second device isolation regions I1 and I2 may be shallow trench isolation (STI) regions which are formed by trench etching. The first and second device isolation regions I1 and I2 may be formed by filling a dielectric material in isolation trenches 103 and 104, respectively. The first and second device isolation regions I1 and I2 may be formed of the same material or different materials. For example, each of the first and second device isolation regions I1 and I2 may include one or more of silicon oxide, silicon nitride and a combination thereof. The second device isolation region I2 may include a spacer 105, a second liner 106, a first isolation dielectric layer 107 and a second isolation dielectric layer 108. The second device isolation region I2 may be formed in the second isolation trench 104. An air gap 109 may be formed in the second device isolation region I2. The first device isolation region I1 may include a first liner 110 and a first isolation dielectric layer 111

The active region 102I may be an island type active region. A plurality of active regions 102I may be arrayed in the first and second directions, and the first device isolation region I1 is interposed between the neighboring active regions 102I in the second direction. The plurality of active regions 102I may be spaced from each other with first and second uniform intervals in the first and second directions, respectively, and may be approximately the same size. The active region 102I may extend in the first direction and the second direction. The second device isolation region I2 may be positioned between the plurality of active regions 120I in the first direction. The first device isolation region I1 may be positioned between the plurality of active regions 102I in the second direction. Hereinafter, descriptions will be given for one of the active regions 102I. The active region 102I may include first and second pillars P1 and P2. The first and second pillars P1 and P2 may form a pair that is symmetrical. One side surface of each of the first and second pillars P1 and P2 may contact the second device isolation region.

The substrate 100 may include a plurality of trenches. The trenches may include a bit line trench 112, a gate trench 113 over the bit line trench 112, and a body trench 114 under the bit line trench 112. The bit line trench 112 may extend in a third direction ③. The third direction ③ may be a direction crossing with the first and second directions ① and ②. The gate trench 113 may extend in the second direction ②. The second direction ② may be a direction crossing with the first and third directions ① and ③. The body trench 114 may extend in the first direction and the extending thereof may be the same as the active region 102I.

The first and second pillars P1 and P2 may be spaced apart from each other by the gate trench 113.

A buried bit line 115 may be formed in the bit line trench 112. A bit line capping layer 116 may be formed on the buried bit line 115. The buried bit line 115 may include a low resistivity metal. The buried bit line 115 may include tungsten. A bit line capping liner 117 may be positioned between the bit line capping layer 116 and the bit line trench 112. The bit line capping layers 116 and 117 may include a dielectric material. The bit line capping layers 116 and 117 may include one or more of silicon oxide, silicon nitride and a combination thereof. The bit line capping layer 116 may cover the top surface of the buried bit line 115. Thus, the buried bit line 115 may be buried in the substrate 100. A punch-through prevention layer 118 may be formed under the buried bit line 115. The punch-through prevention layer 118 may be formed of a dielectric material. The punch-through prevention layer 118 may prevent punch between neighboring buried bit lines 115. The punch-through prevention layer 118 allows the buried bit line 115 to float from the bulk 111 of the substrate 100.

The gate trench 113 may separate the first and second pillars P1 and P2. A pair of gate electrodes G1 and G2 may be formed in the gate trench 113. Between the pair of gate electrodes G1 and G2, the first gate electrode G1 may overlap with the side surface of the first pillar P1, and the second gate electrode G2 may overlap with the side surface of the second pillar P2. The first and second gate electrodes G1 and G2 may be symmetrical to each other.

A gate dielectric layer 119 may be formed on the sidewalls of the first and second pillars P1 and P2. The first gate electrode G1 and the second gate electrode G2 may be covered by a gate capping layer 120. The top surfaces of the first and second gate electrodes G1 and G2 may be positioned at a level lower than the top surfaces of the first and second pillars P1 and P2. The top surface of the gate capping layer 120 may be at the same level as the top surfaces of the first and second pillars P1 and P2. Since the first and second gate electrodes G1 and G2 are positioned in the gate trench 113 and are covered by the gate capping layer 120, the first and second gate electrodes G1 and G2 may become a buried structure. Thus, the first and second gate electrodes G1 and G2 may be buried gate electrodes. The semiconductor device 200 may be applied to a memory cell. Therefore, the first and second gate electrodes G1 and G2 may become buried word lines.

The gate dielectric layer 119 may be formed on the sidewalls of the gate trench 113. That is, the gate dielectric layer 119 may cover the gate trench 113. Also, the gate dielectric layer 119 may cover the lower side surfaces and the upper side surfaces of the first and second pillars P1 and P2. The gate dielectric layer 119 may include one or more of silicon oxide, silicon nitride, silicon oxynitride, a high-k material and a combination thereof. The high-k material may include a material with a dielectric constant that is higher than the dielectric constant of silicon oxide. For example, the high-k material may include a material with a dielectric constant higher than 3.9. For another example, the high-k material may include a material with a dielectric constant higher than 10. Yet in another example, the high-k material may include a material with a dielectric constant of 10 to 30. The high-k material may include one or more metallic elements. The high-k material may include a hafnium-containing material. The hafnium-containing material may include one or more of hafnium oxide, hafnium silicon oxide, hafnium silicon oxynitride and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. In another embodiment, other high-k materials known in the art may be used.

The bottom surfaces of the first and second gate electrodes G1 and G2 may contact the bit line capping layer 116. That is, the bit line capping layer 116 may be positioned between the first and second gate electrodes G1 and G2 and the bit line 115. The first and second gate electrodes G1 and G2 may overlap with the side surfaces of the first and second pillars P1 and P2.

First and second junction region 121 and 122 may formed in the first and second pillars P1 and P2. The first junction region 121 may be positioned in the lower portions of the first and second pillars P1 and P2, and the second junction region 122 may be positioned in the upper portions of the first and second pillars P1 and P2. The first junction region 121 may be electrically coupled to the buried bit line 115. The first junction region 121 may be positioned at a level lower than that of the second junction region 122. A vertical channel VC may be formed between the first and second junction regions 121 and 122. The first and second junction regions 121 and 122 may be doped with a conductive type impurity. For example, the conductive type impurity may include one or more of phosphorus (P), arsenic (As), antimony (Sb) and boron (B). The first and second junction regions 121 and 122 may be doped with the same conductive type impurity. The first and second junction regions 121 and 122 may correspond to a source region and a drain region, respectively.

The first and second gate electrodes G1 and G2 may include a low resistivity metal material. Also, the first and second gate electrodes G1 and G2 may include a stack of a work function material and a low resistivity metal material.

Each of the first and second gate electrodes G1 and G2 may include first to third electrodes E1 to E3. The first electrode E1 may extend in the second direction ②, and the second and third electrodes E2 and E3 may stem from the first electrode E1. The second and third electrodes E2 and E3 may extend in the first direction ①. The first to third electrodes E1 to E3 may surround three or more side surfaces of the first and second pillar P1 and P2. The first electrode E1 may be in a direction crossing with the buried bit line 115, and the second and third electrodes E2 and E3 may be positioned between neighboring first pillars P1 or between neighboring second pillars P2.

The gate trench 113 may be a line type extending in any one direction. The gate trench 113 may include first to third trenches T1 to T3. The first electrode E1 may be formed in the first trench T1, and the second and third electrodes E2 and E3 may be formed in the second and third trenches T2 and T3, respectively.

Hereinafter, a second device isolation region I2 will be described in detail.

The second device isolation region I2 may include a spacer 105, a second liner 106, and second and third isolation dielectric layers 107 and 108. The second device isolation region I2 may be formed in the second isolation trench 104. The second device isolation region I2 may have an air gap 109 therein. The air gap 109 may be independently positioned between the neighboring active regions 102I in the first direction. That is, neighboring air gaps 109 may be formed separately.

As described above, the air gap 109 may be positioned between the neighboring active regions 102I in the first direction. As such, parasitic capacitance between the neighboring active regions 102I in the first direction may be reduced. The air gap 109 may have a height which overlaps with the buried bit line 115. Thus, parasitic capacitance between neighboring buried bit lines 115 may be reduced.

Hereinafter, a method for manufacturing the semiconductor in accordance with the first embodiment will be described. For the sake of convenience, separate description will be given for production parts 1 to 3 with reference to FIGS. 3A to 4I, 5A to 6H and 7A to 8G, respectively. The production part 1 relates to a method for forming parallel active regions, the production part 2 relates to a method for forming a buried bit line (BBL) and the production part 3 relates to a method for forming a buried gate electrode (BG).

FIGS. 3A to 3I are views illustrating an example of a method for forming parallel active regions of the semiconductor device. FIGS. 4A to 4I are cross-sectional views taken along the lines A-A' and B-B' of FIGS. 3A to 3I.

Figure 3A:
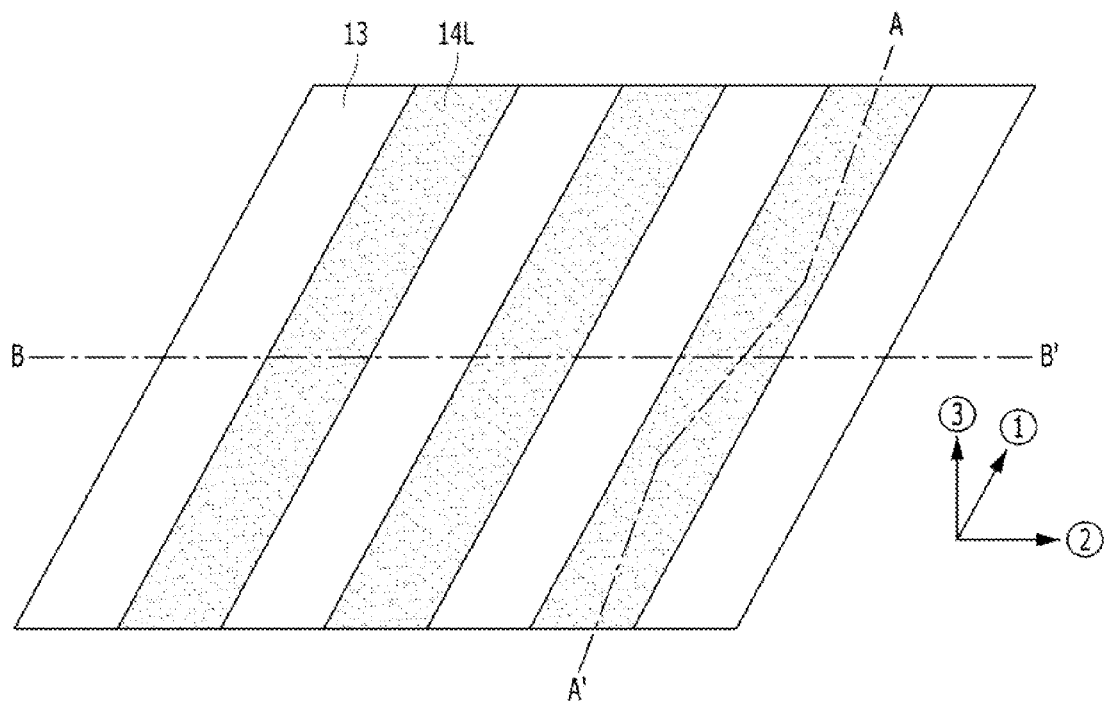
FIGS. 3A to 3I are views illustrating a method for forming parallel active regions of the semiconductor device in accordance with an embodiment.
Figure 4A:
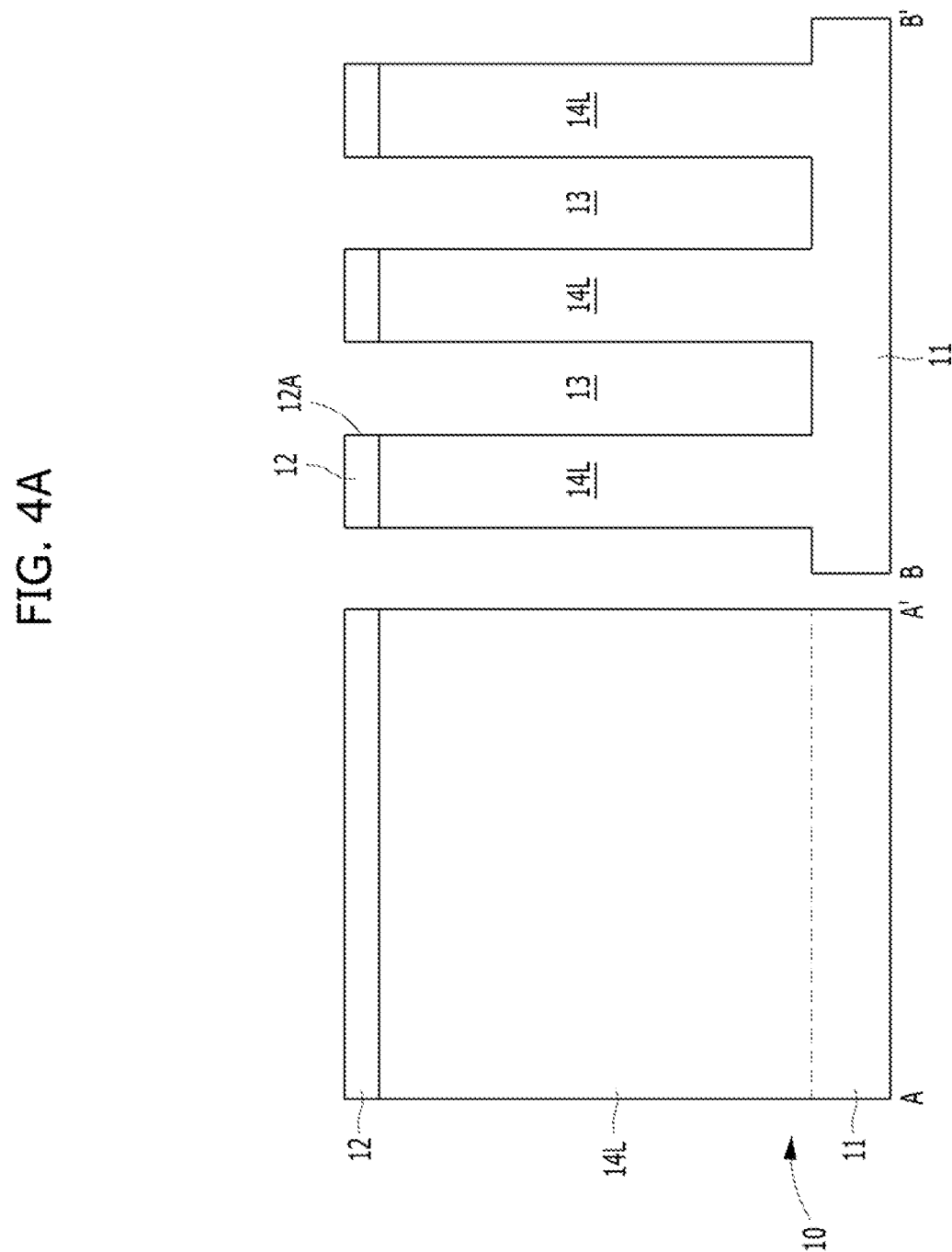
FIGS. 4A to 4I are cross-sectional views taken along the lines A-A' and B-B' of FIGS. 3A to 3I.

As shown in FIGS. 3A and 4A, a substrate 10 may be prepared. The substrate 10 may include a material suitable for semiconductor processing. The substrate 10 may include a semiconductor substrate. The substrate 10 may include a silicon-containing material. The substrate 10 may include one or more of silicon, monocrystalline silicon, polysilicon, amorphous silicon, silicon germanium, monocrystalline silicon germanium, polycrystalline silicon germanium, carbon-doped silicon, a combination thereof, and a multi-layer thereof. The substrate 10 may include semiconductor material such as germanium. The substrate 10 may include one or more of III/V group semiconductor materials, for example, a compound semiconductor substrate such as GaAs. The substrate 10 may include a silicon-on-insulator (SOI) substrate.

A first hard mask layer 12 may be formed on the substrate 10. A plurality of line type openings 12A may be formed in the first hard mask layer 12. In order to form the plurality of line type openings 12A, the first hard mask layer 12 may be etched by using a mask (not shown). The plurality of line type openings 12A may be formed by a spacer pattern technology (SPT). The first hard mask layer 12 may be formed of a material having etch selectivity with respect to the substrate 10. For example, the first hard mask layer 12 may include silicon nitride. Although it is not shown, a buffer layer or a pad layer may be further formed between the first hard mask layer 12 and the substrate 10.

A first isolation trench 13 may be formed. The substrate 10 may be etched by using the first hard mask layer 12 having the line type openings 12A as an etch mask. As such, the first isolation trench 13 may be formed and be a line type. A line type active region 14L may be defined in the substrate 10 by the first isolation trench 13. The spaces between the line type active regions 14L may become the first isolation trench 13. The line type active region 14L and the first isolation trench 13 may extend in the first direction ①. The bottom of the substrate 10 where the process for forming the line type active region 14L and the first isolation trench 13 are not performed is a bulk 11.

Figure 3B:
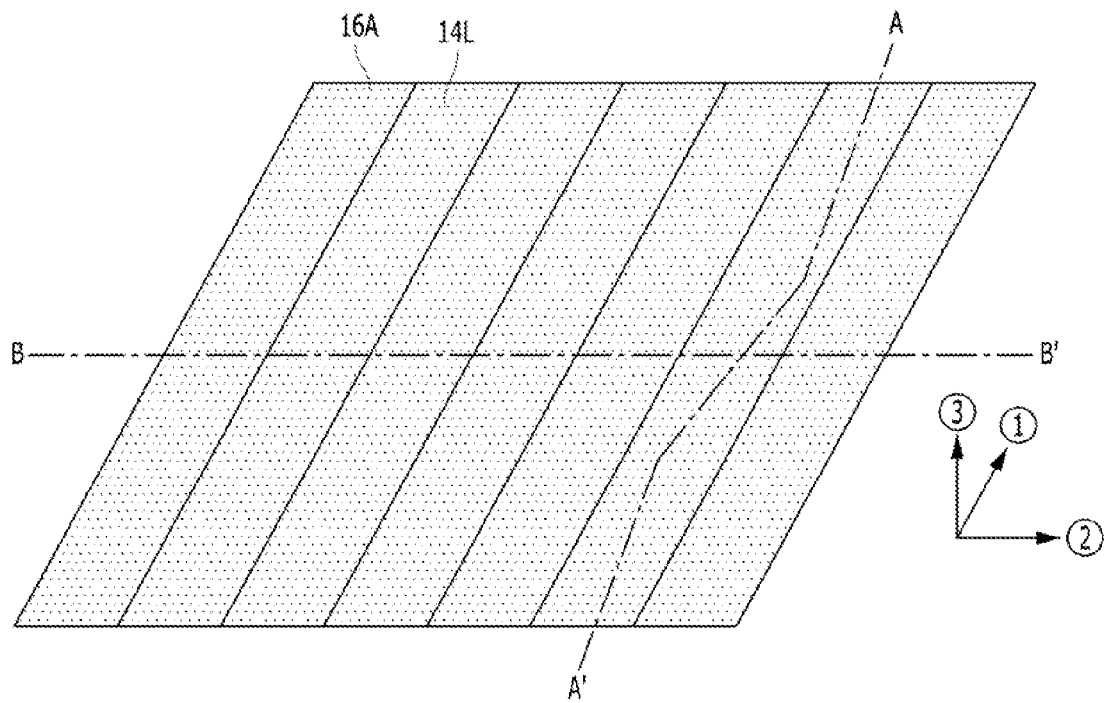
Figure 4B:
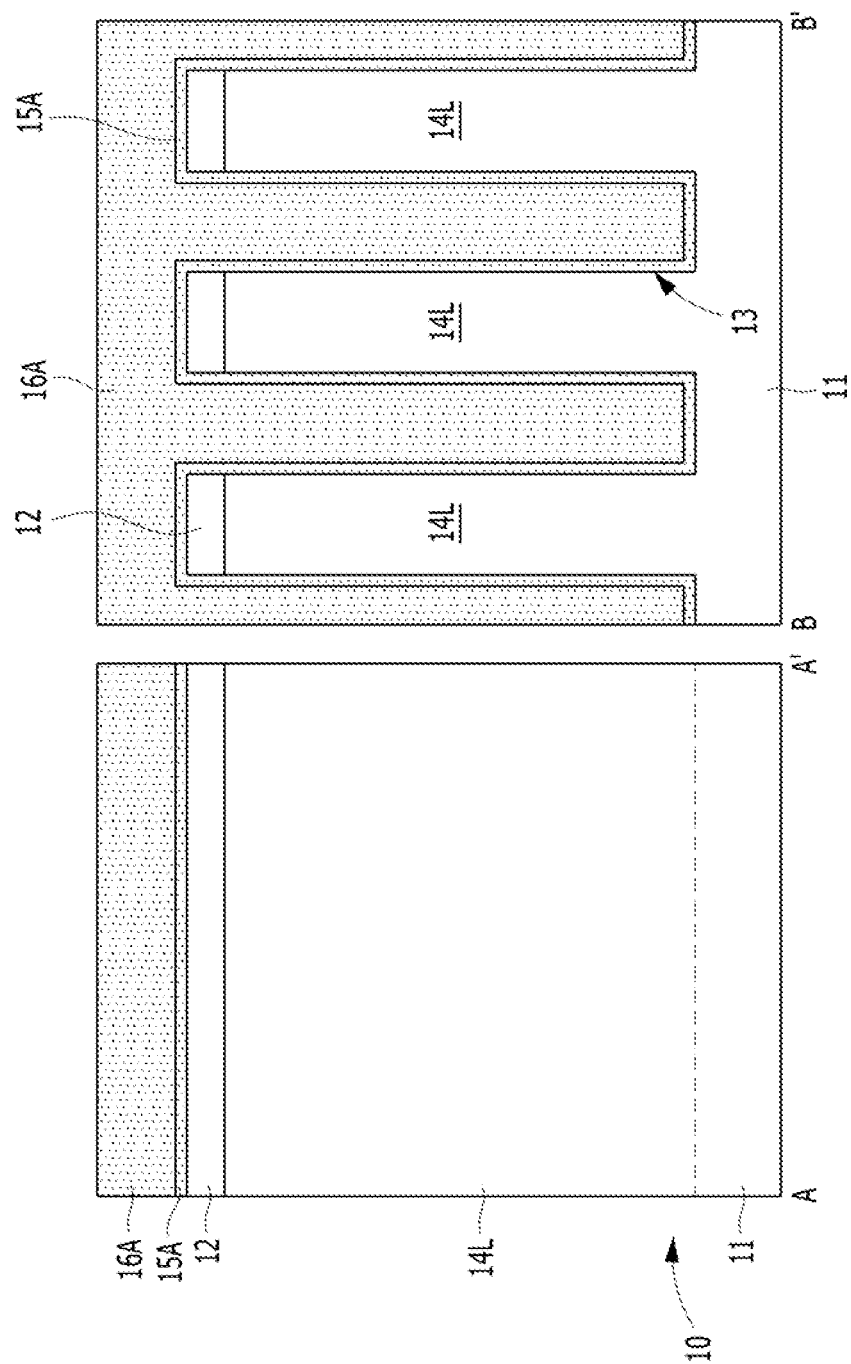

As shown in FIGS. 3B and 4B, a first liner layer 15A may be formed on the first isolation trench 13. The first liner layer 15A may be formed of silicon oxide. The first liner layer 15A may be formed by a thermal oxidation process or a deposition process. In another embodiment, the first liner layer 15A may be formed in a double layer structure. For example, the first liner layer 15A may be formed as a stack of silicon oxide and silicon nitride.

A preliminary first isolation dielectric layer 16A may be formed. The preliminary first isolation dielectric layer 16A may be formed of a dielectric material. The preliminary first isolation dielectric layer 16A may include one or more of silicon oxide, silicon nitride, and a combination thereof. A chemical vapor deposition (CVD) process or other deposition processes may be used to fill the first isolation trench 13 with a dielectric material. The preliminary first isolation dielectric layer 16A may include a spin-on-dielectric (SOD).

Figure 3C:
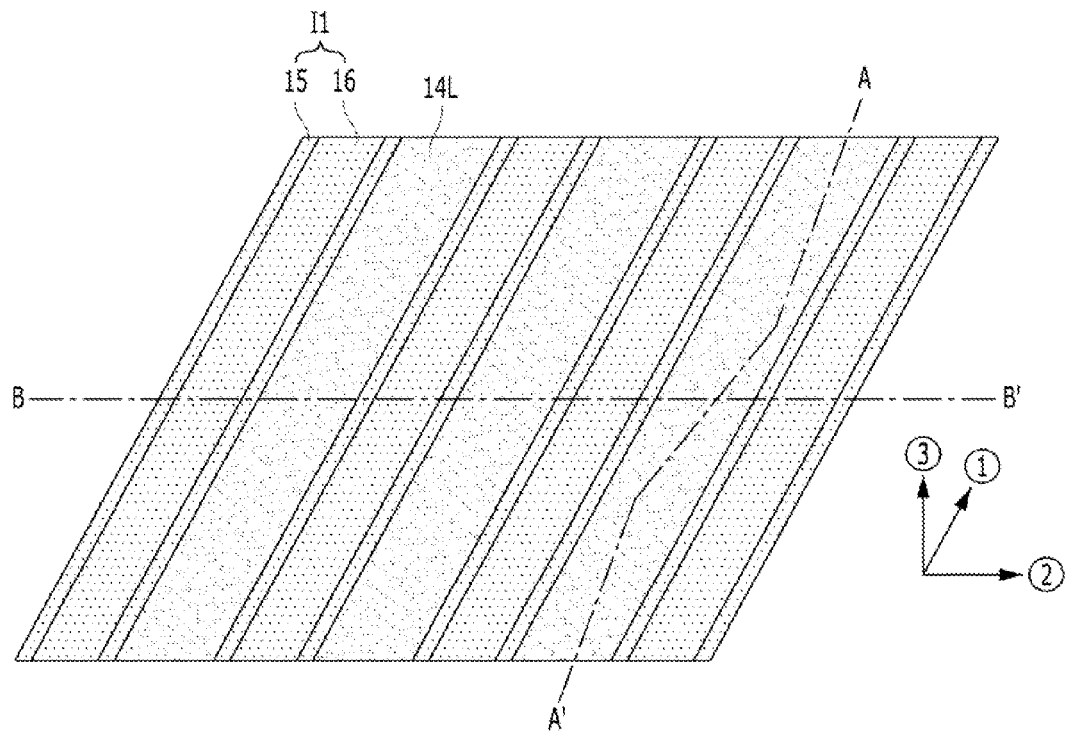
Figure 4C:
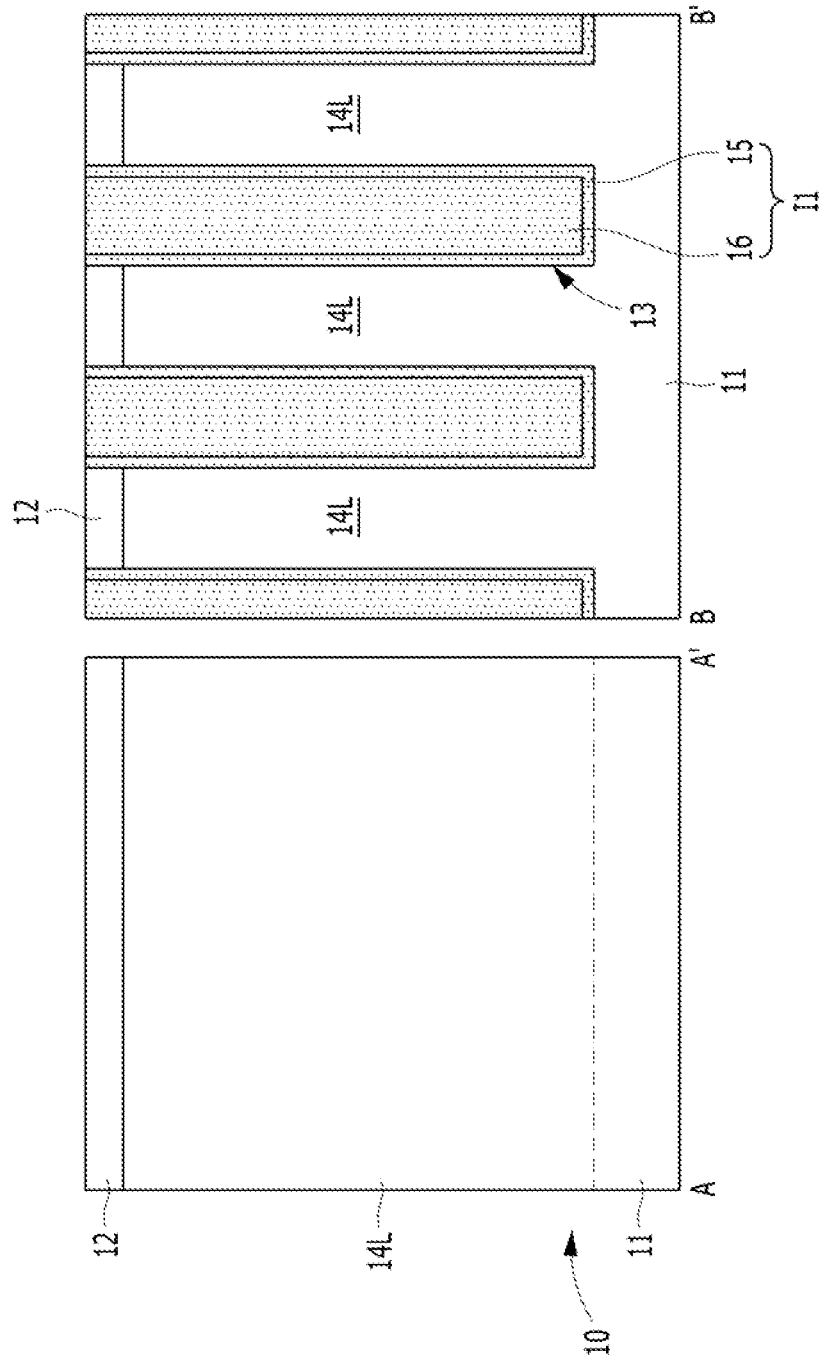

As shown in FIGS. 3C and 4C, a first isolation dielectric layer 16 may be formed. A planarization process such as chemical-mechanical polishing (CMP) may be performed with respect to the preliminary first isolation dielectric layer 16A. As such, the first isolation dielectric layer 16 filling the first isolation trench 13 may be formed. In the planarization process of the preliminary first isolation dielectric layer 16A, a part of the first liner layer 15A may be planarized. For example, the preliminary first isolation dielectric layer 16A and the first liner layer 15A may be planarized until the top surface of the first hard mask layer 12 is exposed. Thus, a first isolation dielectric layer 16 and a first liner 15 may remain in the first isolation trench 13.

A first device isolation region I1 may be formed by the above processes. The first device isolation region I1 may include the first liner 15 and the first isolation dielectric layer 16. The first device isolation region I1 may be formed in the first isolation trench 13. The line type active region 14L and the first device isolation region I1 may be alternately formed. The line width of the line type active region 14L may be the same as that of the first device isolation region I1. The line type active region 14L and the first device isolation region 13 may extend in the first direction ①.

Figure 3D:
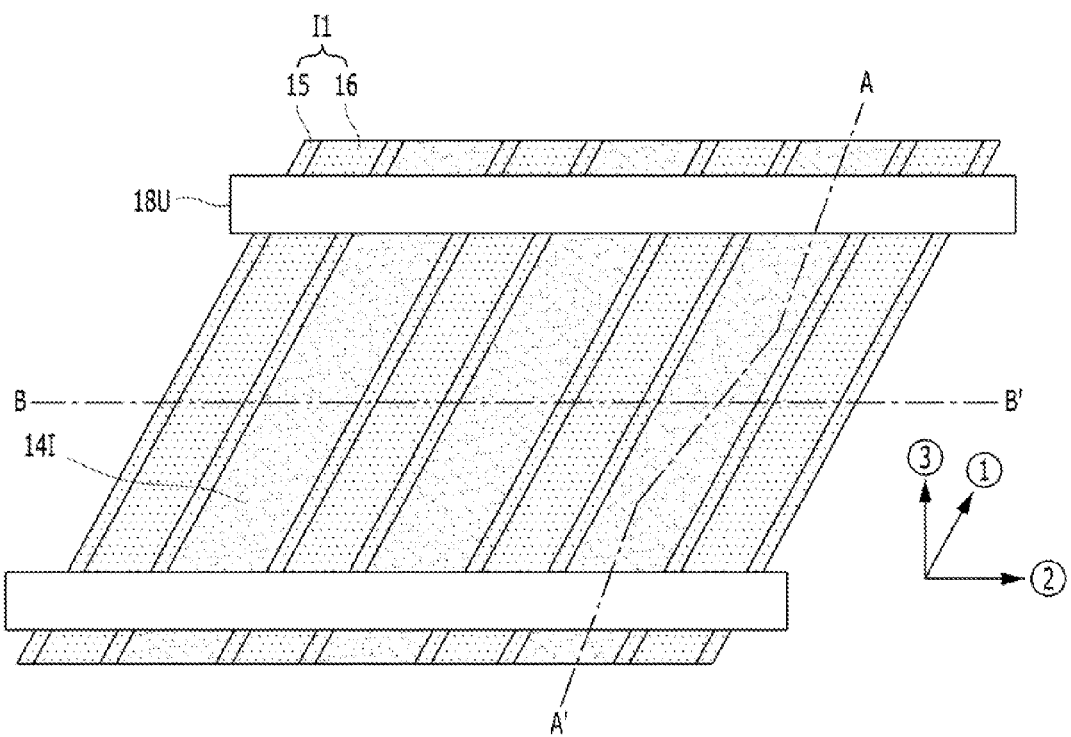
Figure 4D:
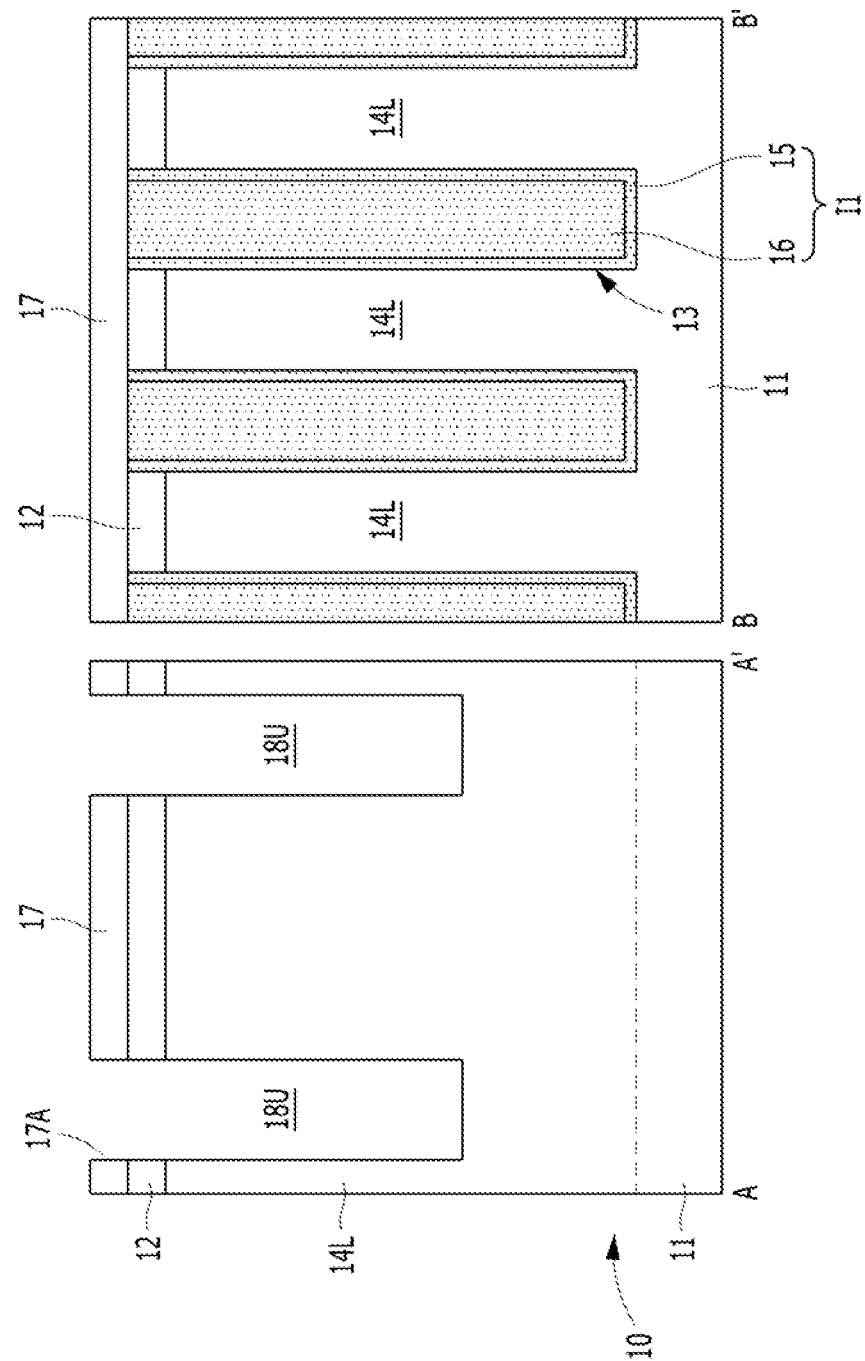

As shown in FIGS. 3D and 4D, the line type active region 14L may be cut in a uniform length unit. In order to cut the line type active region 14L, a cutting mask 17 may be used. The cutting mask 17 may have a plurality of line type openings 17A. The plurality of line type opening 17A may extend in the second direction Z. The cutting mask 17 may extend in a direction crossing with the line type active region 14L. The cutting mask 17 may include a photosensitive film pattern.

The first hard mask layer 12, the line type active region 14L and the first device isolation region I1 may be etched by using the cutting mask 17 as an etch mask. As such, the line type active region 14L and the first device isolation region I1 may be cut to form an upper second isolation trench 18U. The upper second isolation trench 18U may extend in the second direction ②.

Figure 3E:
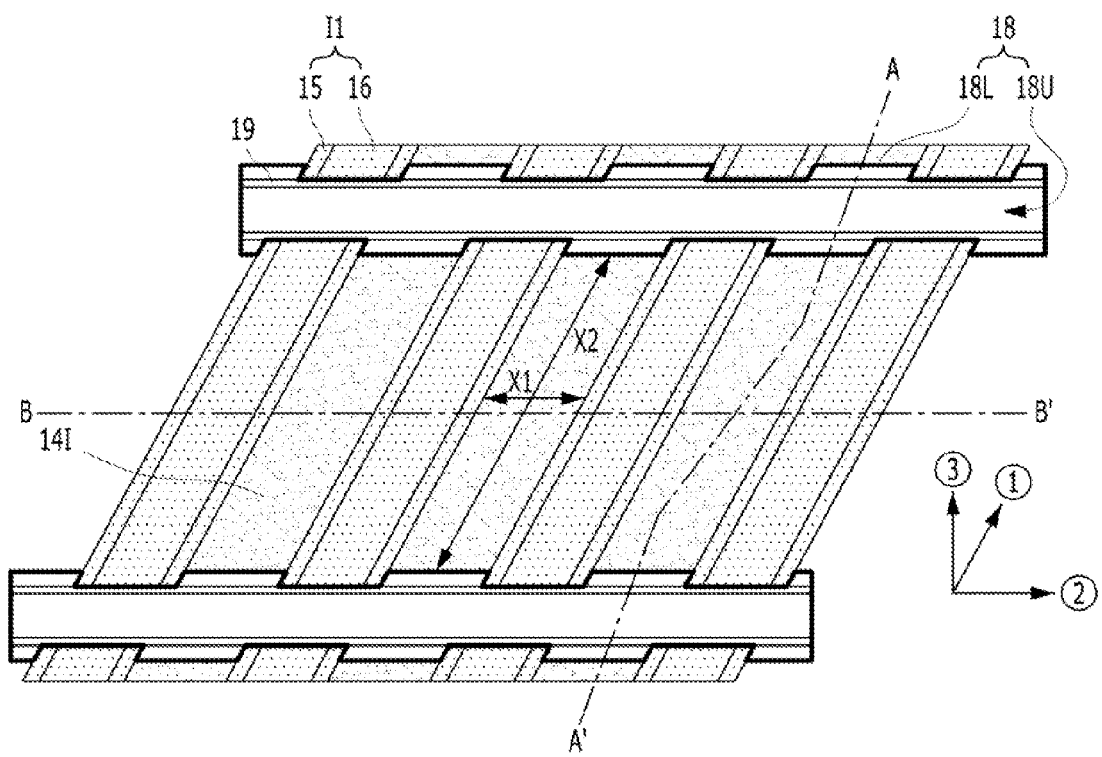
Figure 4E:
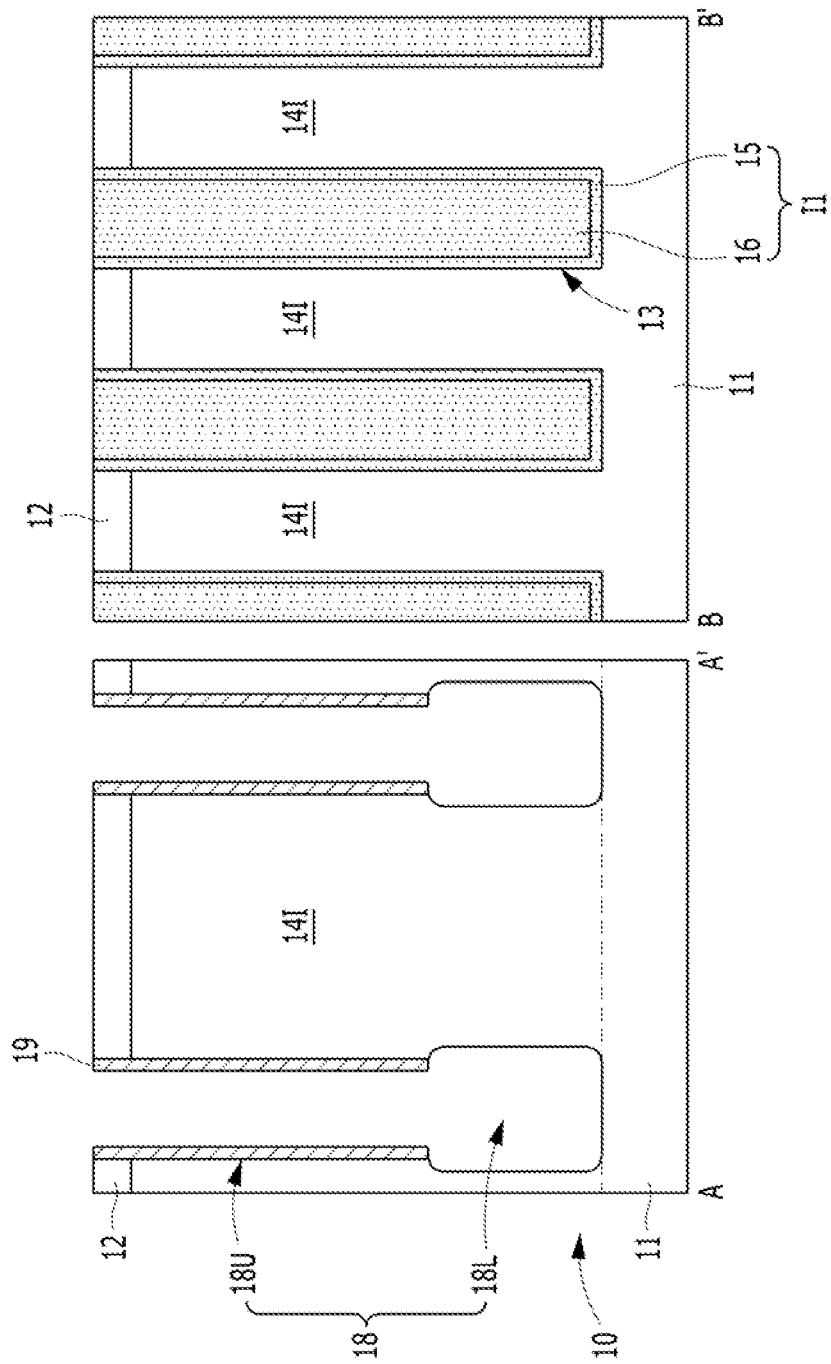

As shown in FIGS. 3E and 4E, the cutting mask 17 may be removed.

A spacer 19 may be formed on the sidewalls of the upper second isolation trench 18U. In order to form the spacer 19, a dielectric material may be deposited followed by an etch-back process. The spacer 19 may be formed of a material having etch selectivity with respect to the substrate 10. The spacer 19 may include silicon oxide.

The bottom surface of the upper second isolation trench 18U may be extended. As such, a lower second isolation trench 18L may be formed. In order to form the lower second isolation trench 18L, an isotropic etching process may be performed. For example, an isotropic etching process of the line type active region 14L may be performed by using the spacer 19 and the first hard mask layer 12 as an etch mask.

The lower second isolation trench 18L may have a bulb shape. The line width of the lower second isolation trench 18L may be larger than that of the upper second isolation trench 18U.

The lower second isolation trench 18L and the upper second isolation trench 18U may compose a second isolation trench 18. A plurality of island type active regions 14I may be formed by the second isolation trench 18.

The line type active region 14L may be cut to form an independent island type active region 14I by the above process. When viewed in the first direction ①, neighboring island type active regions 14I may be uniform in length and spacing, and may be separated from each other by the second isolation trench 18. The island type active region 14I may extend in the first direction and a the second direction. A plurality of island type active regions 14I may be repeatedly formed along the first and second directions ① and ② and spaced from each other. The second isolation trench 18 may be formed between the neighboring island type active regions 14I in the first direction, and the first device isolation region I1 may be positioned between the neighboring island type active regions 14I in the second direction. The second isolation trench 18 may extend in the second direction ②. The lower side surface of the island type active region 14I may have a bulb shape. The first device isolation region I1 may be cut in a uniform length unit by the second isolation trench 18.

Figure 3F:
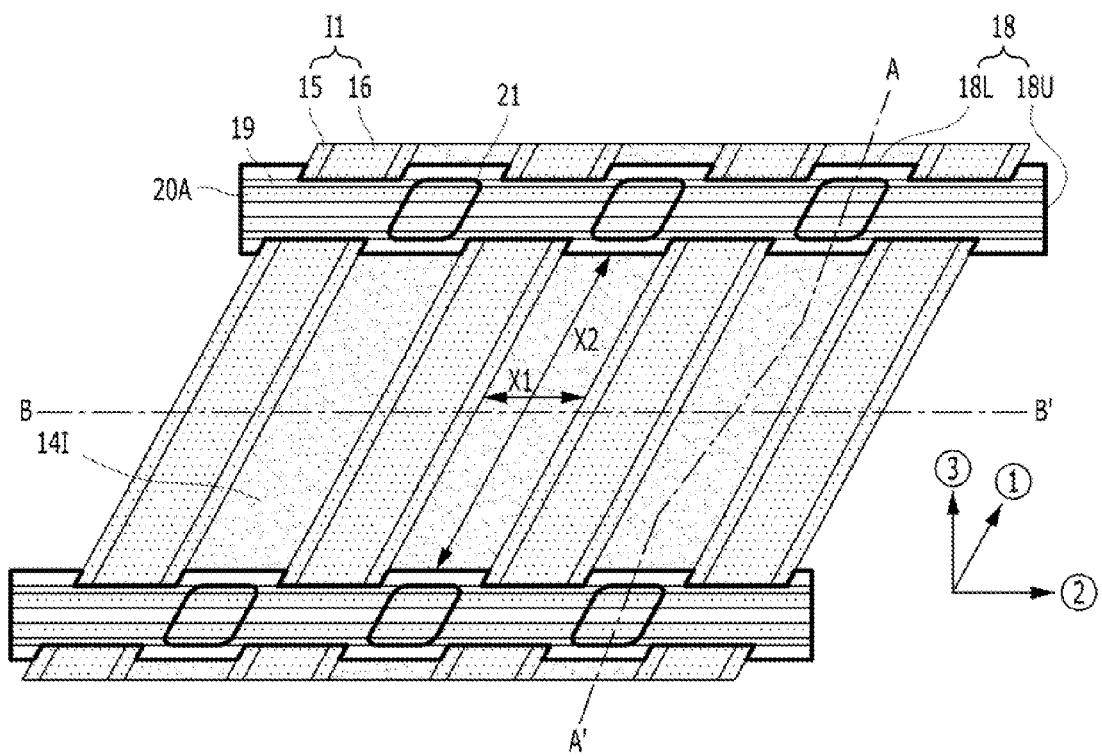
Figure 4F:
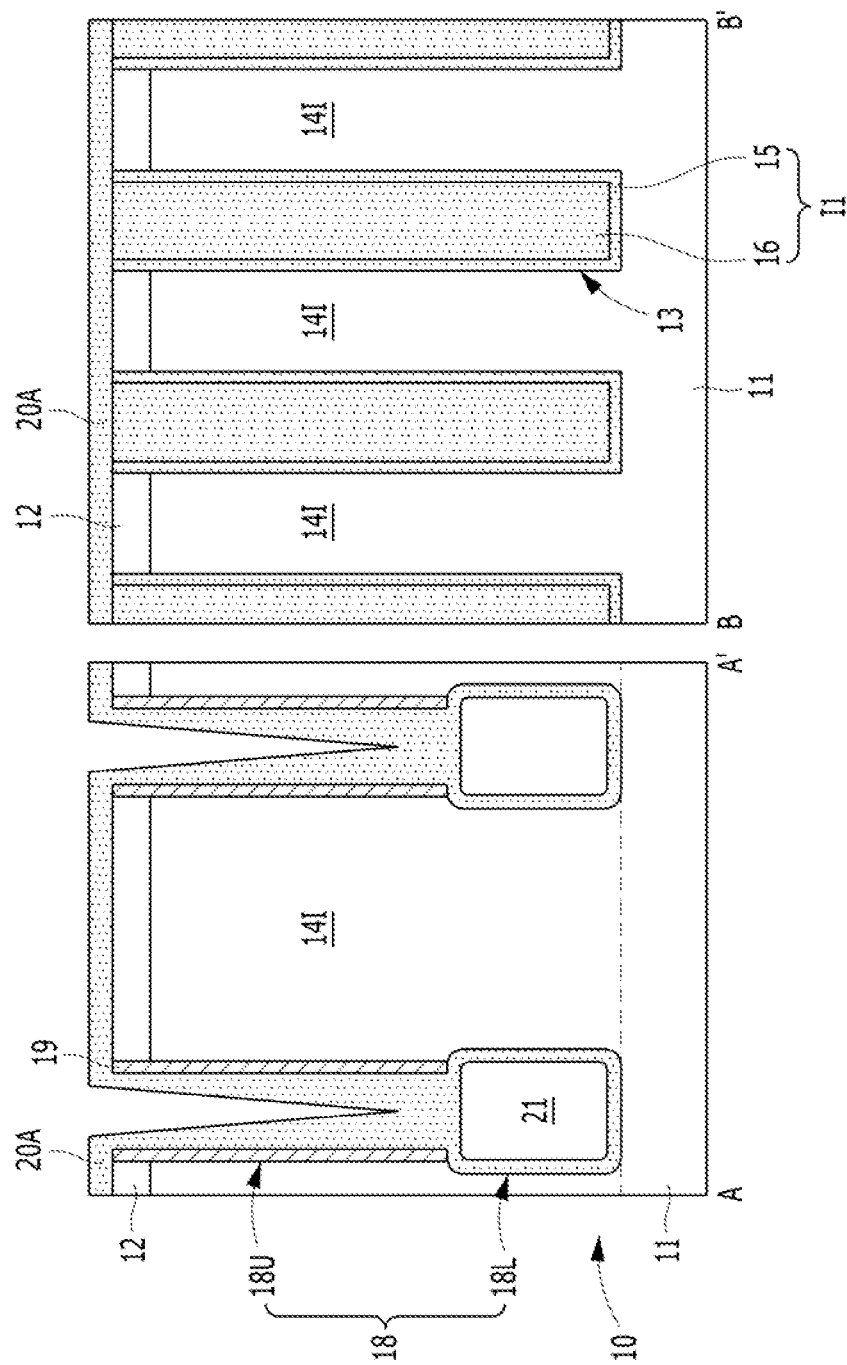

As shown in FIGS. 3F and 4F, a second liner layer 20A may be formed. The second liner layer 20A may be conformally formed on the spacer 19 and the second isolation trench 18. The second liner layer 20A may be formed on the surface of the lower second isolation trench 18L and cover the spacer 19. The second liner layer 20A may be formed of silicon oxide. When forming the second liner layer 20A, the top of the lower second isolation trench 18L may be closed, and thus an air gap 21 may be formed and self-aligned in the lower second isolation trench 18L. The air gap 21 may be formed between the neighboring island type active regions 14I in the first direction. In another embodiment, the air gap 21 may extend in the second direction ② and thus have a line shape.

Figure 3G:
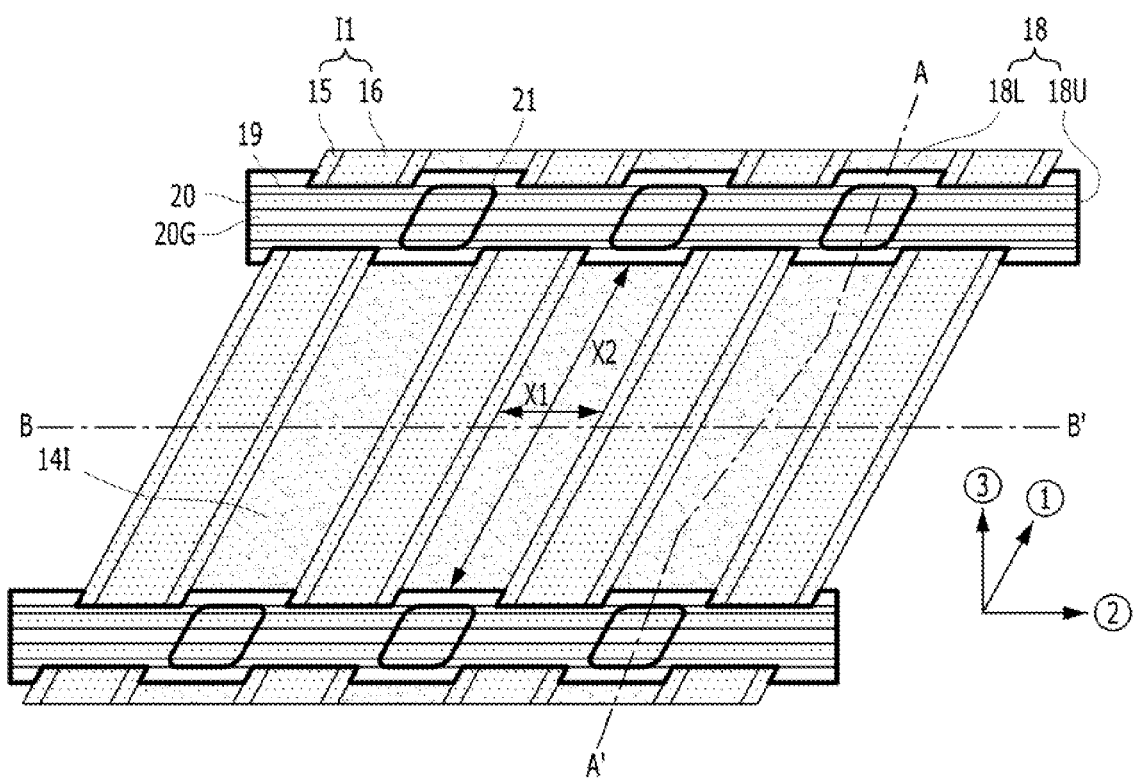
Figure 4G:
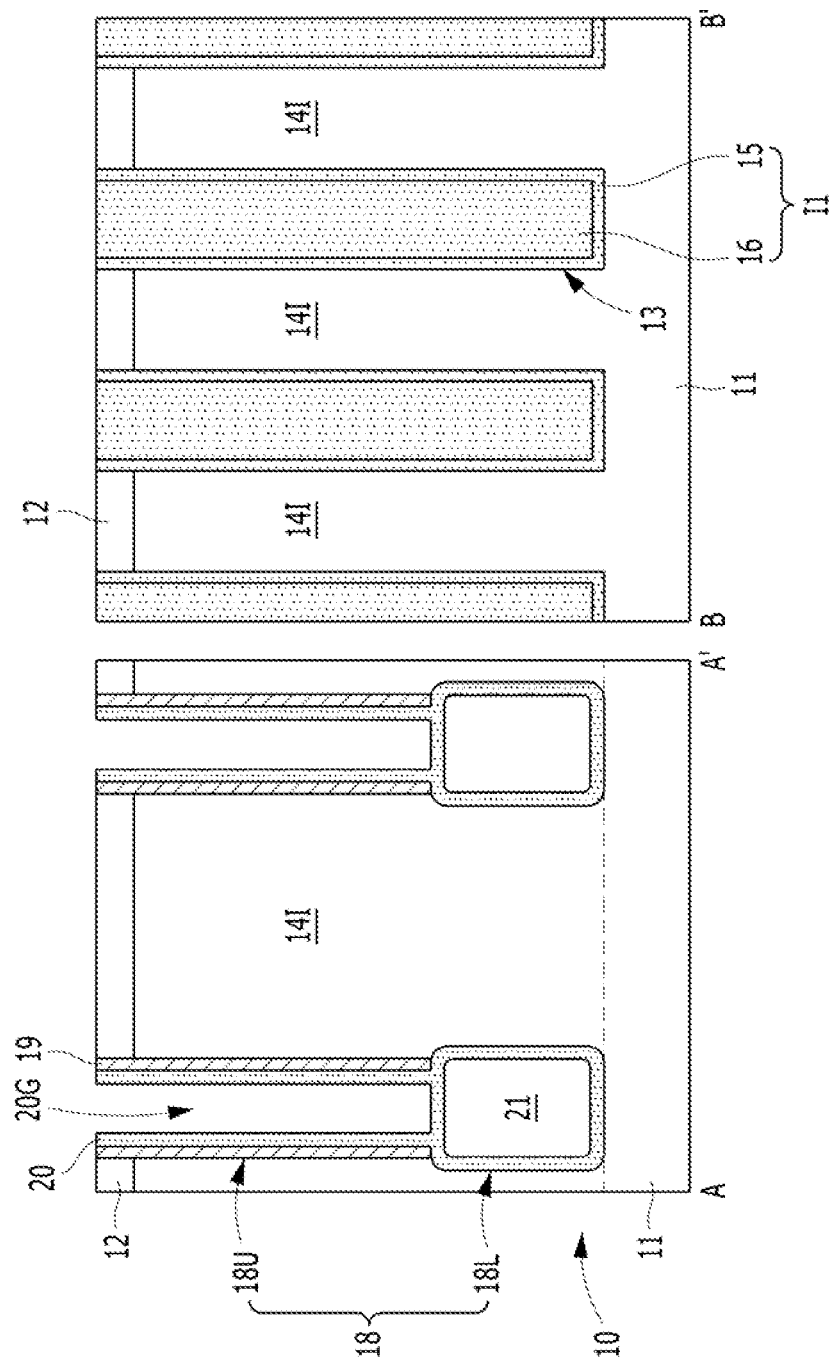

As shown in FIGS. 3G and 4G, the second liner layer 20A may be selectively recessed. As such, a second liner 20 may be formed. The second liner 20 may remain in the upper second isolation trench 18U and the lower second isolation trench 18L. In the upper second isolation trench 18U, a gap 20G may be formed between the second liners 20. In the lower second isolation trench 18L, the size of the air gap 21 may be defined by the width of the second liner 20. A recessing process of the second liner layer 20A may be controlled in such a manner that the air gap 21 is not exposed.

Figure 3H:
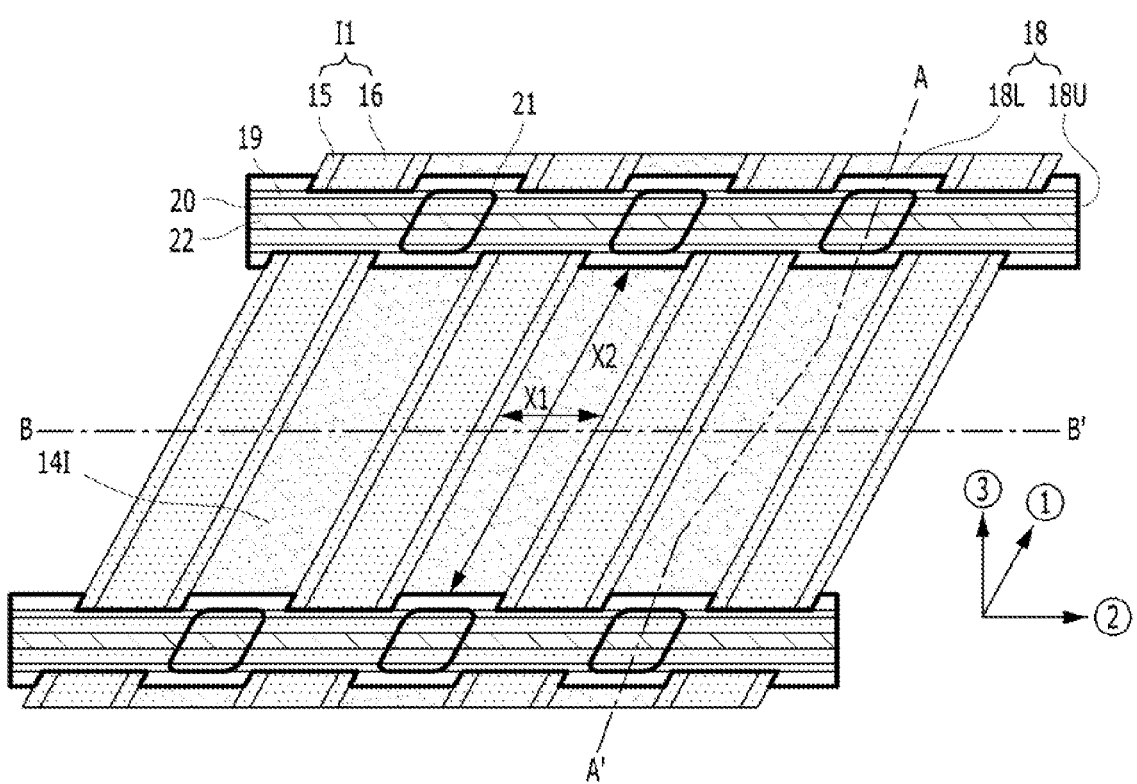
Figure 4H:
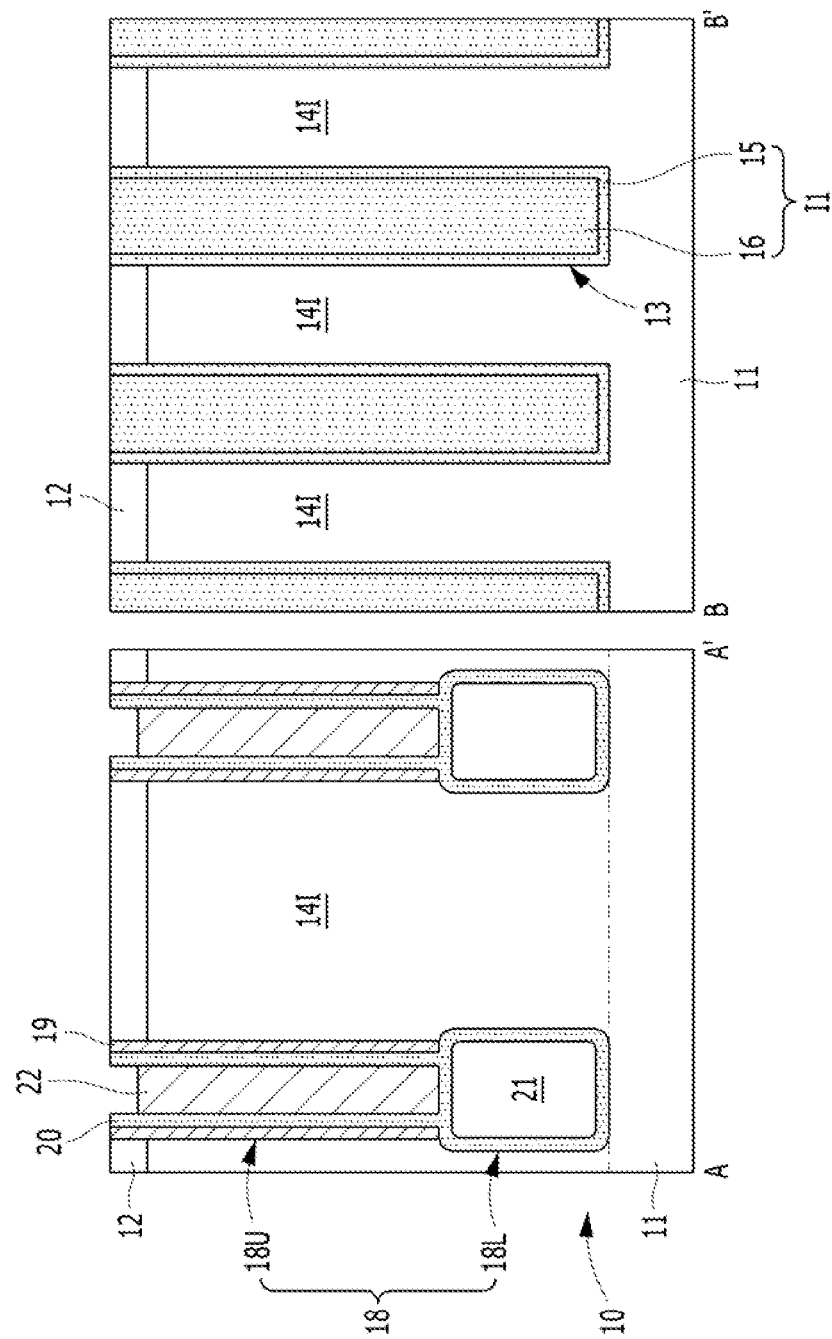

As shown in FIGS. 3H and 4H, a second isolation dielectric layer 22 may be formed. The second isolation dielectric layer 22 may be formed of a material having etch selectivity with respect to the second liner 20. The second isolation dielectric layer 22 may be formed of silicon nitride. The second isolation dielectric layer 22 may fill the gap 20G. Subsequently, the second isolation dielectric layer 22 may be recessed. As such, the second isolation dielectric layer 22 may remain to fill the gap 20G. The recessed surface of the second isolation dielectric layer 22 may be lower than the top surface of the first hard mask layer 12.

Figure 3I:
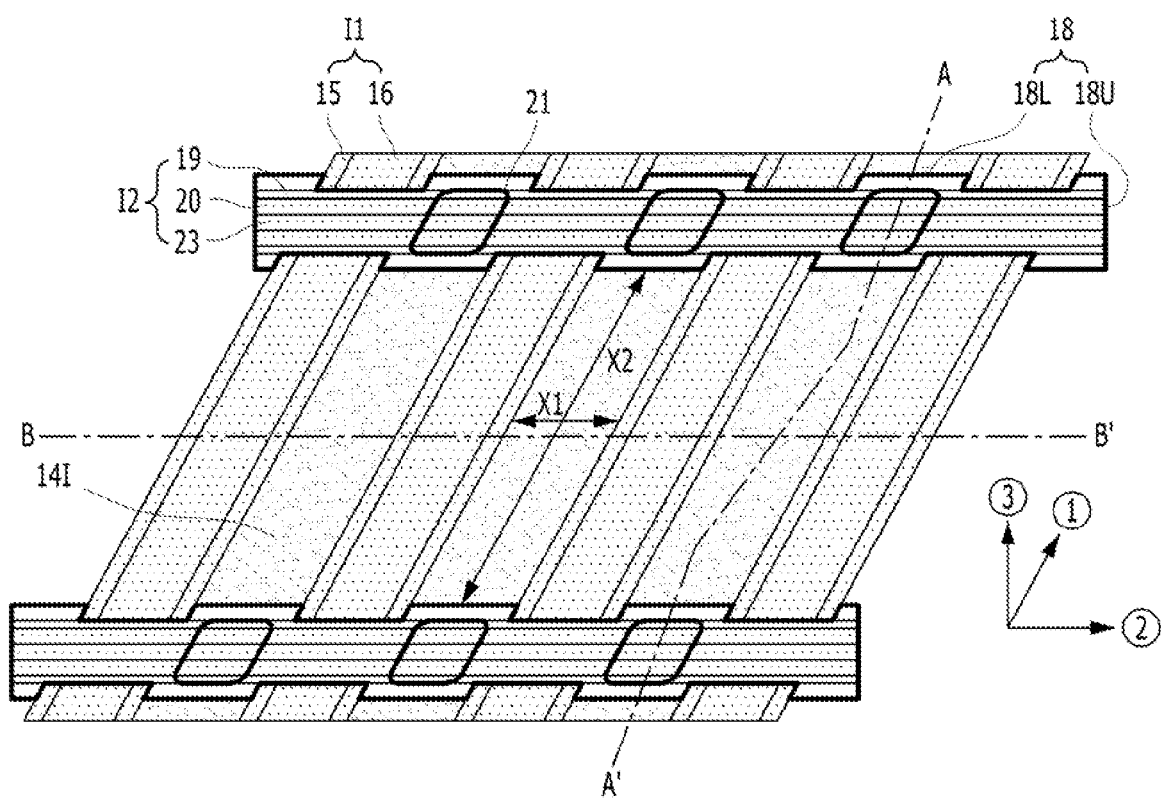
Figure 4I:
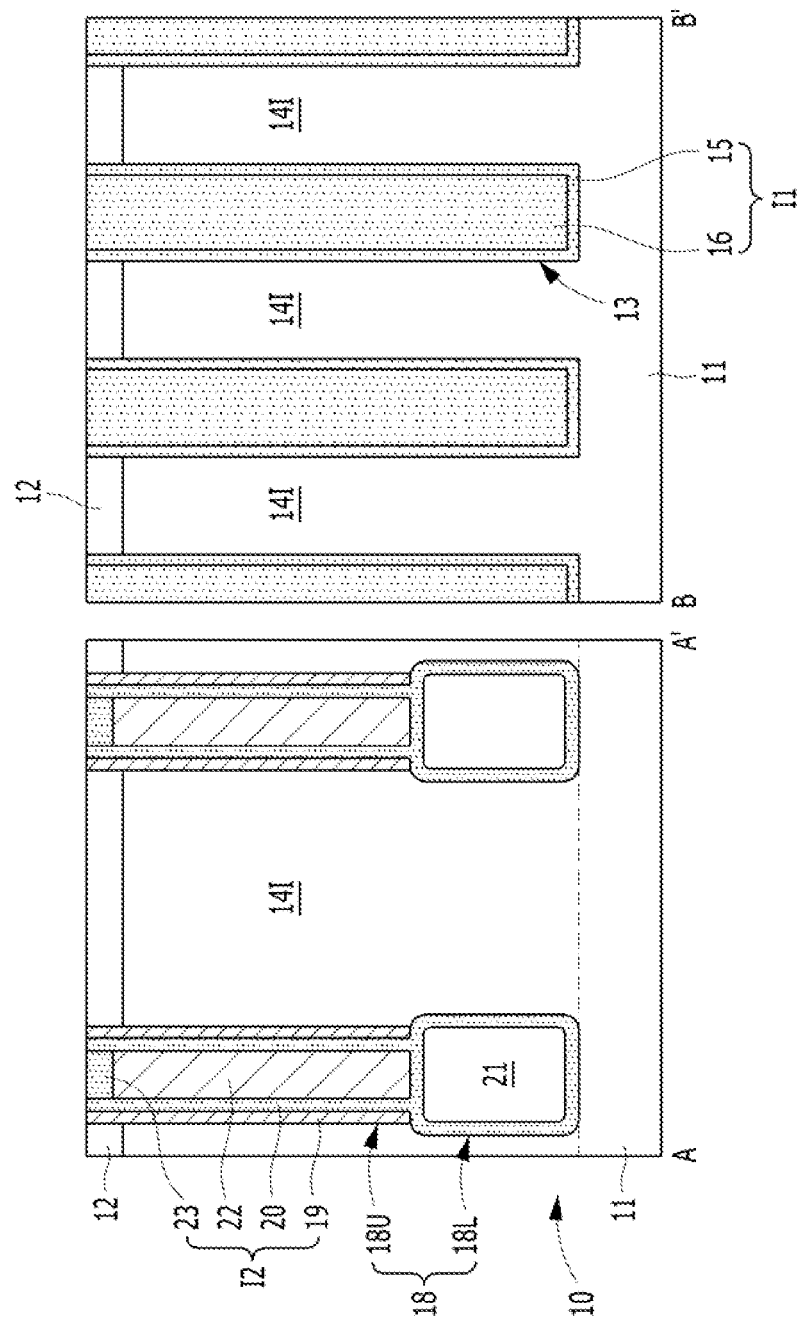

As shown in FIGS. 3I and 4I, a third isolation dielectric layer 23 may be formed. The upper portion of the second isolation dielectric layer 22 may be filled by the third isolation dielectric layer 23. The third isolation dielectric layer 23 may be formed of a material having etch selectivity with respect to the second isolation dielectric layer 22. The third isolation dielectric layer 23 may be formed of silicon oxide. Subsequently, the third isolation dielectric layer 23 may be planarized. The third isolation dielectric layer 23 may be planarized until the surface of the first hard mask layer 12 is exposed.

As above, a second device isolation region I2 may be formed by planarization of the third isolation dielectric layer 23. The second device isolation region I2 may include the spacer 19, the second liner 20, and the second and third isolation dielectric layers 22 and 23. The second device isolation region I2 may be formed in the second Isolation trench 18. The second isolation trench 18 may include the upper second isolation trench 18U and the second isolation trench 18L. The second device isolation region I2 may have the air gap 21. Since both the second liner 20 and the third isolation dielectric layer 23 are formed of silicon oxide, the second isolation dielectric layer 22 may become a structure formed in silicon oxide.

The island type active region 14I may be defined by the first and second device isolation regions I1 and I2. The plurality of island type active regions 14I may be defined by the plurality of first and second device isolation regions I1 and I2. The plurality of island type active regions 14I may be parallel to each other, forming parallel active regions.

The air gap 21 may be positioned between the neighboring island type active regions 14I in the first direction. Thus, parasitic capacitance between the neighboring island type active regions 14I in the first direction may be reduced. As described below, the air gap 21 may have a height that overlaps with at least bit lines. Thus, parasitic capacitance between the bit lines may be reduced.

FIGS. 5A to 5H are views illustrating a method for forming a buried bit line of the semiconductor device. FIGS. 6A to 6H are cross-sectional views taken along the lines A-A', B-B' and C-C' of FIGS. 5A to 5H. Hereinafter, for the sake of convenience, in FIGS. 5A to 5H, the first and second device isolation regions I1 and I2 are shown. The first liner layer, the first isolation dielectric layer, the second liner layer, the spacer, the second isolation dielectric layer and the third isolation dielectric layer are not shown, but the air gap 21 formed in the second device isolation region I2 is shown.

Figure 5A:
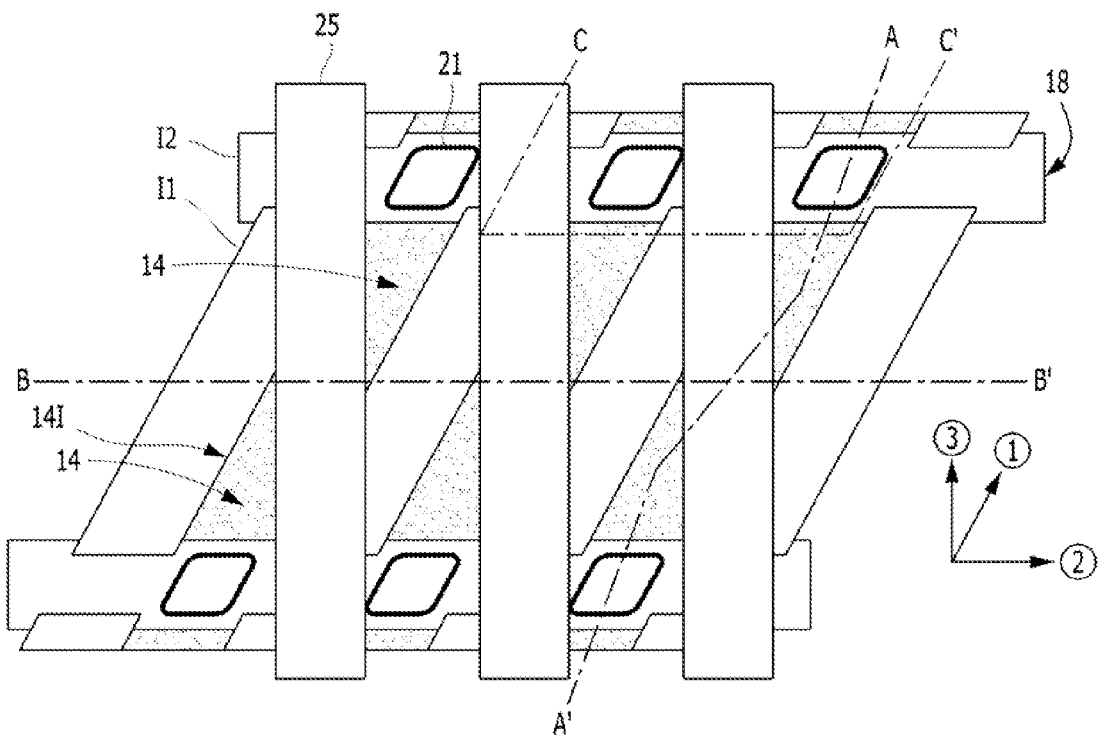
FIGS. 5A to 5H are views illustrating a method for forming a buried bit line of the semiconductor device in accordance with an embodiment.
Figure 6A:
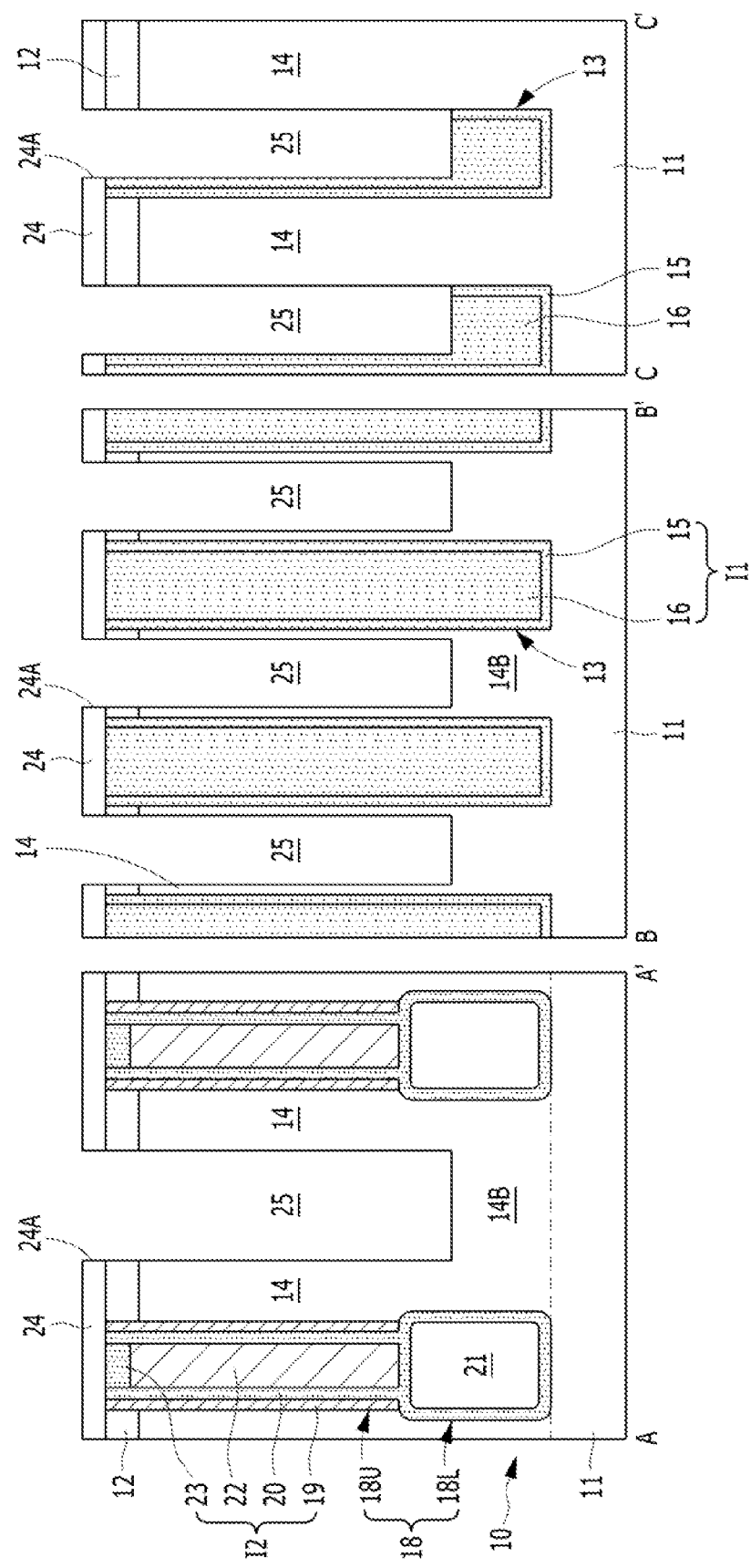
FIGS. 6A to 6H are cross-sectional views taken along the lines A-A', B-B' and C-C' of FIGS. 5A to 5H.

As shown in FIGS. 5A and 6A, a second hard mask layer 24 may be formed. A plurality of line type openings 24A may be formed in the second hard mask layer 24. The second hard mask layer 24 may be formed of a material having etch selectivity with respect to the substrate 10. For example, the second hard mask layer 24 may include silicon nitride.

A bit line trench 25 may be formed. The island type active region 14I may be etched by using the second hard mask layer 24 having the line type opening as an etch mask. Thus, the line type bit line trench 25 may be formed. The bit line trench 25 may be a line type extending in the third direction ③. The bit line trench 25 may extend in a direction crossing with the second isolation trench 18. The bit line trench 25 may be formed shallower than the first and second isolation trenches 13 and 18. The bit line trench 25 may have a depth which is sufficient to increase the average cross-sectional area of a subsequent gate electrode. In order to form the bit line trench 25, in addition to the island type active region 14I, the first and second device isolation regions I1 and I2 may be also etched. A part of the island type active region 14I may be divided into preliminary pillars 14 by the bit line trench 25. The remaining portion 14B of the island type active region 14I may be formed under the preliminary pillars 14. The remaining portion 14B may be referred to as a body 14B.

Figure 5B:
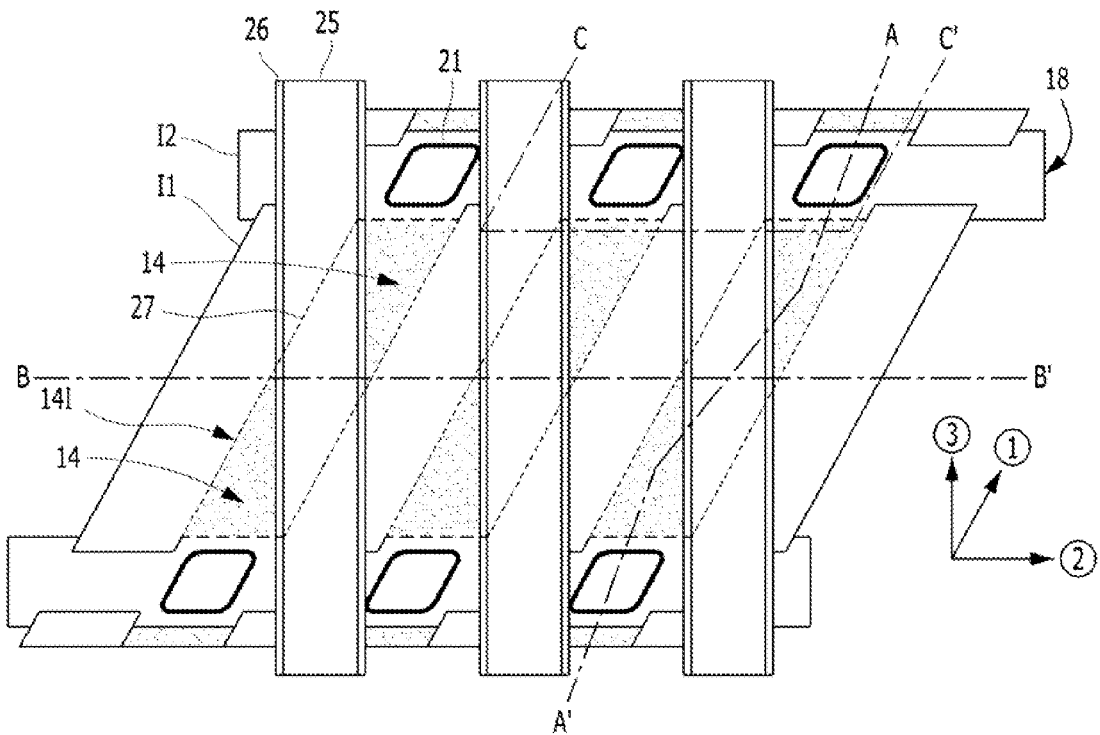
Figure 6B:
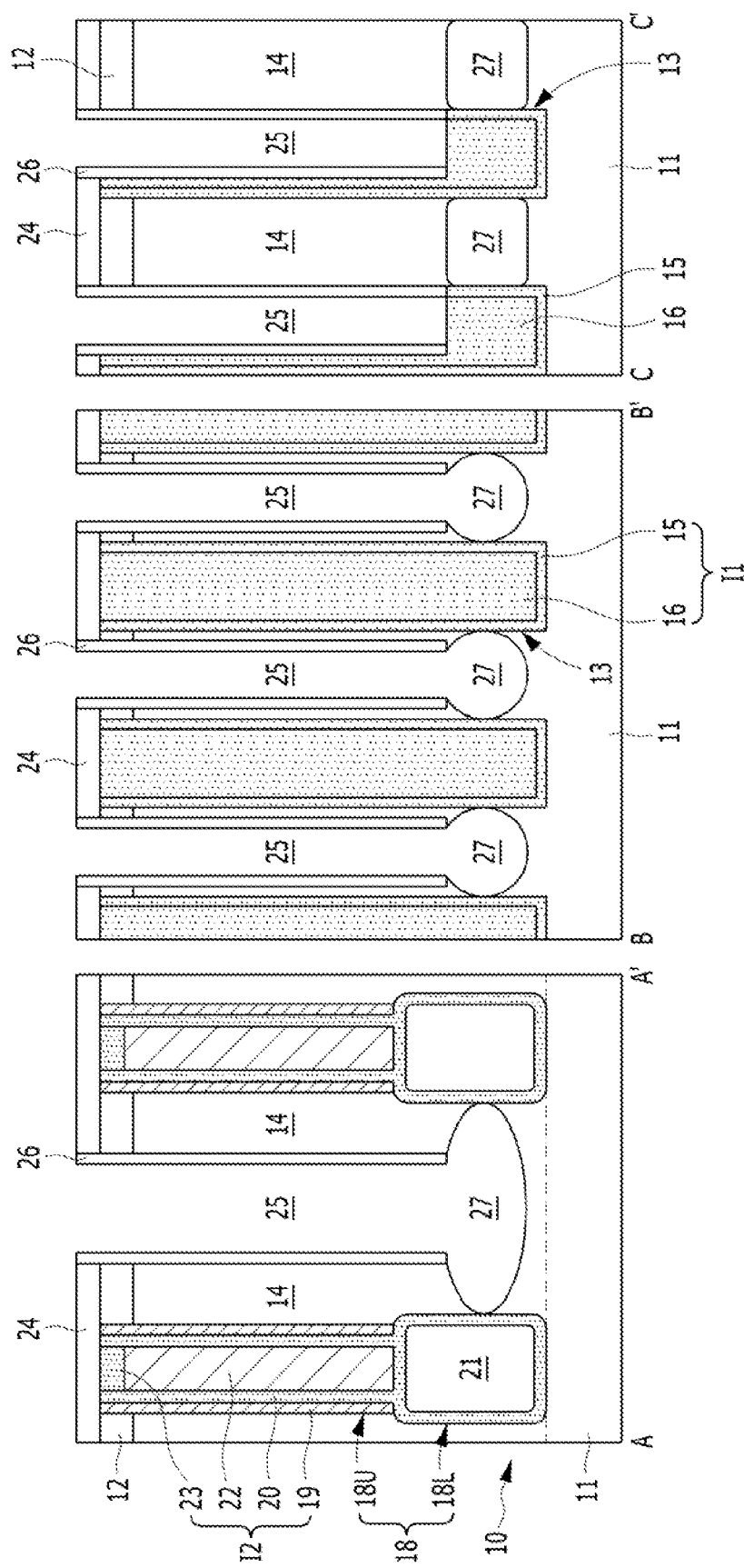

As shown in FIGS. 5B and 6B, a liner spacer 26 may be formed. The liner spacer 26 may be formed on both sidewalls of the third isolation trench 25. The liner spacer 26 may be formed by depositing silicon oxide followed by an etch-back process.

A body trench 27 may be formed. The body trench 27 may be formed by etching the bottom surface of the bit line trench 25 to a given depth. The bottom surface of bit line trench 25 may be extended by using the liner spacer 26 as an etch mask. As such, a part of the body 14B may be etched to form the body trench 27. In order to form the body trench 27, an isotropic etching process may be performed. The body trench 27 may be a bulb type formed by the isotropic etching process. The line width of the body trench 27 may be larger than that of the bit line trench 25. The depth of the body trench 27 may be shallower than those of the first and second isolation trenches 13 and 18. The body trench 27 may extend in the first direction under the preliminary pillar 14. For example, the side surface of the body trench 27 may extend adjacent to the sidewalls of the second isolation trench 18. Therefore, exposure of the air gap 21 may be prevented by the second liner 20.

As described above, the bit line trench 25 and the body trench 27 are formed so that the island type active region 14I is divided into a pair of preliminary pillars 14. That is, the pair of preliminary pillars 14 may be spaced apart by the bit line trench 25 and the body trench 27.

Figure 5C:
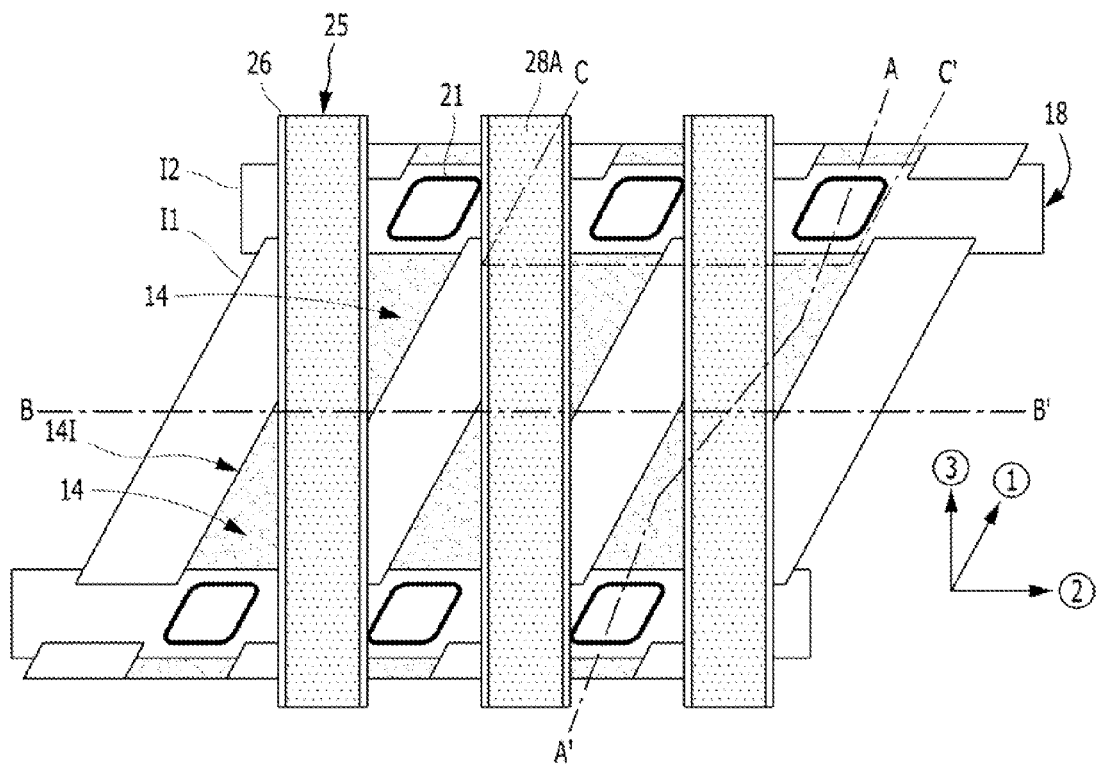
Figure 6C:
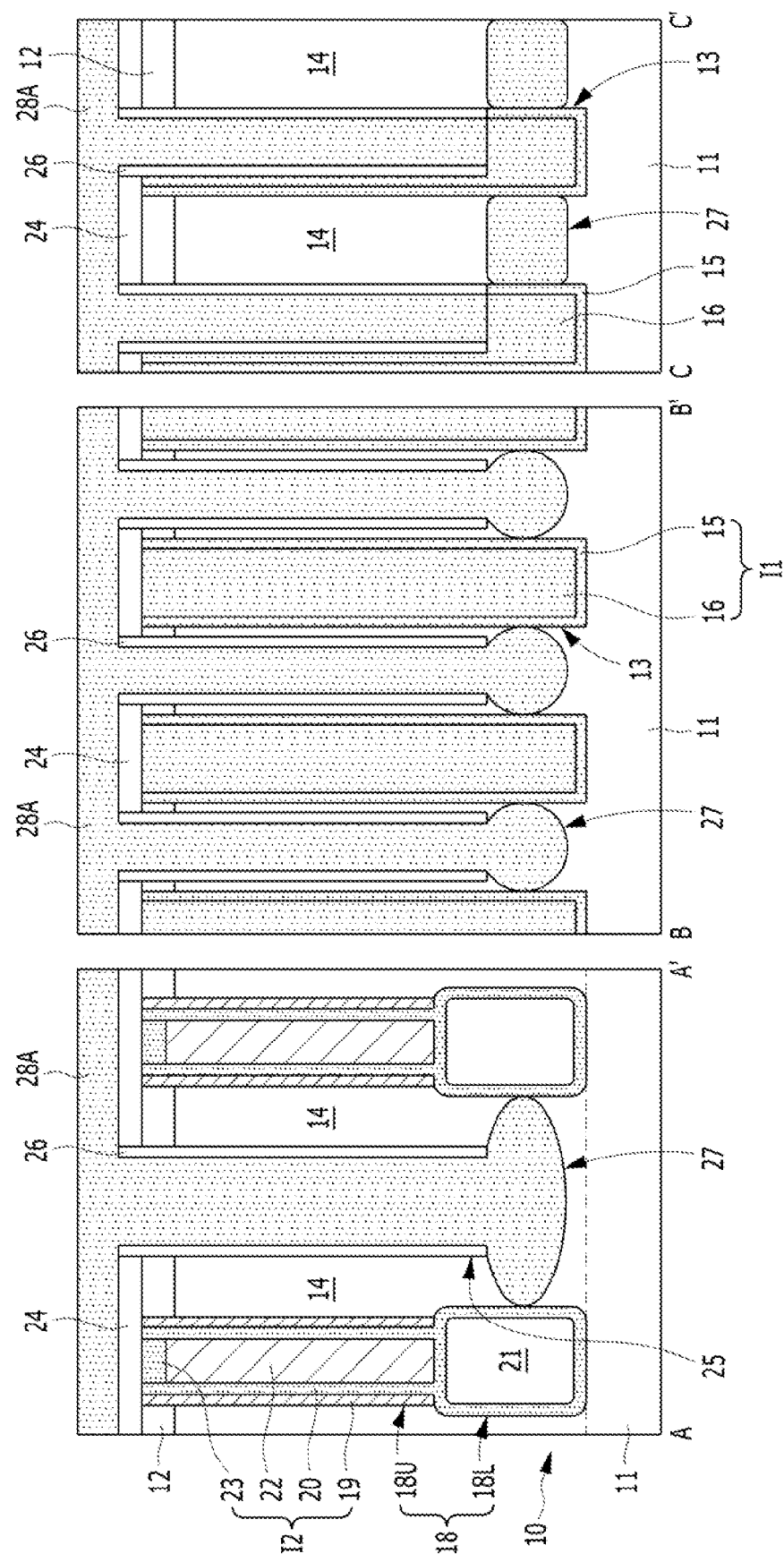

As shown in FIGS. 5C and 6C, a preliminary anti-punch layer 28A may be formed in the body trench 27. The preliminary anti-punch layer 28A may be formed of a dielectric material. In order to form the preliminary anti-punch layer 28A, the bit line trench 25 and the body trench 27 may be filled with silicon oxide and then be recessed to a given depth. The preliminary anti-punch layer 28A may fill at least the body trench 27. The height of the top surface of the preliminary anti-punch layer 28A may be controlled such that it is positioned at the bottom of the bit line trench 25. The pair of preliminary pillars 14 may float from the bulk 11 by the preliminary anti-punch layer 28A. Also, the preliminary anti-punch layer 28A allows for suppressing electrical connection between the pair of preliminary pillars 14.

Figure 5D:
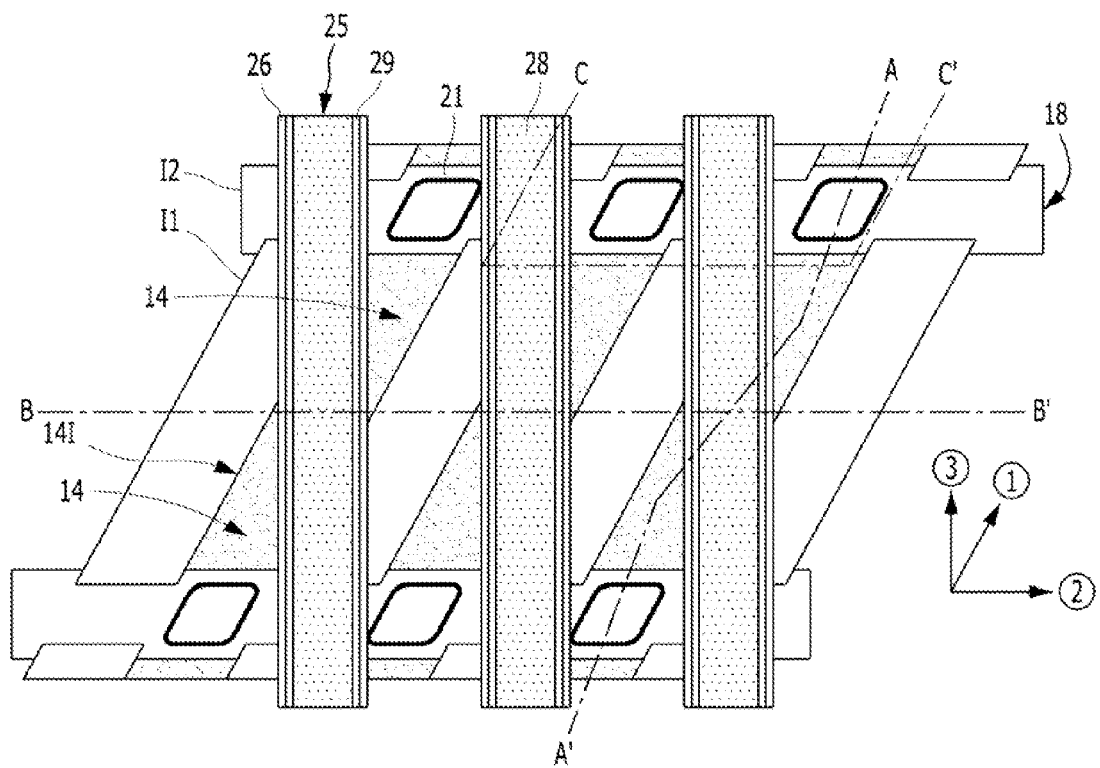
Figure 6D:
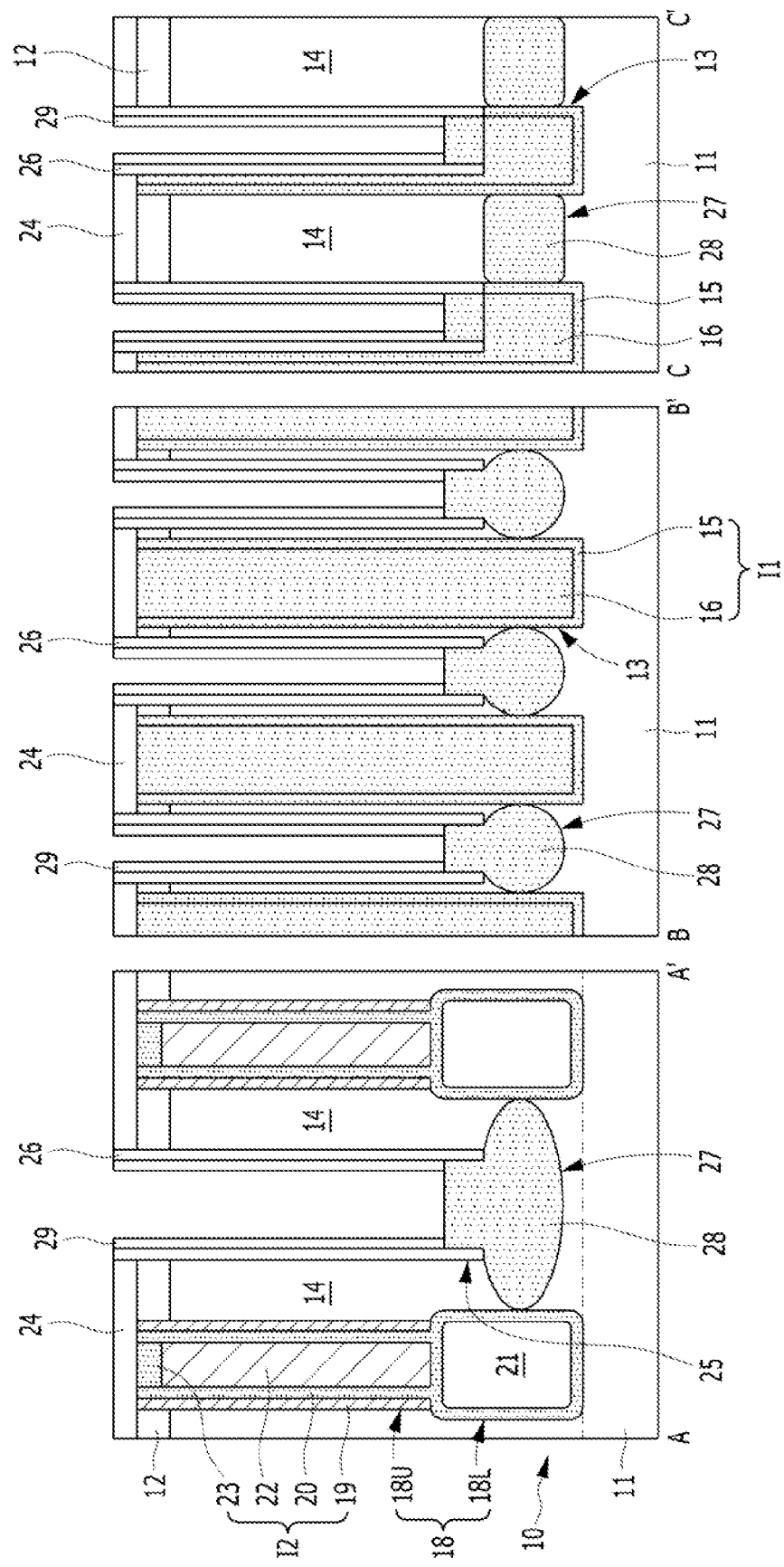

As shown in FIGS. 5D and 6D, a sacrificial spacer 29 may be formed. The sacrificial spacer 29 may cover the sidewalls of the liner spacer 26. The sacrificial spacer 29 may be formed of titanium nitride. For example, titanium nitride may be conformally deposited followed by an etch-back process to form the sacrificial spacer 29.

The preliminary anti-punch layer 28A may be recessed to a given depth. Thus, the punch-through prevention layer 28 may be formed. The punch-through prevention layer 28 may fill the body trench 27.

As the preliminary anti-punch layer 28A is recessed, a part of the liner spacer 26 may be exposed.

Figure 5E:
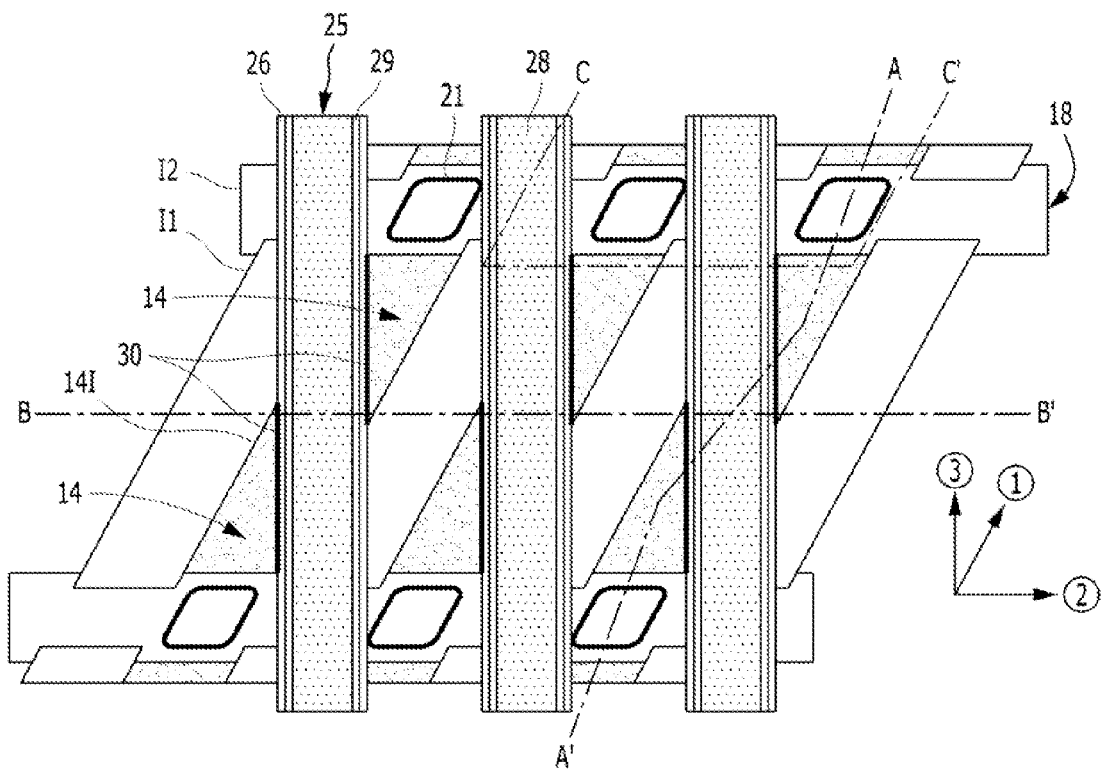
Figure 6E:
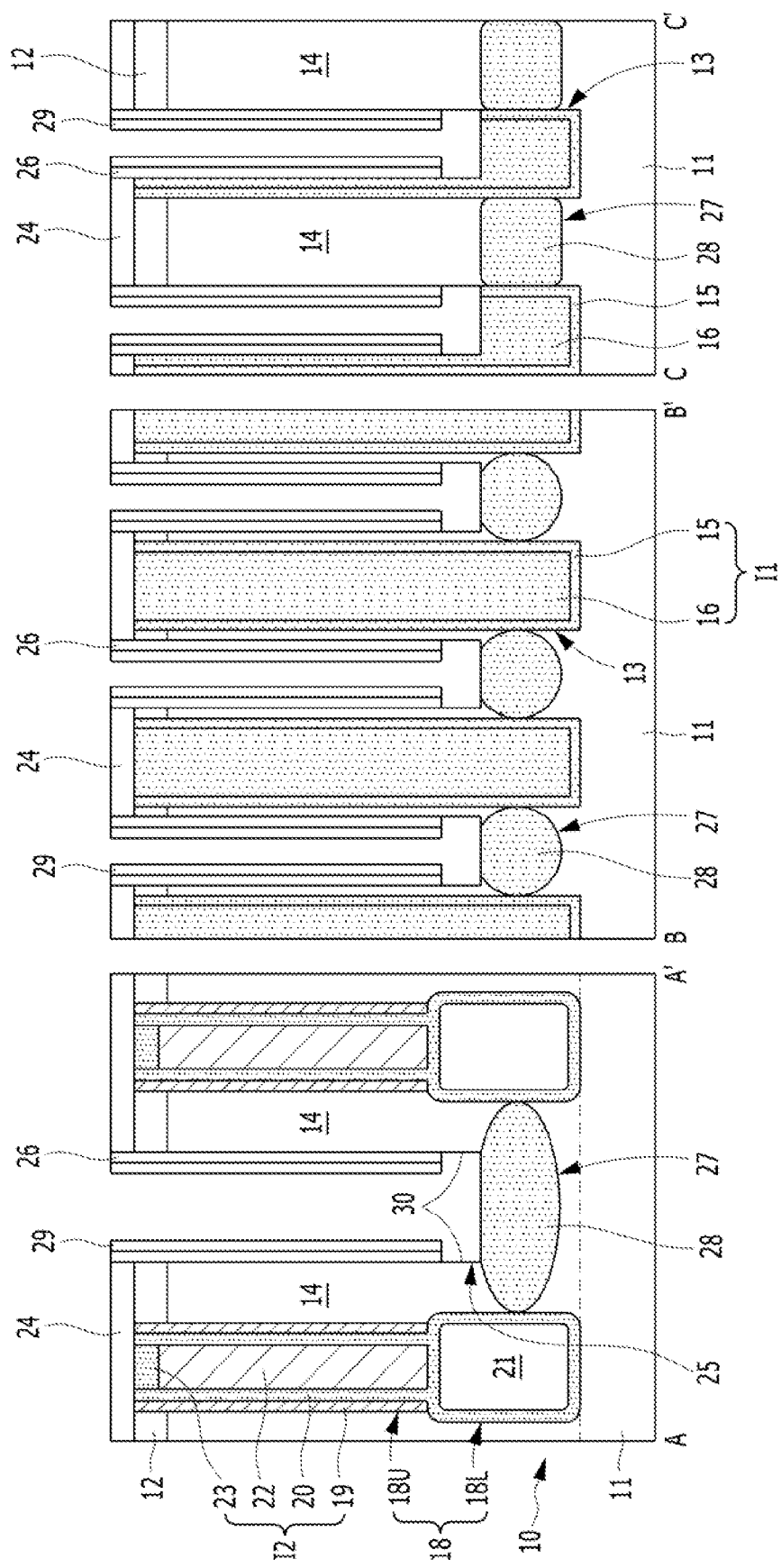

As shown in FIGS. 5E and 6E, the exposed portion of the liner spacer 26 may be selectively removed. As such, an opening 30 which exposes the bottom sidewalls of the preliminary pillar 14 may be formed. The opening 30 may be a region contacting subsequent buried bit lines and may be both side contact (BSC) exposing the bottom sidewalls of neighboring preliminary pillars 14 simultaneously. For example, both bottom sidewalls of the bit line trench 25 may be simultaneously exposed by the opening 30. The sidewalls of the preliminary pillar 14 that are not exposed by the opening 30 may be covered by the liner spacer 26.

As above, this embodiment does not require additional contact masks for forming the opening 30.

Figure 5F:
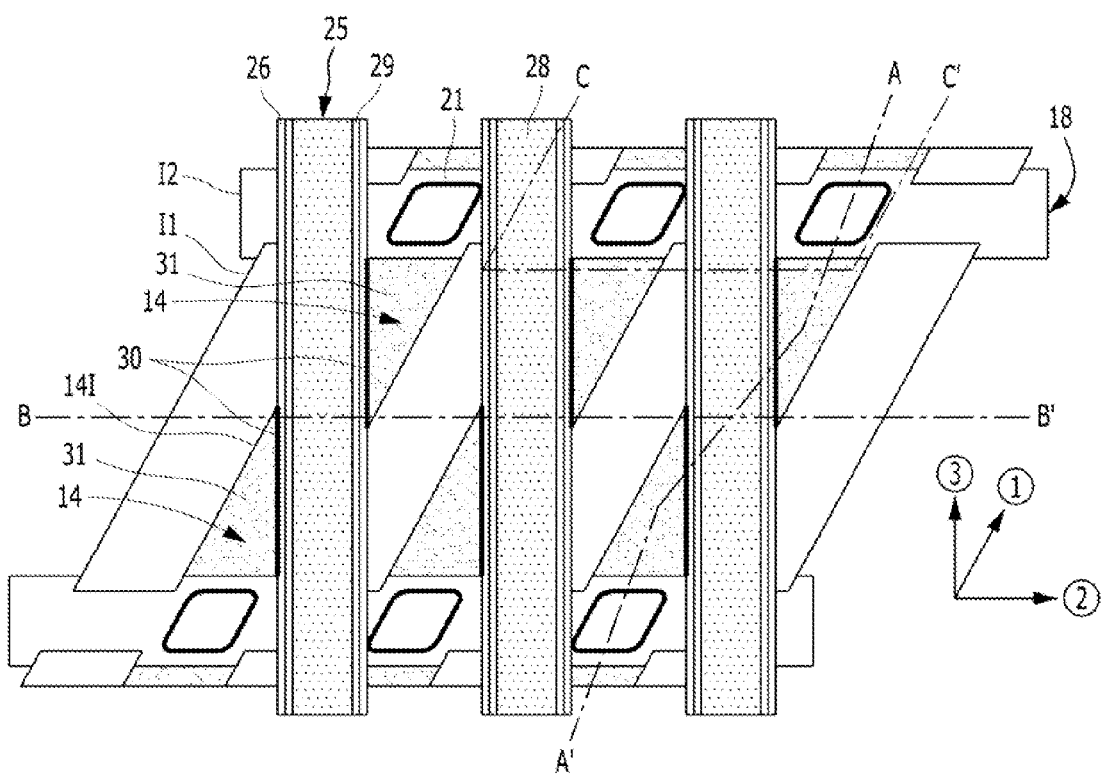
Figure 6F:
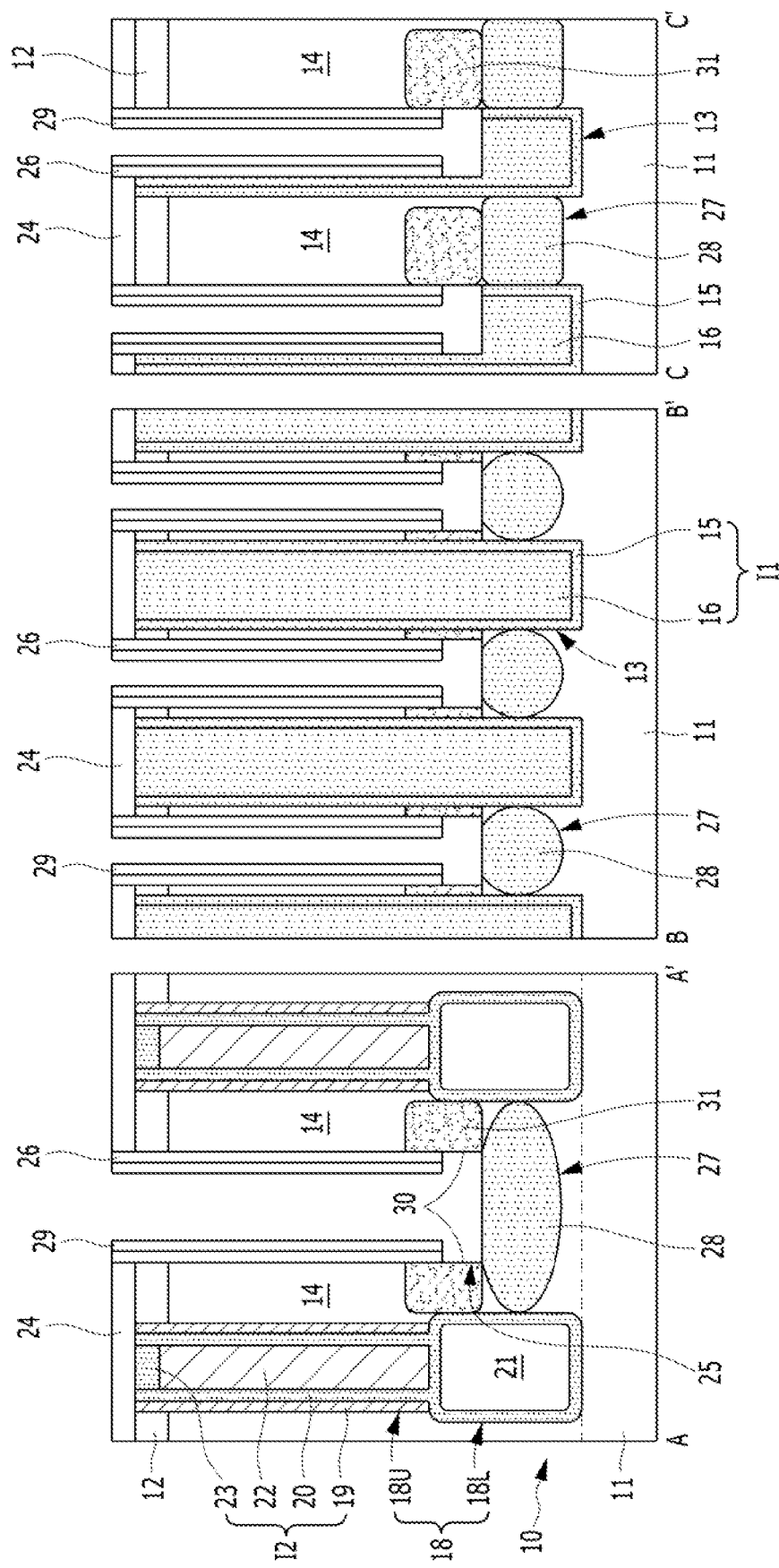

As shown in FIGS. 5F and 6F, a first junction region 31 may be formed. In order to form the first junction region 31, an impurity doping process may be performed by a plasma doping technology. For example, the impurity may be doped through the opening 30 to form the first junction region 31. In the doping process, the impurity may include an N-type impurity or a P-type impurity. For example, phosphorous (P) or arsenic (As) may be used as the Impurity. The first junction region 31 may be formed at the bottom of the preliminary pillar 14. The first junction region 31 may be formed floating from the bulk 11. That is, it may be separated from the bulk 11 by the punch-through prevention layer 28. Also, lateral diffusion of the first junction region 31 may be prevented by the second device isolation region I2.

Figure 5G:
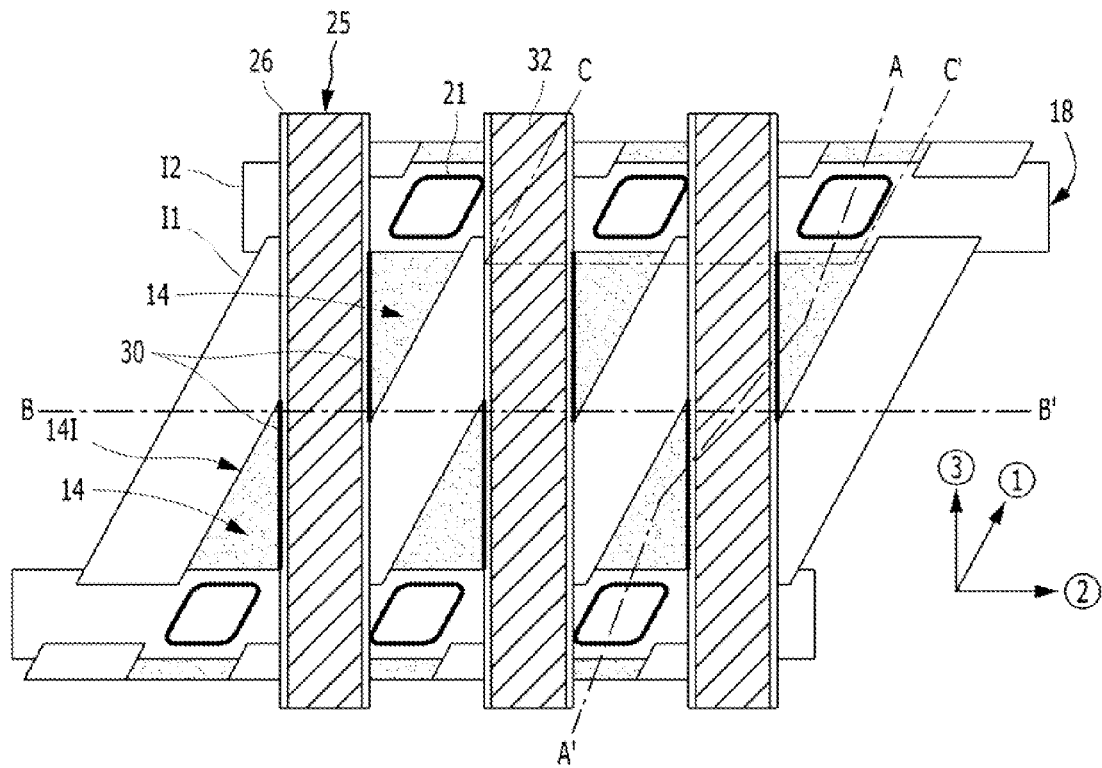
Figure 6G:
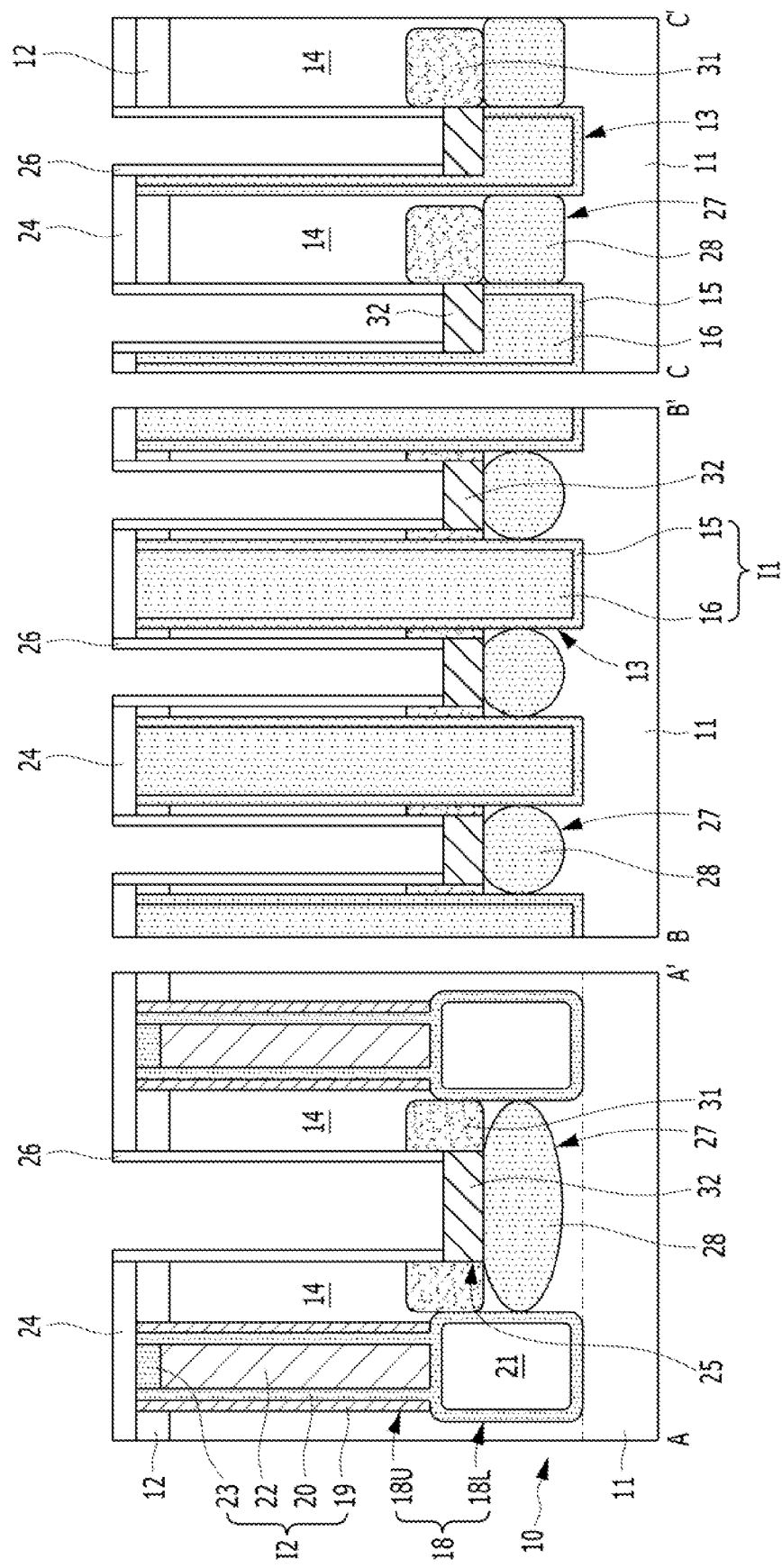

As shown in FIGS. 5G and 6G, a bit line 32 may be formed. For example, a metal layer (not shown) may be formed so that the bit line trench 25 is buried. Then, the metal layer may be subject to an etch-back process to form the bit line 32 which fills the bottom of the bit line trench 25. Here, the bit line 32 may include tungsten (W). Both ends of the bit line 32 may be electrically coupled to the first junction region 31 by filling the opening 30. The punch-through prevention layer 28 may be positioned between the bit line 32 and the bulk 11.

Although it is not shown, a metal silicide layer for ohmic contact between the bit line 32 and the first junction region 31 may be further formed. The metal silicide layer may be formed before the bit line 32 is formed. The metal silicide layer may include cobalt silicide.

As above, the bit line 32 may contact the first junction region 31 without a plug. In other words, it is a plugless contact.

Figure 5H:
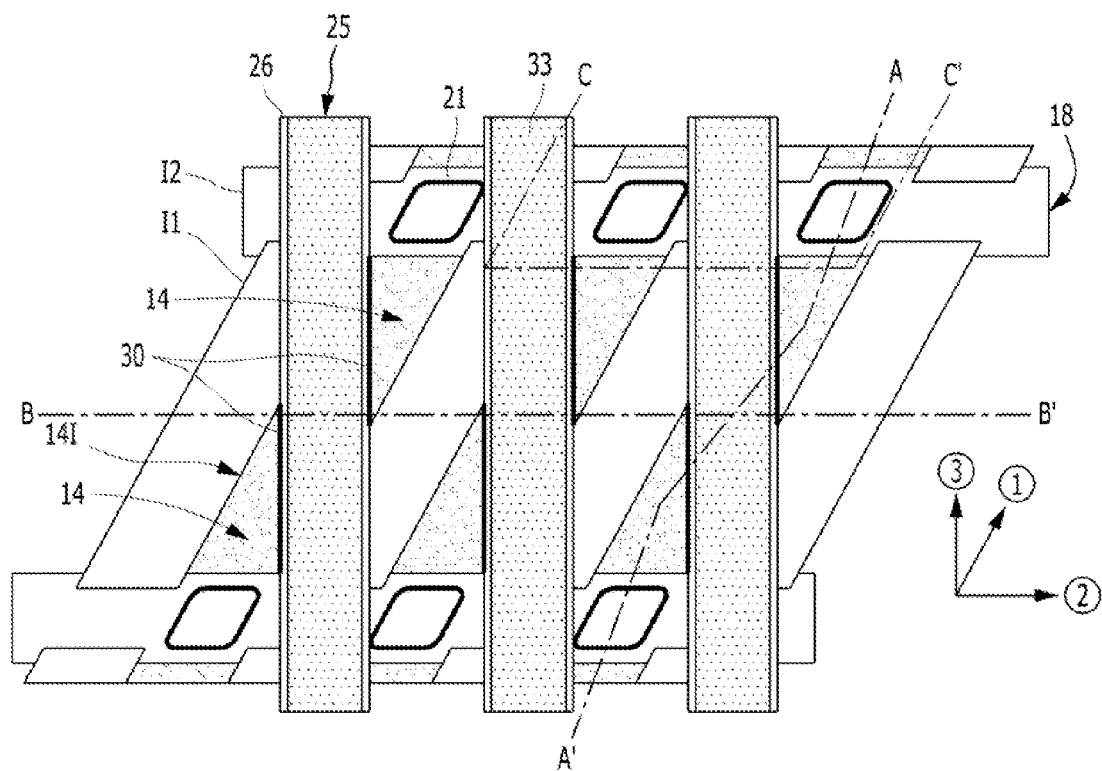
Figure 6H:
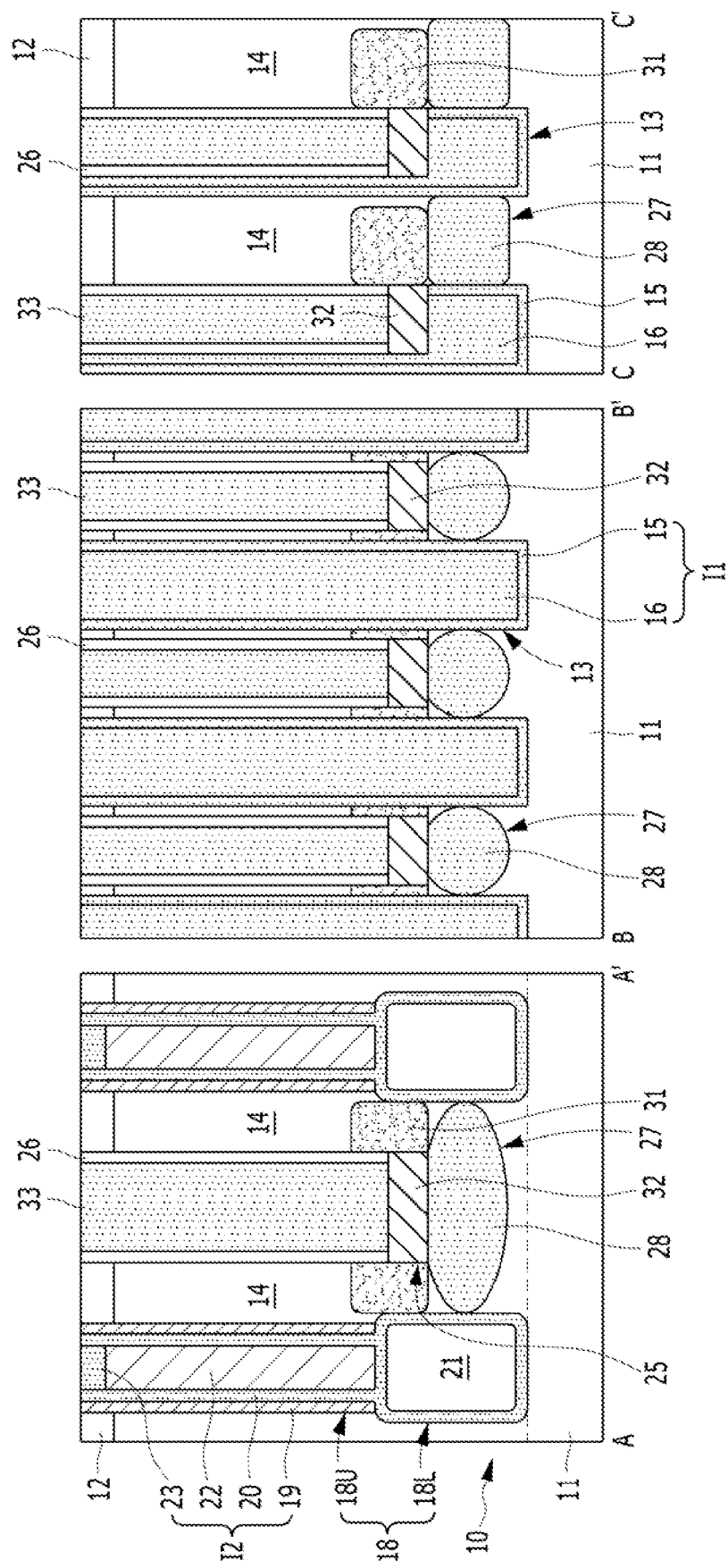

As shown in FIGS. 5H and 6H, a sacrificial spacer 29 may be selectively removed.

In order to cover the bit line 32, a bit line capping layer 33 may be formed to bury the bit line trench 25. Here, the bit line capping layer 33 may be include silicon oxide.

Subsequently, the bit line capping layer 33 may be planarized until the surface of the first hard mask layer 12 is exposed. In this case, the second hard mask layer 24 may be removed.

FIGS. 7A to 7G are cross-sectional views illustrating a method for forming a gate electrode of the semiconductor device. FIGS. 8A to 8G are cross-sectional views taken along the lines A-A' and B-B' of FIGS. 7A to 7F.

Figure 7A:
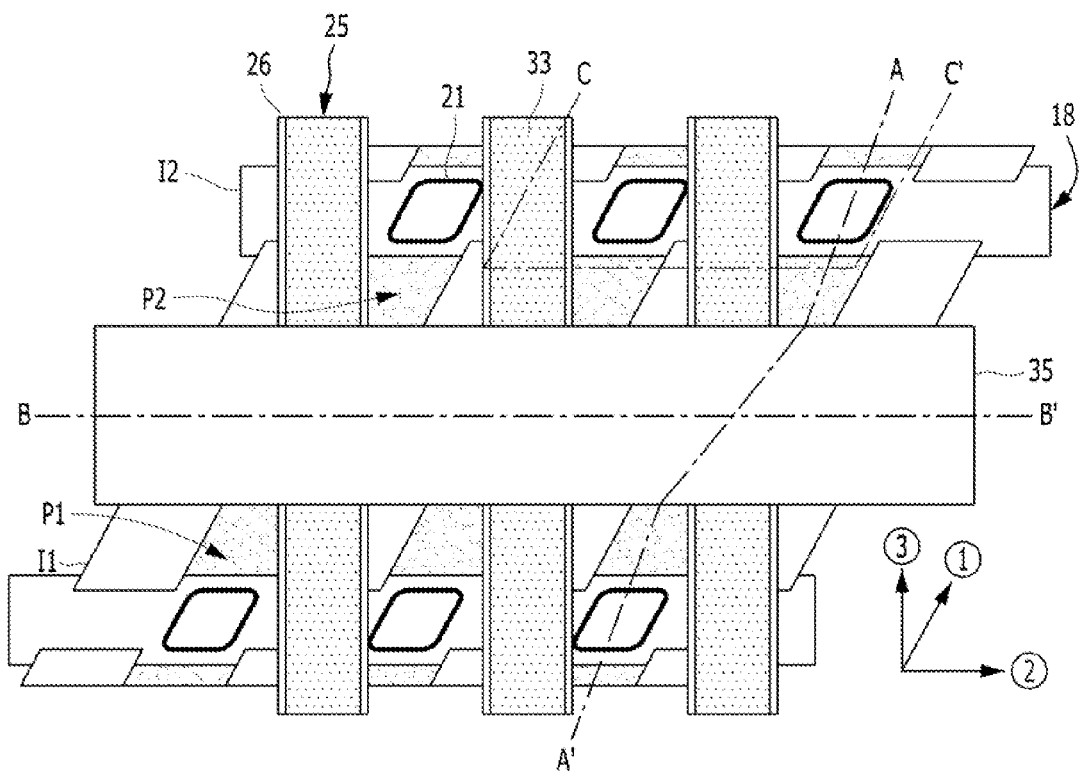
FIGS. 7A to 7G are views illustrating a method for forming a gate electrode of the semiconductor device in accordance with an embodiment.
Figure 8A:
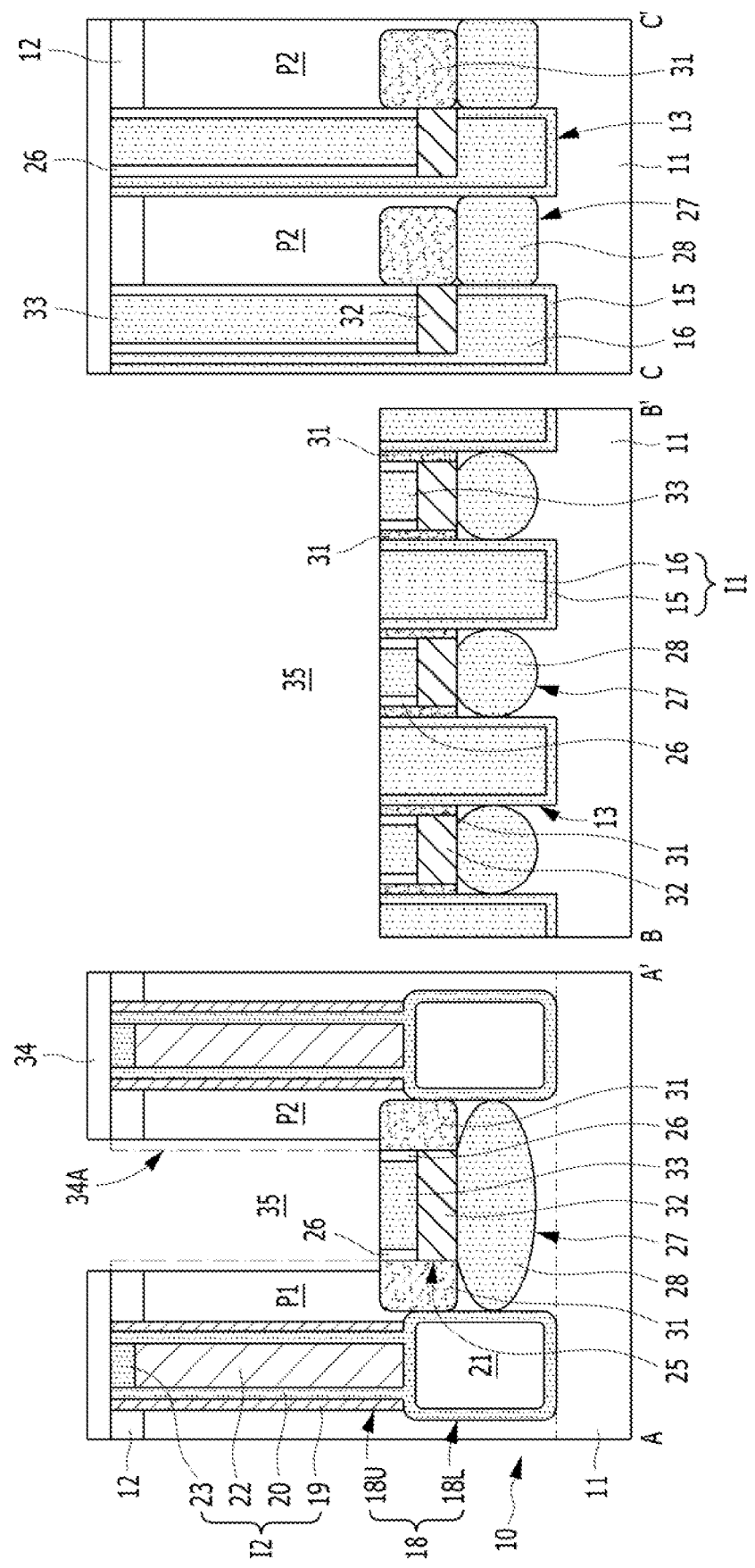
FIGS. 8A to 8G are cross-sectional views taken along the lines A-A' and B-B' of FIGS. 7A to 7F.

As shown in FIGS. 7A and 8A, a preliminary gate trench 35 may be formed. For example, the preliminary gate trench 35 may be formed by etching the bit line capping layer 33, the first device isolation region I1, and the preliminary pillar 14 by using a third hard mask layer 34 as an etch mask (see, a reference number 34A). An etching process for forming the preliminary gate trench 35 may be performed until the bit line capping layer 33 achieves a given thickness. The preliminary gate trench 35 may be formed in a direction crossing with the bit line 32. The preliminary gate trench 35 may extend in the second direction ②. The first junction region 31 may be exposed at the bottom of the preliminary gate trench 35.

A pair of first and second pillars P1 and P2 may be formed by the preliminary gate trench 35. The first and second pillars P1 and P2 may be formed by etching the preliminary pillar 14. The first and second pillars P1 and P2 have multi sidewalls, respectively. During the etching process for forming the preliminary gate trench 35, a part of the liner spacer 26 may also be etched. Along the B-B' direction, under the preliminary gate trench 35, the top surfaces of the liner spacer 26, the first device isolation region I1 and the bit line capping layer 33 may be at the same level.

Figure 7B:
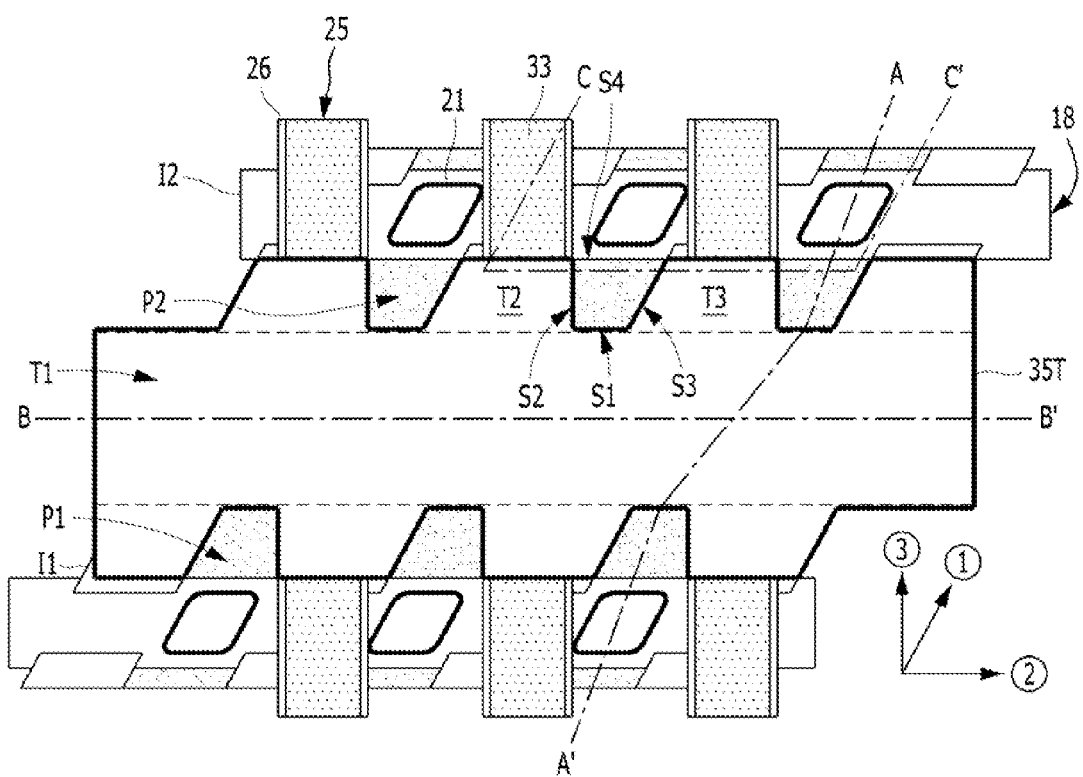
Figure 8B:
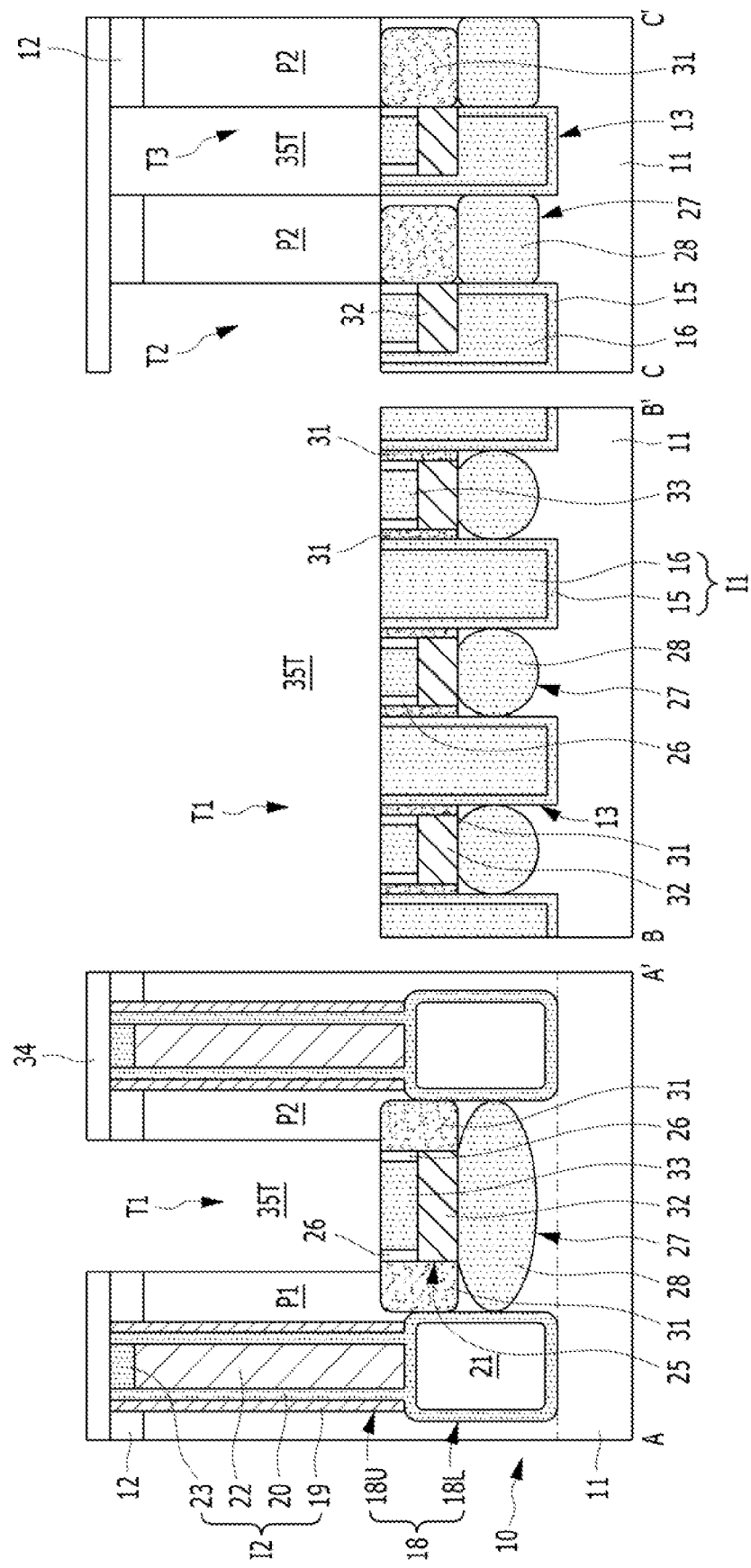

As shown in FIGS. 7B and 8b, an extending process of the preliminary gate trench 35 may be performed. For example, the bit line the capping layer 33 and the first device isolation region I1 may be selectively etched by wet etching. That is, a widening process using wet etching can be performed. A part of the first device isolation region I1 and a part of the bit line capping layer 33 may be etched by the wet widening process so that the preliminary gate trench 35 may extend in the first direction. Oxides may be selectively removed by the wet widening process. For example, the first liner, the first isolation dielectric layer, the liner spacer and the bit line capping layer may be selectively removed.

The preliminary gate trench extended by the wet widening process may be the gate trench 35T. The gate trench 35T may include a first trench T1, a second trench T2 and a third trench T3. The first trench T1 may extend in the second direction. The first trench T1 may be positioned between the first and second pillars P1 and P2. The second and third trenches T2 and T3 may stem from the first trench T1. The second and third trenches may extend in the first direction ① crossing with the second direction ②.

The side surfaces of the first and second pillars P1 and P2 may be exposed by the first trench T1, the second and third trenches T2 and T3. For example, a first side surface S1, a second side surface S2 and a third side surface S3 may be exposed. The first side surface may be exposed by the first trench T1, and the second and third side surfaces may be exposed by the second and third trenches T2 and T3, respectively. The second and third trenches T2 and T3 may have the same size and shape. The first and second pillars P1 and P2 may include a fourth side surface S4 so that the fourth side surface S4 may contact the second device isolation region I2. The second device isolation region I2 may contact the second and third trenches T2 and T3.

After the wet widening process, the bit line capping layer 33 having a given thickness may remain over the bit line 32.

Figure 7C:
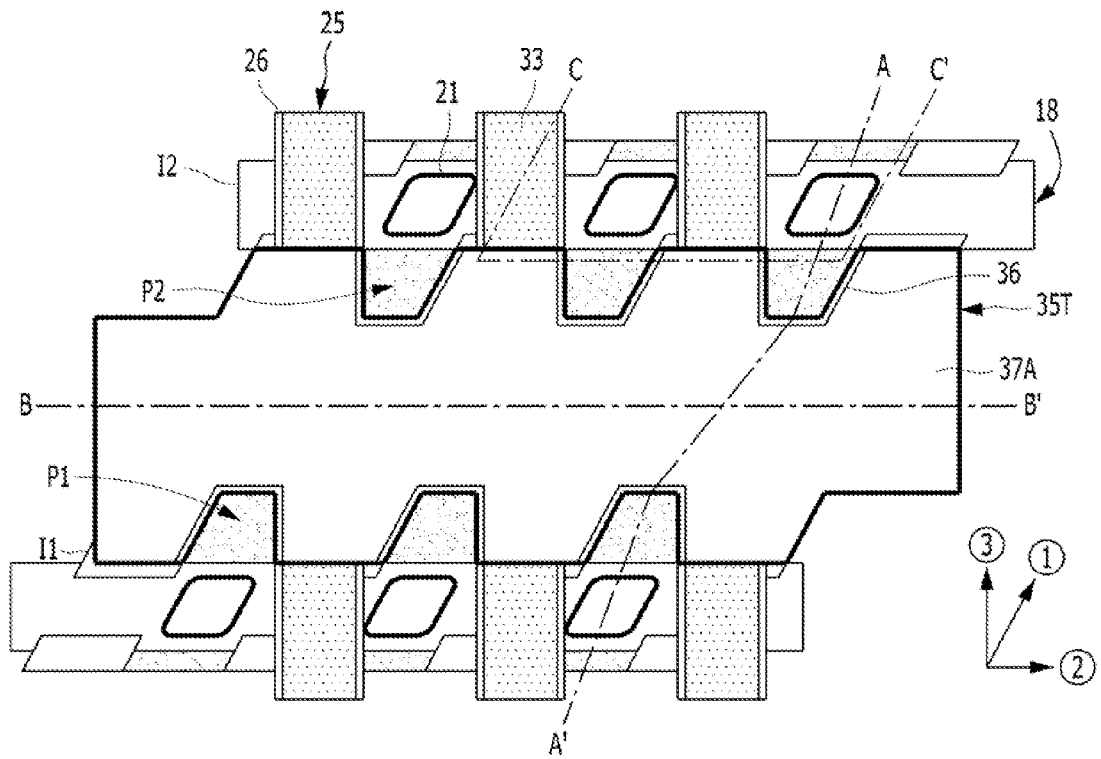
Figure 8C:
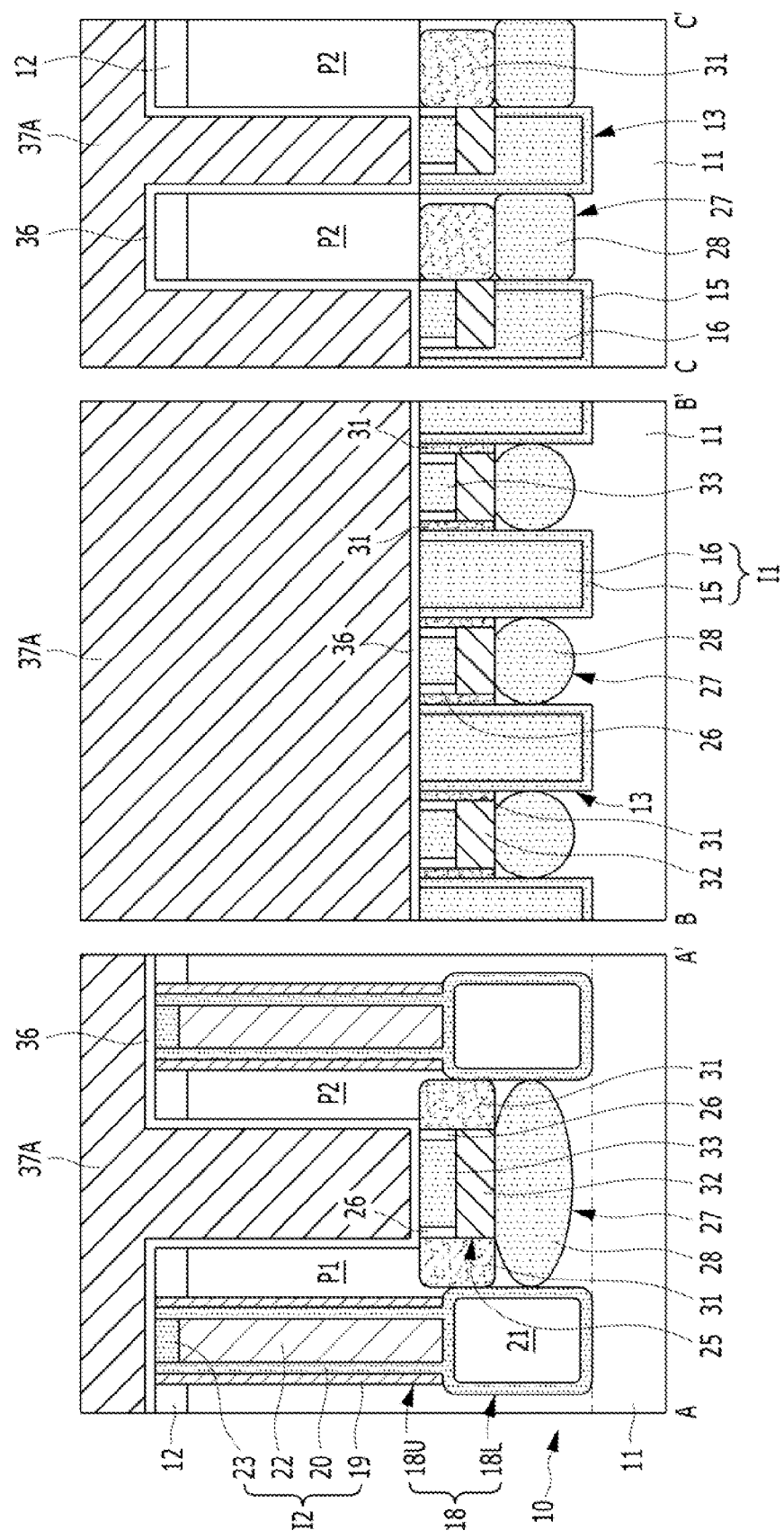

As shown in FIGS. 7C and 8C, the third hard mask layer 34 may be removed.

Then, a gate dielectric layer 36 may be formed on the surface of the gate trench 35T. The gate dielectric layer 36 may be formed by a thermal oxidation process. In another embodiment, the gate dielectric layer 36 may be formed by chemical vapor deposition (CVD) or atomic layer deposition (ALD). The gate dielectric layer 36 may include a high-k material, oxide, nitride, oxynitride or a combination thereof. The high-k material may have a hafnium-containing material. The hafnium-containing material may include one or more of hafnium oxide, hafnium silicon oxide, hafnium silicon oxynitride, and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. Also, other high-k materials known in the art may be selectively used.

A gate conductive layer 37A may be formed on the gate dielectric layer 36. The gate conductive layer 37A may fill the gate trench 35T. The gate conductive layer 37A may include a low resistivity metal material. The gate conductive layer 37A may be formed of titanium nitride, tungsten, and so on.

Figure 7D:
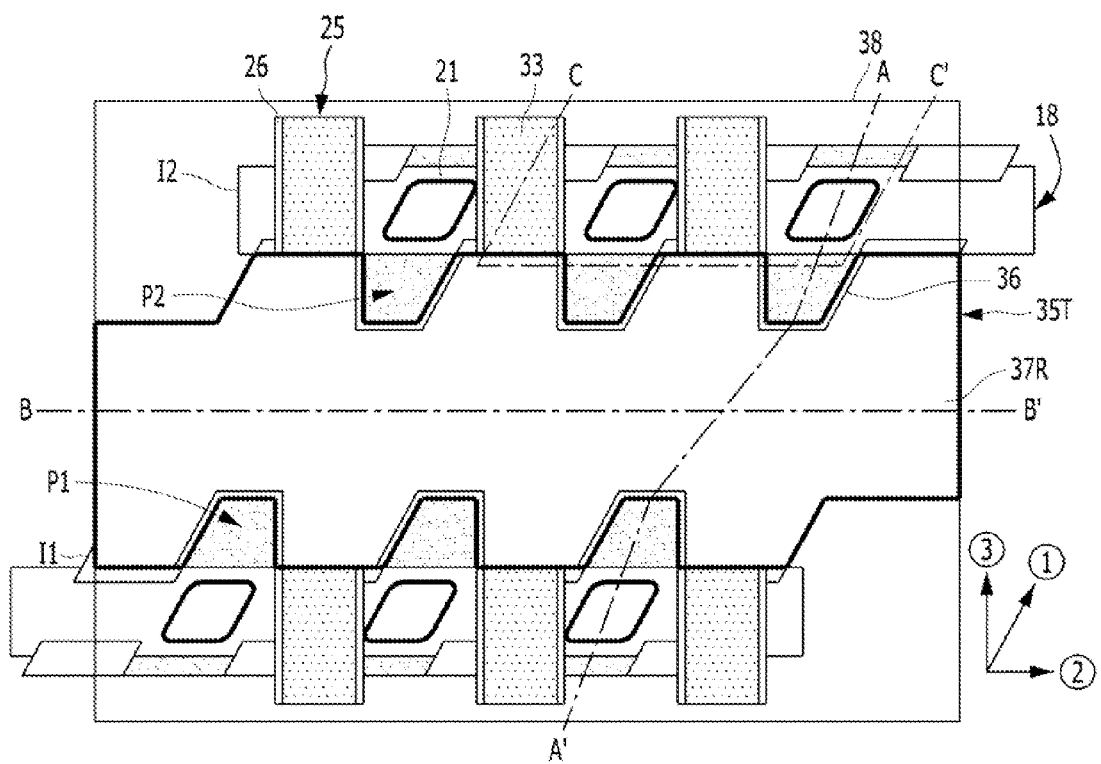
Figure 8D:
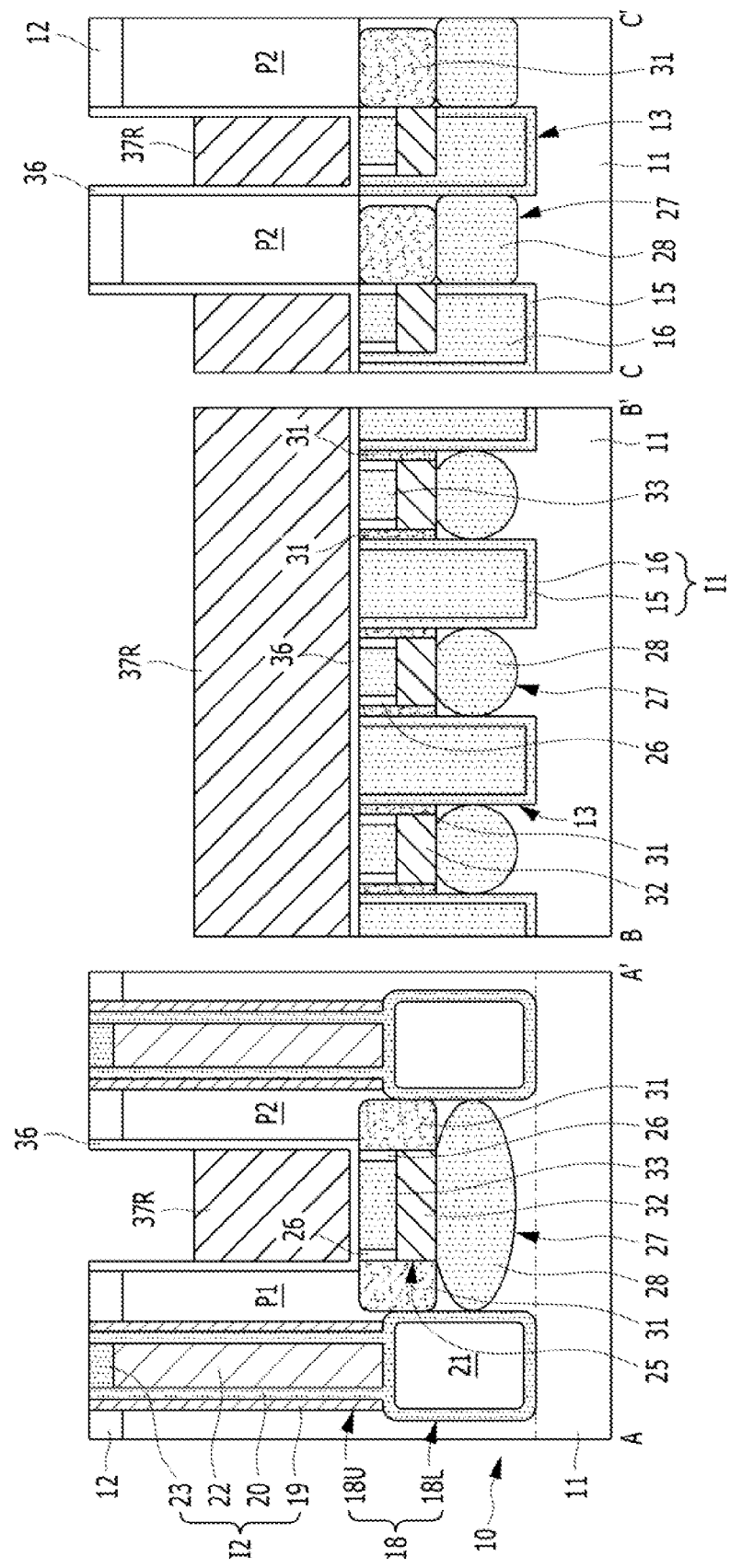

As shown in FIGS. 7D and 8D, a recessing process may be performed so that a preliminary gate electrode 37R remains in the gate trench 35T. The recessing process may be performed by dry etching, for example, an etch-back process. The preliminary gate electrode 37R may be formed by an etch-back process of the gate conductive layer 37A. In another embodiment, the recessing process may be performed by a planarization process followed by an etch-back process.

The preliminary gate electrode 37R may be recessed to be lower than the top surfaces of the first and second pillars P1 and P2.

Figure 7E:
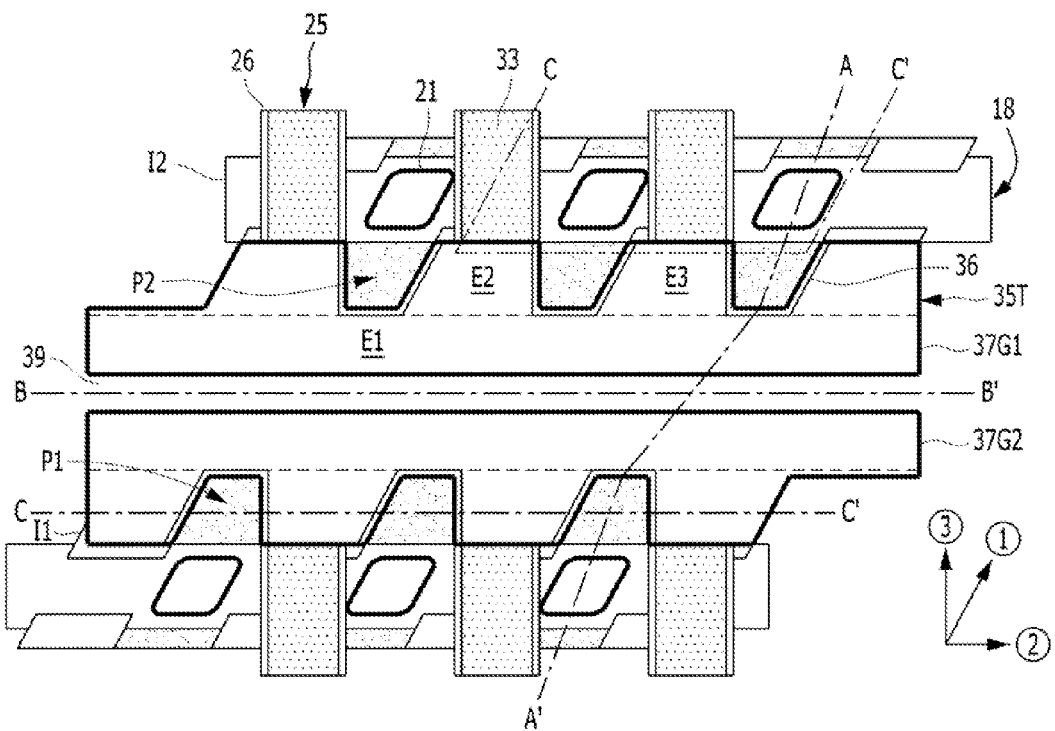
Figure 8E:
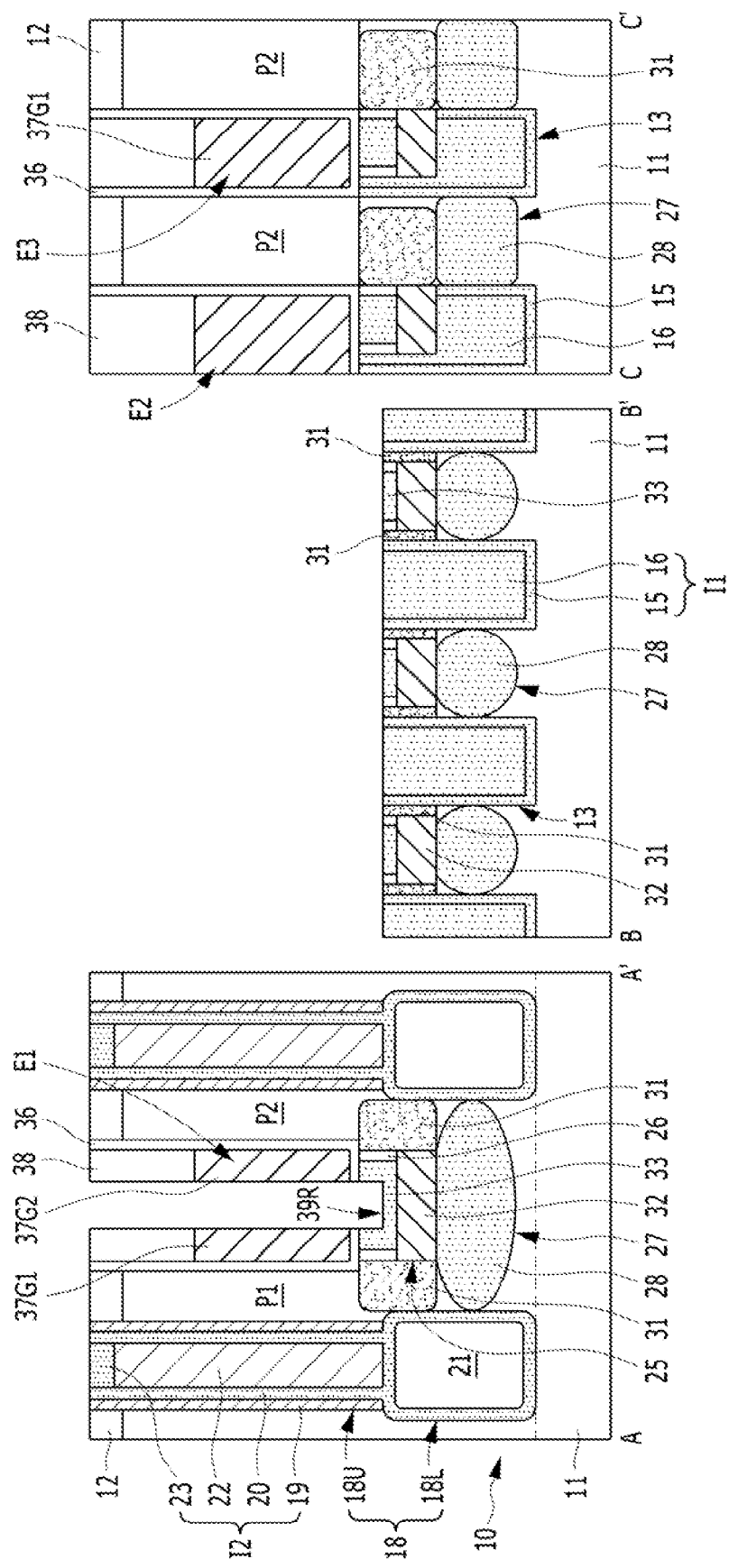

As shown in FIGS. 7E and 8E, a gate separation mask 38 may be formed. The gate separation mask 38 may cover the side surfaces of the gate trench 35T on the preliminary gate electrode 37R. For example, a mask material may be formed on the whole surface including the preliminary gate electrode 37R, followed by an etch-back process to form the gate separation mask 38. The gate separation mask 38 may be formed of a material having etch selectivity with respect to the preliminary gate electrode 37R.

The center portion of the preliminary gate electrode 37R may be etched by using the gate separation mask 38 to form a pair of first and second gate electrodes 37G1 and 37G2. When etching the center portion of the preliminary gate electrode 37R, an etch depth 39R may be controlled such that the first and second gate electrodes 37G1 and 37G2 are sufficiently spaced from each other.

As such, the first and second gate electrodes 37G1 and 37G2 may be formed by separating the preliminary gate electrode 37R. The first and second gate electrodes 37G1 and 37G2 may be formed in the gate trench 35T.

As described above, the first and second gate electrodes 37G1 and 37G2 may be symmetrical. Each first and second gate electrodes 37G1 and 37G2 may include the first electrode E1 extending in the second direction, and the second and third electrodes E2 and E3 extending in the first direction crossing with the second direction and stemming from the first electrode E1. The first to third electrodes E1 to E3 may be formed in the first trench T1, and second and third trenches T2 and T3, respectively.

The first to third electrodes E1 to E3 may overlap with three or more side surfaces of the first and second pillars P1 and P2. A fourth side surface S4 of the first and second pillars P1 and P2 may not overlap with the first and second gate electrodes 37G1 and 37G2.

Figure 7F:
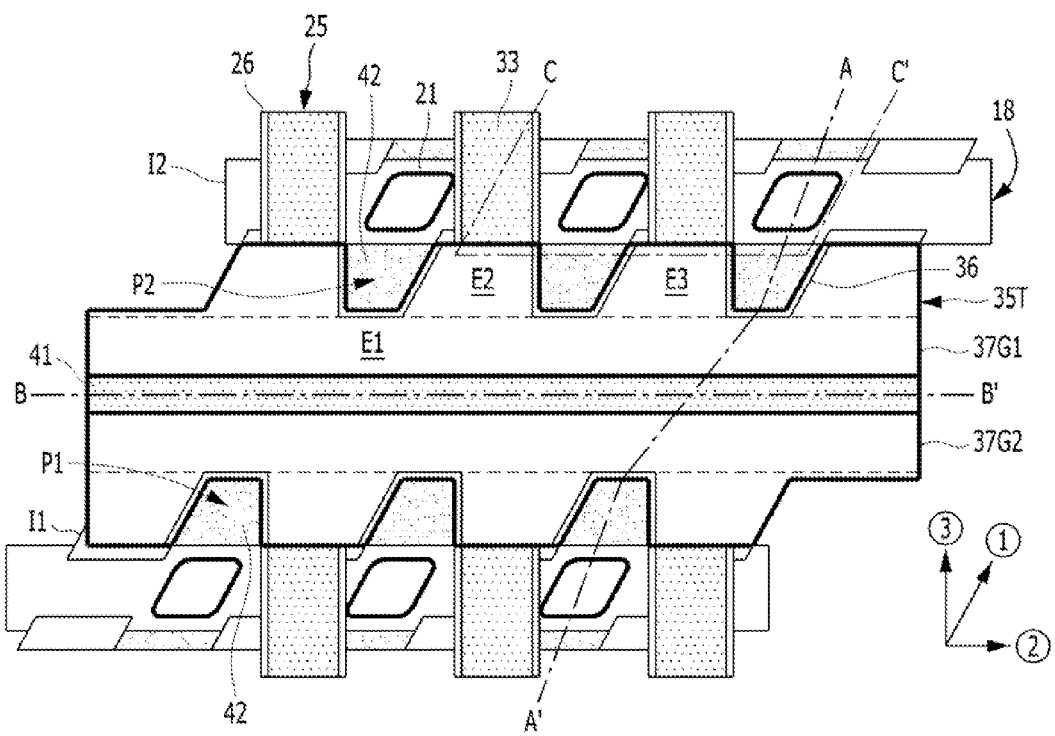
Figure 8F:
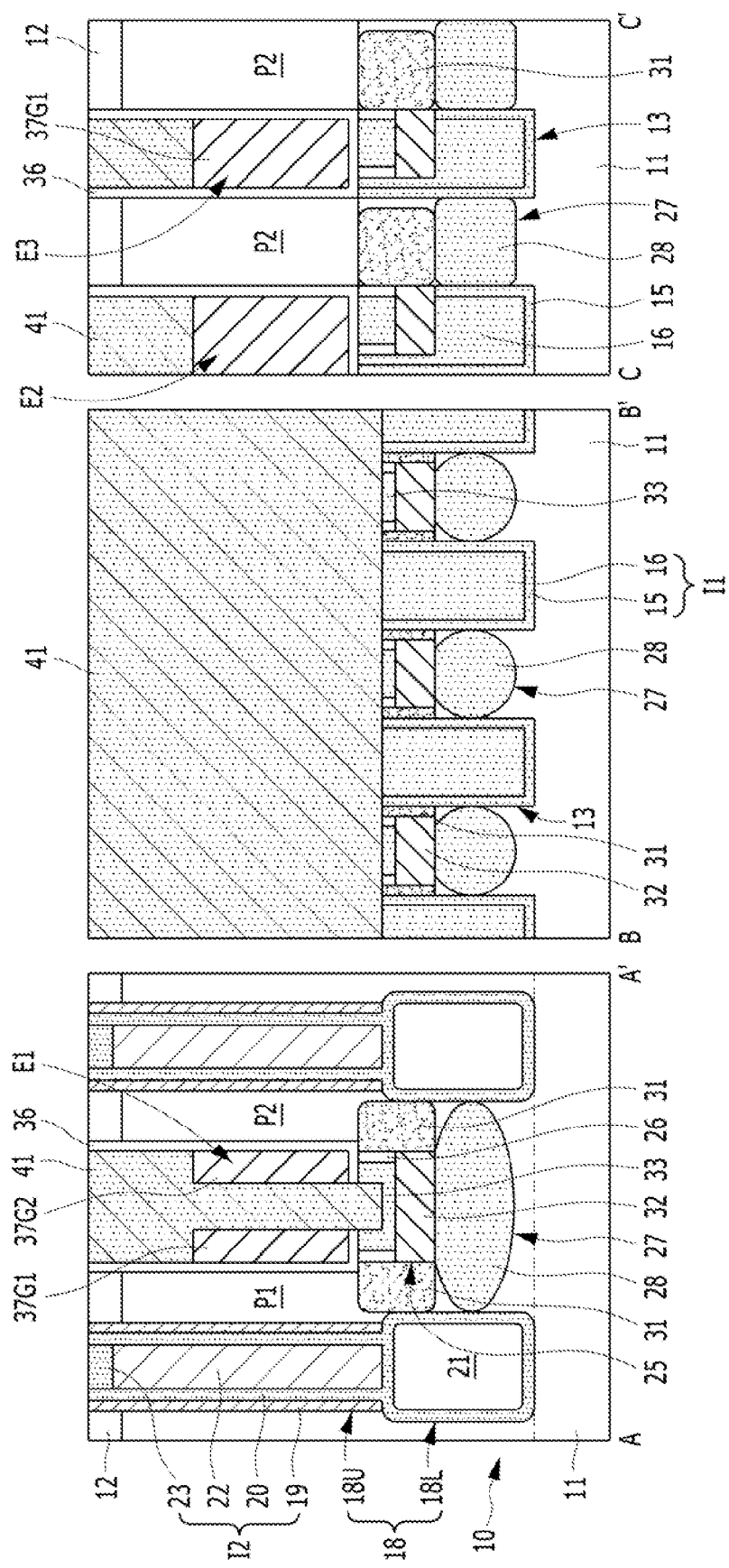

As shown in FIGS. 7F and 8F, the gate separation mask 38 may be removed.

Then, a gate capping layer 41 may be formed. The gate capping layer 41 may include a dielectric material. The gate capping layer 41 may be filled between the first and second gate electrodes 37G1 and 37G2. The gate capping layer 41 may include silicon nitride. Subsequently, the gate capping layer 41 may be planarized until the top surface of the first hard mask layer 12 is exposed.

Figure 7G:
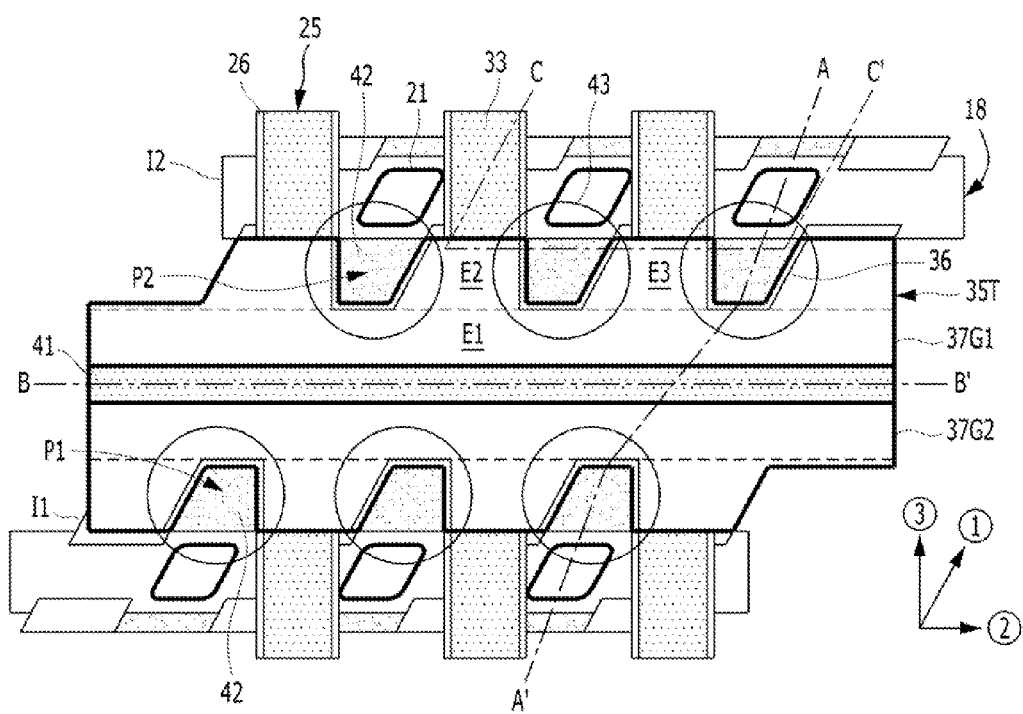
Figure 8G:
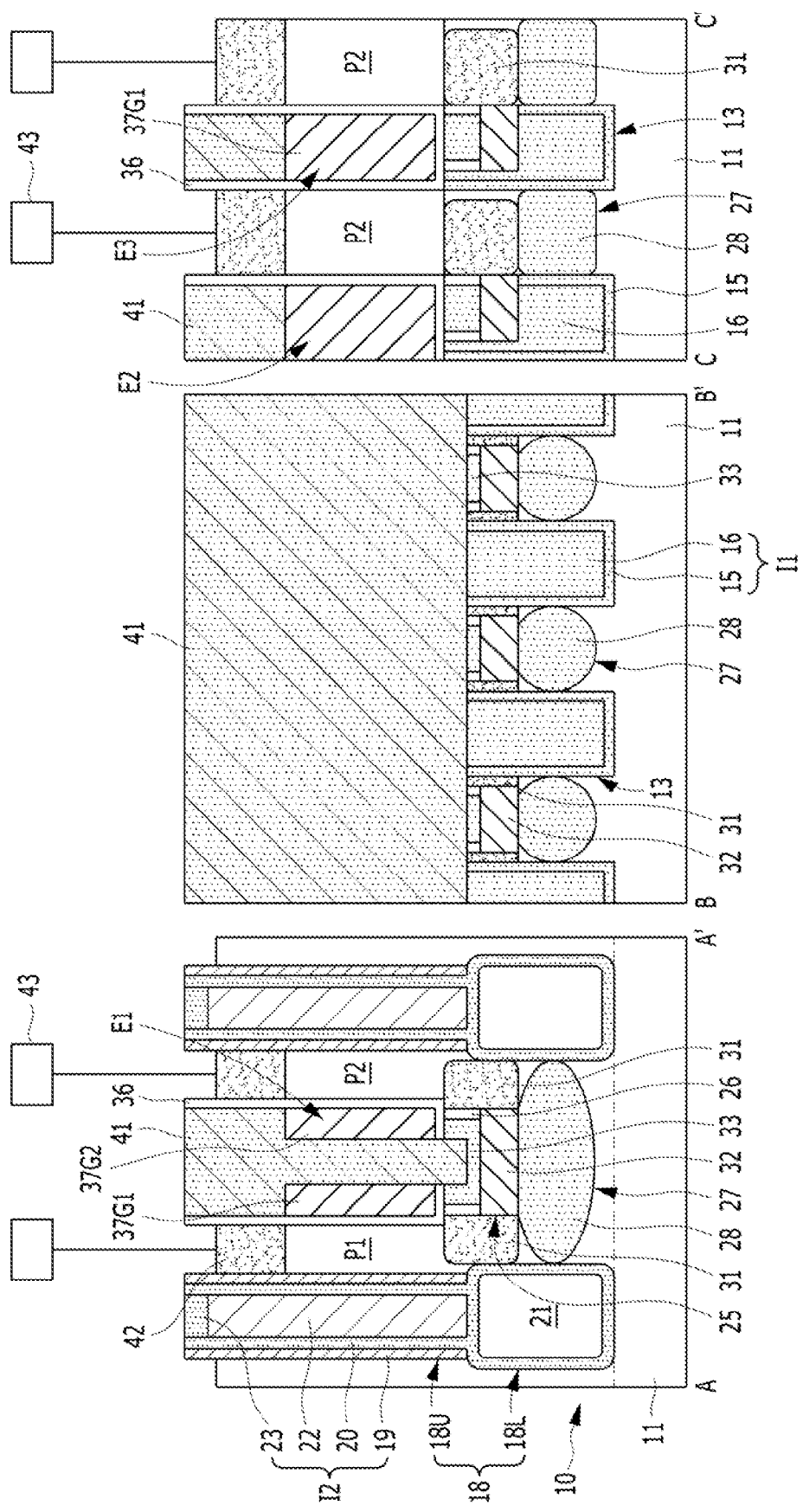

As shown in FIGS. 7G and 8G, after forming the gate capping layer 41, an Impurity doping process may be performed by implantation or other doping processes. As such, a second junction region 42 may be formed in the first and second pillars P1 and P2. When performing the impurity doping process, the gate capping layer 41 may be used as a barrier. The second junction region 42 may be either a source region or a drain region. The vertical channel VC may be defined between the first and second junction regions 31 and 42. The first and second gate electrodes 37G1 and 37G2 may overlap with the vertical channel VC. The second junction region 42 may be formed after the top surfaces of the first and second pillars P1 and P2 are exposed by etching the first hard mask layer 12.

As described above, the first gate electrode 37G1, and the first and second junction regions 31 and 42 may compose a first transistor Tr1. The second gate electrode 37G2, and the first and second Junction regions 31 and 42 may compose a second transistor Tr2.

Although it is not shown, a memory element 43 may be electrically coupled to the second junction region 42.

In another embodiment, the second junction region 42 may be formed by an impurity doping process after forming a contact hole. Here, the contact hole may expose the top surfaces of the first and second pillars P1 and P2.

Figure 9:
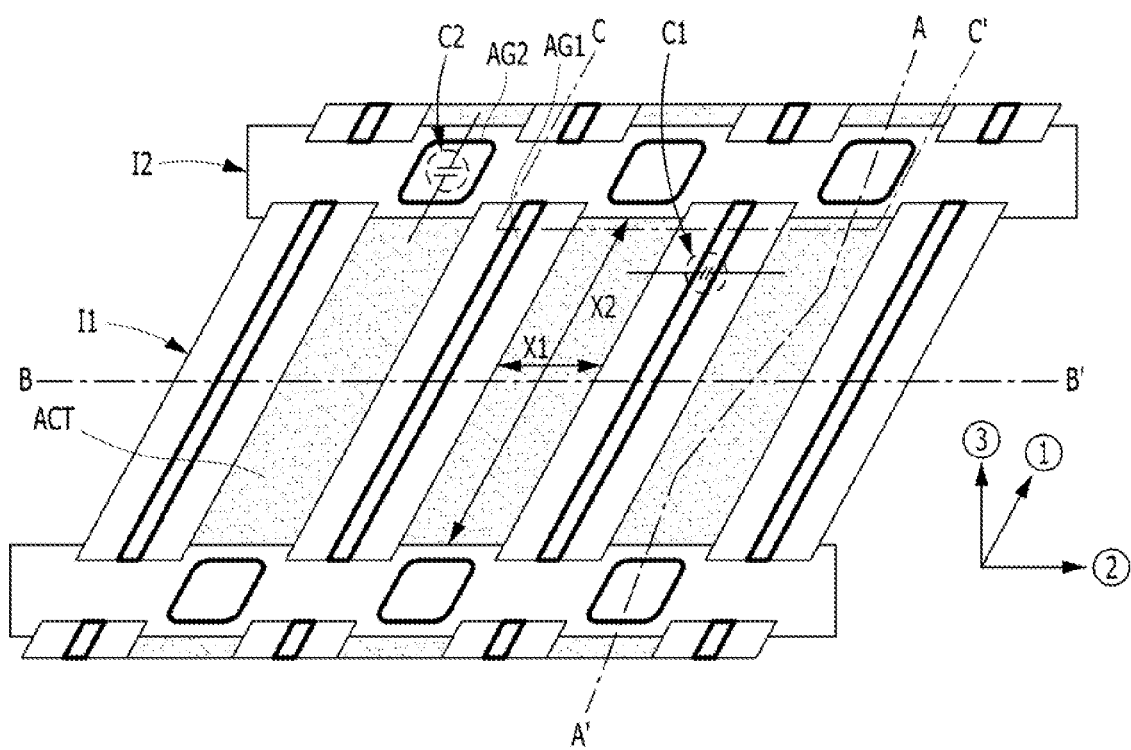
FIG. 9 is a cross-sectional view illustrating a device isolation region in accordance with a second embodiment.

FIG. 9 is a cross-sectional view illustrating a device isolation region in accordance with a second embodiment.

Referring to FIG. 9, a device isolation region and an active region ACT may be formed in a substrate. The device isolation region may include first and second device isolation regions I1 and I2. The active region ACT may be defined by the first and second device isolation regions I1 and I2. The first device isolation region I1 may extend in a first direction ①, and the second device isolation region I2 may extend in a second direction ② crossing with the first direction ①. The first device isolation region I1 may become discontinuous by the second device isolation region I2. The first and second device isolation regions I1 and I2 may be shallow trench isolation (STI) regions which are formed by trench etching. The first and second device isolation region I1 and I2 may be formed by filling isolation trenches with a dielectric material. The first and second device isolation regions I1 and I2 may be formed of the same material or different materials. For example, each of the first and second device isolation regions I1 and I2 may include one or more of silicon oxide, silicon nitride, and a combination thereof. The first device isolation region I1 may have a first air gap AG1. The second device isolation region I2 may have a second air gap AG2. The first air gap AG1 may be a line type.

In FIG. 9, the plurality of active regions ACT may be spaced with first and second uniform intervals in the first and second directions, respectively, and be the same size. The active regions ACT may extend in the first direction and the second direction. The second device isolation region I2 having the second air gap AG2 may be positioned between the neighboring active regions ACT in the first direction. The first device isolation region I1 having the first air gap AG1 may be positioned between the neighboring active regions ACT in the second direction.

Thus, parasitic capacitances C1 and C2 between neighboring active regions ACT may be reduced.

Various semiconductor devices may be formed in the active region ACT.

Hereinafter, an example of a semiconductor device in accordance with the second embodiment will be described.

FIGS. 10A to 10G are views illustrating a method for manufacturing the semiconductor device in accordance with the second embodiment. Except for a first device isolation region having the second air gap AG2, the method of the second embodiment may be the same as the method of the first embodiment. FIGS. 10A to 10G show cross-sectional views of the device isolation region taken along the lines A-A' and B-B' of FIG. 9

Figure 10A:
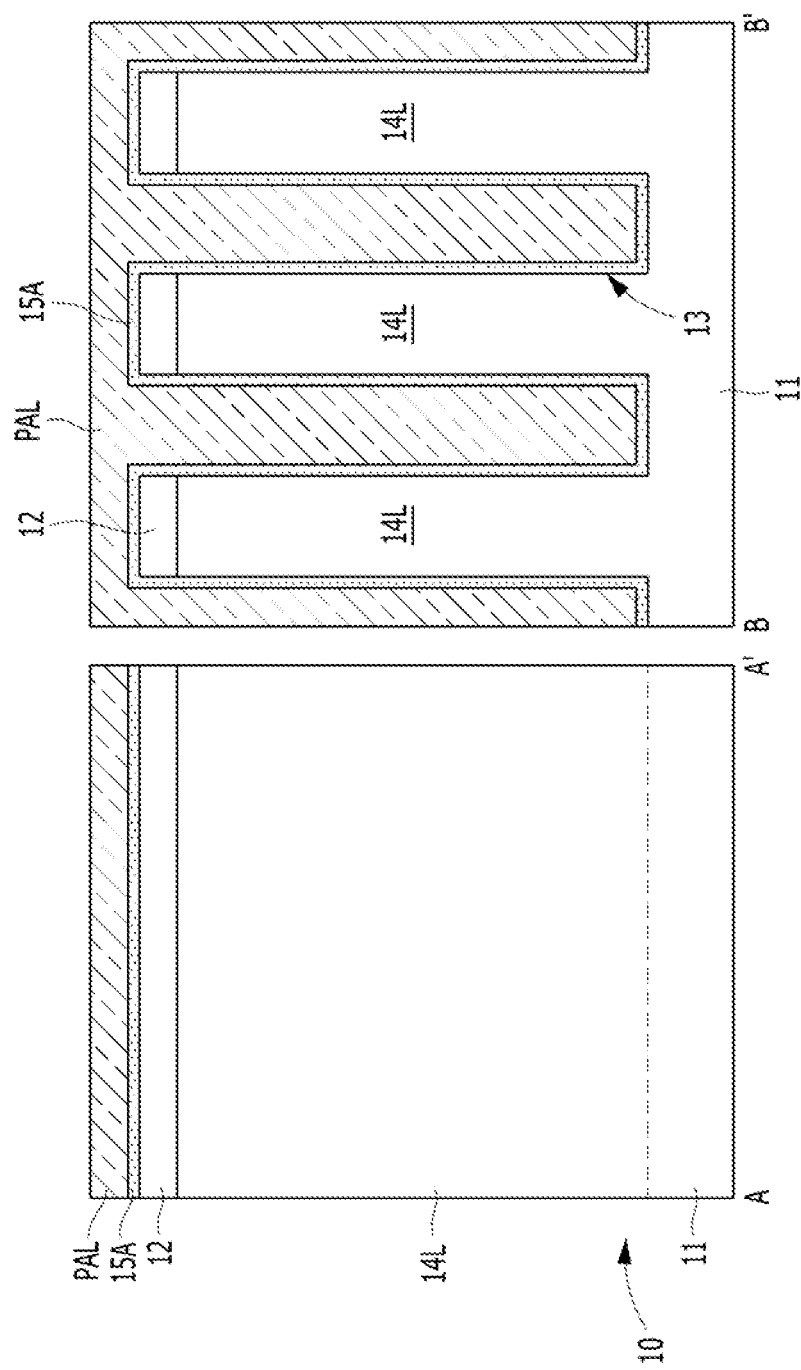

As shown in FIG. 10A, a first liner layer 15A may be formed in a first isolation trench 13. The first liner layer 15A may be formed of silicon oxide. The first liner layer 15A may be formed by a thermal oxidation process or a deposition process. In another embodiment, the first liner layer 15A may be formed in a double layer structure. For example, the first liner layer 15A may be formed as a stack of silicon oxide and silicon nitride.

A pre-air layer (PAL) may be formed on the first liner layer 15A. The pre-air layer (PAL) may include a material which is removed in the subsequent process to form an air gap. The pre-air layer (PAL) may be formed of a material having etch selectivity with respect to the first liner layer 15A. The pre-air layer (PAL) may include a silicon-containing material. The pre-air layer (PAL) may include silicon germanium (SiGe).

As shown in FIG. 10B, a recessed preliminary air layer AL may be formed. The recessed preliminary air layer AL may be formed in the first isolation trench 13 by etching back the pre-air layer (PAL). The recessed preliminary air layer AL may have a recessed surface. The recessed surface of the recessed preliminary air layer AL may be lower than the top surface of a line type active region 14L. As described below, the height of the recessed preliminary air layer AL may overlap with bit lines. Thus, parasitic capacitance between bit lines may be reduced.

A preliminary first isolation dielectric layer 16A may be formed on the recessed preliminary air layer AL. The preliminary first isolation dielectric layer 16A may be formed of a dielectric material. The preliminary first isolation dielectric layer 16A may include one or more of silicon oxide, silicon nitride, and a combination thereof. Chemical vapor deposition (CVD) or other deposition processes may be used to fill the first isolation trench 13 with a dielectric material. The preliminary first isolation dielectric layer 16A may include a spin-on-dielectric (SOD).

Figure 10C:
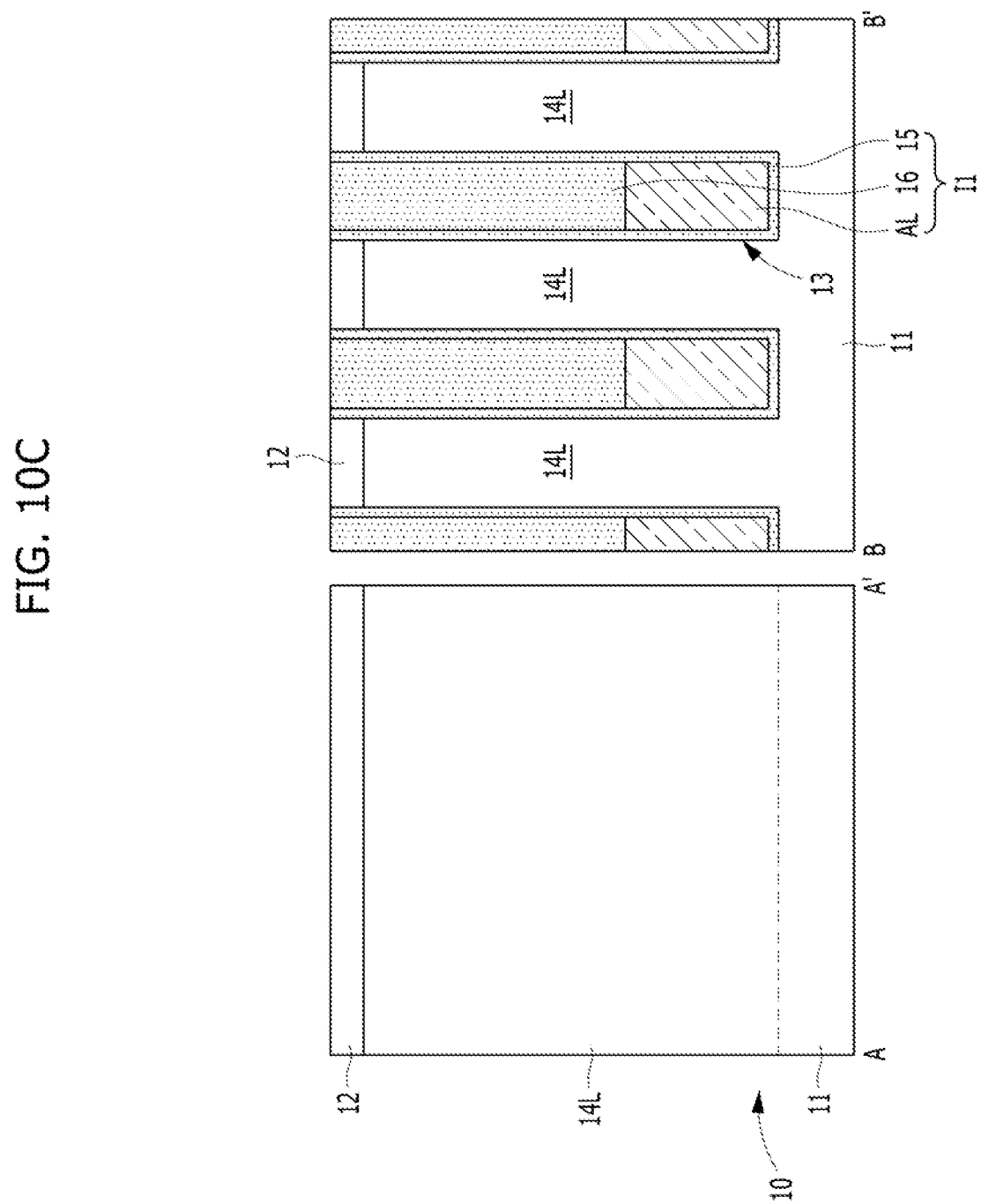

As shown in FIG. 10C, a first isolation dielectric layer 16 may be formed. A planarization process such as chemical mechanical polishing (CMP) may be performed with respect to the preliminary first isolation dielectric layer 16A. Accordingly, the first isolation dielectric layer 16 may be formed to fill the first isolation trench 13. In a planarization process of the preliminary first isolation dielectric layer 16A, a part of the first liner layer 15A may be planarized. For example, the preliminary first isolation dielectric layer 16A and the first liner layer 15A may be planarized until the top surface of a first hard mask layer 12 is exposed. As such, the first isolation dielectric layer 16 and a first liner 15 may remain in the first isolation trench 13.

According to the above processes, a first device isolation region I1 may be formed. The first device isolation region I1 may include the first liner 15, the recessed preliminary air layer AL and the first isolation dielectric layer 16. The first device isolation region I1 may be formed in the first isolation trench 13. The line type active region 14L and the first device isolation region I1 may be alternately formed. The line width of the line type active region 14L may be the same as that of the first device isolation region I1. The line type active region 14L and the first device isolation region I1 may extend in a first direction ①. Contrary to the first embodiment, the first device isolation region I1 in accordance with the second embodiment may further include the recessed preliminary air layer AL.

Figure 10D:
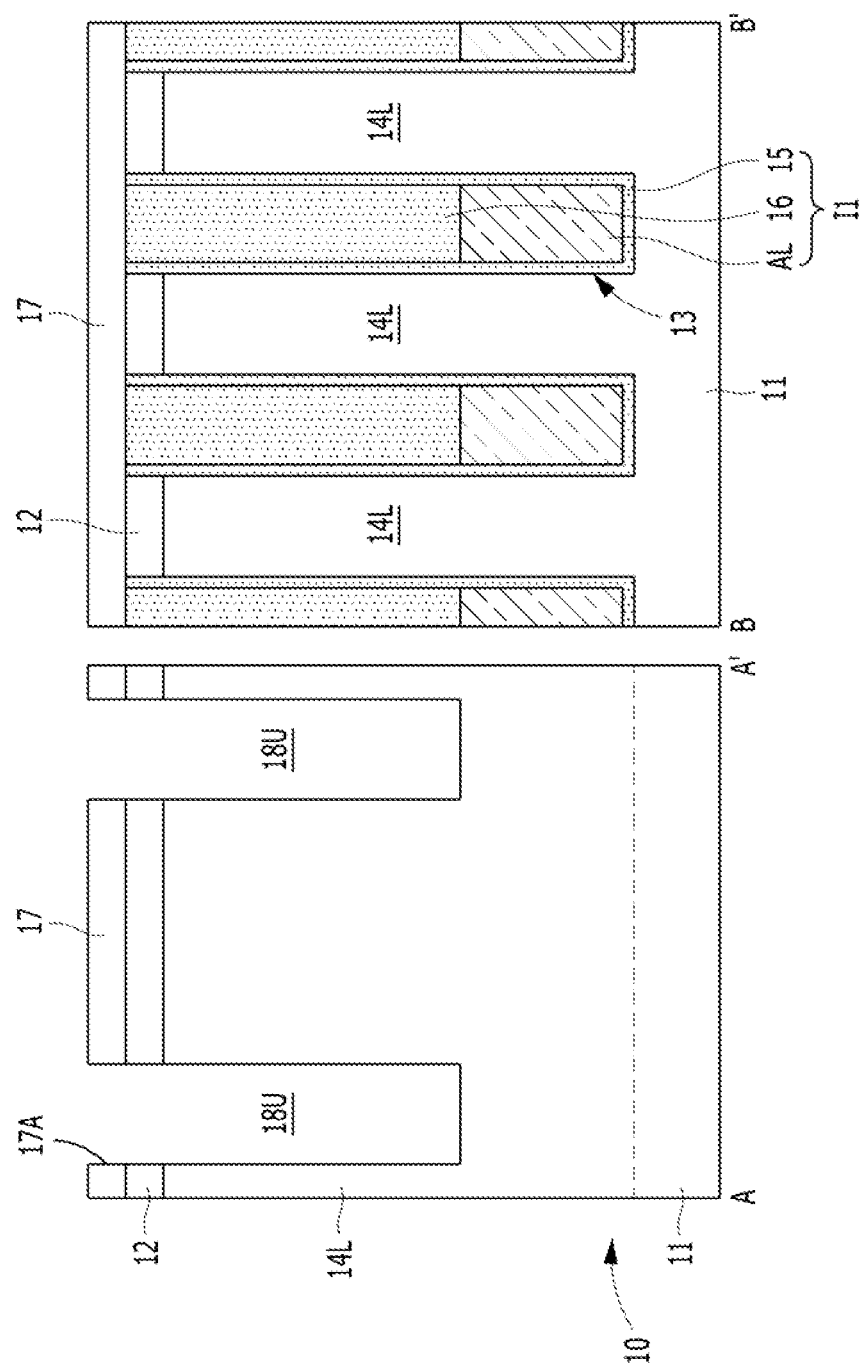

As shown in FIG. 10D, the line type active region 14L may be cut in a uniform length unit. In order to cut the line type active region 14L, a cutting mask 17 may be used. The cutting mask 17 may have a plurality of line type openings 17A. The plurality of line type openings 17A may extend in a second direction ②. The cutting mask 17 may extend in a direction crossing with the line type active region 14L. The cutting mask 17 may include a photosensitive film pattern.

The first hard mask layer 12, the line type active region 14L and the first device isolation region I1 may be etched by using the cutting mask 17 as an etch mask. Thus, the line type active region 14L and the first device isolation region I1 may be cut to form an upper second isolation trench 18U. The upper second isolation trench 18U may extend in the second direction ②.

Figure 10E:
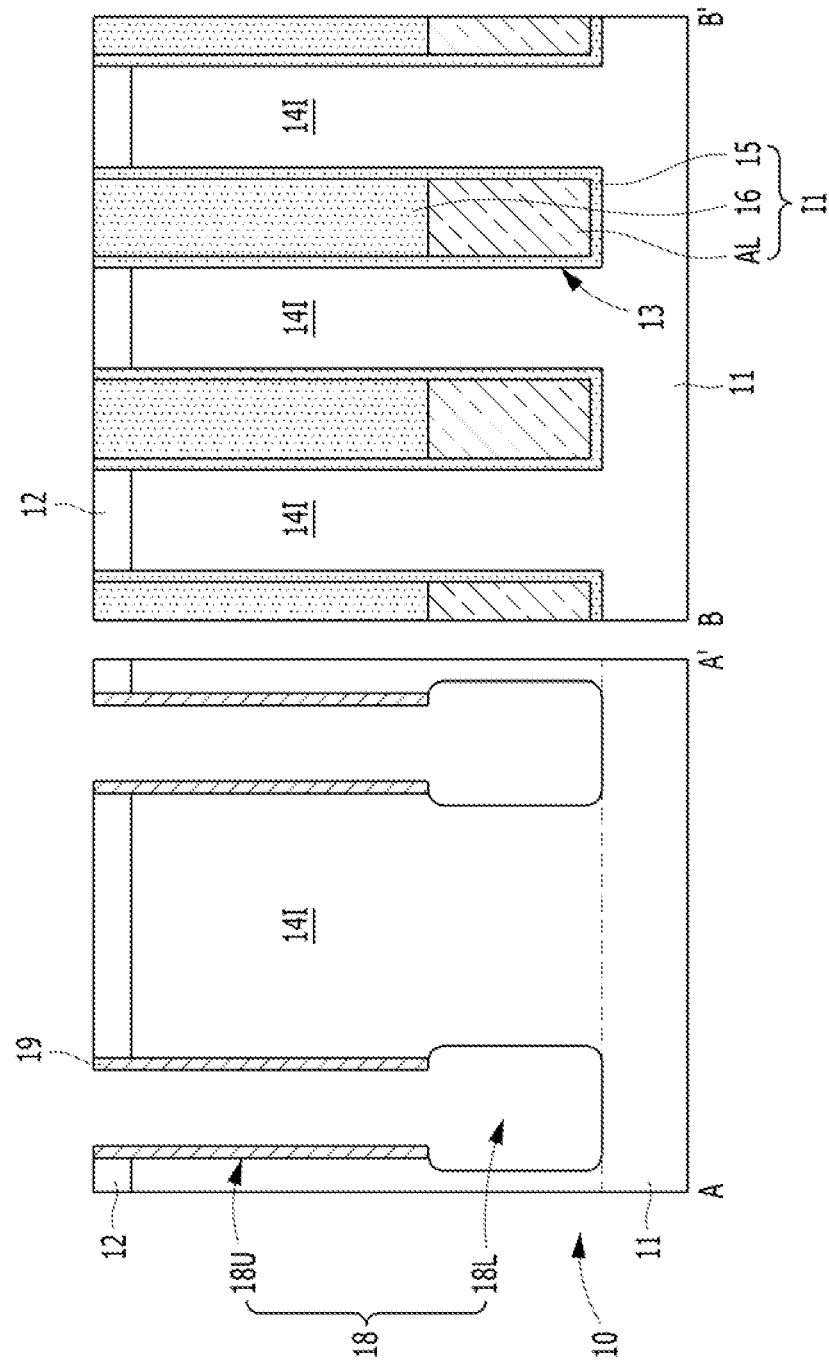

As shown in FIG. 10E, the cutting mask 17 may be removed.

A spacer 19 may be formed on the sidewalls of the upper second isolation trench 18U. In order to form the spacer 19, a dielectric material may be deposited followed by an etch-back process. The spacer 19 may be formed of a material having etch selectivity with respect to the substrate 10. The spacer 19 may include silicon oxide.

The bottom surface of the upper second isolation trench 18U may be extended by using the spacer 19 and the first hard mask layer 12 as etch masks. As such, a lower second isolation trench 18L may be formed. In order to form the lower second isolation trench 18L, an isotropic etch process may be performed. For example, the isotropic etch may be performed in a lateral direction.

The lower second isolation trench 18L may have a bulb shape. The line width of the lower second isolation trench 18L may be larger than that of the upper second isolation trench 18U.

The lower second isolation trench 18L and the upper second isolation trench 18U may compose a second isolation trench 18. A plurality of island type active regions 14I may be formed by the second isolation trench 18.

According to the above processes, the line type active region 14L may be cut to form the independent island type active region 14I. When viewed in the first direction ①, neighboring island type active regions 14I may be uniform in length and spacing, and may be spaced apart by the second isolation trench 18. The island type active region 14I may extend in the first direction and in the second direction. The plurality of island type active regions 14I may be repeatedly formed and spaced apart from each other along the first and second directions. The second isolation trench 18 may be formed between the neighboring island type active regions 14I in the first direction, and the first device isolation region I1 may be positioned between the neighboring island type active regions 14I in the second direction. The second isolation trench 18 may extend in the second direction ②. The lower side surface of the island type active region 14I may have a bulb shape and the upper side surfaces of the island type active region 14I may have be vertical.

Figure 10F:
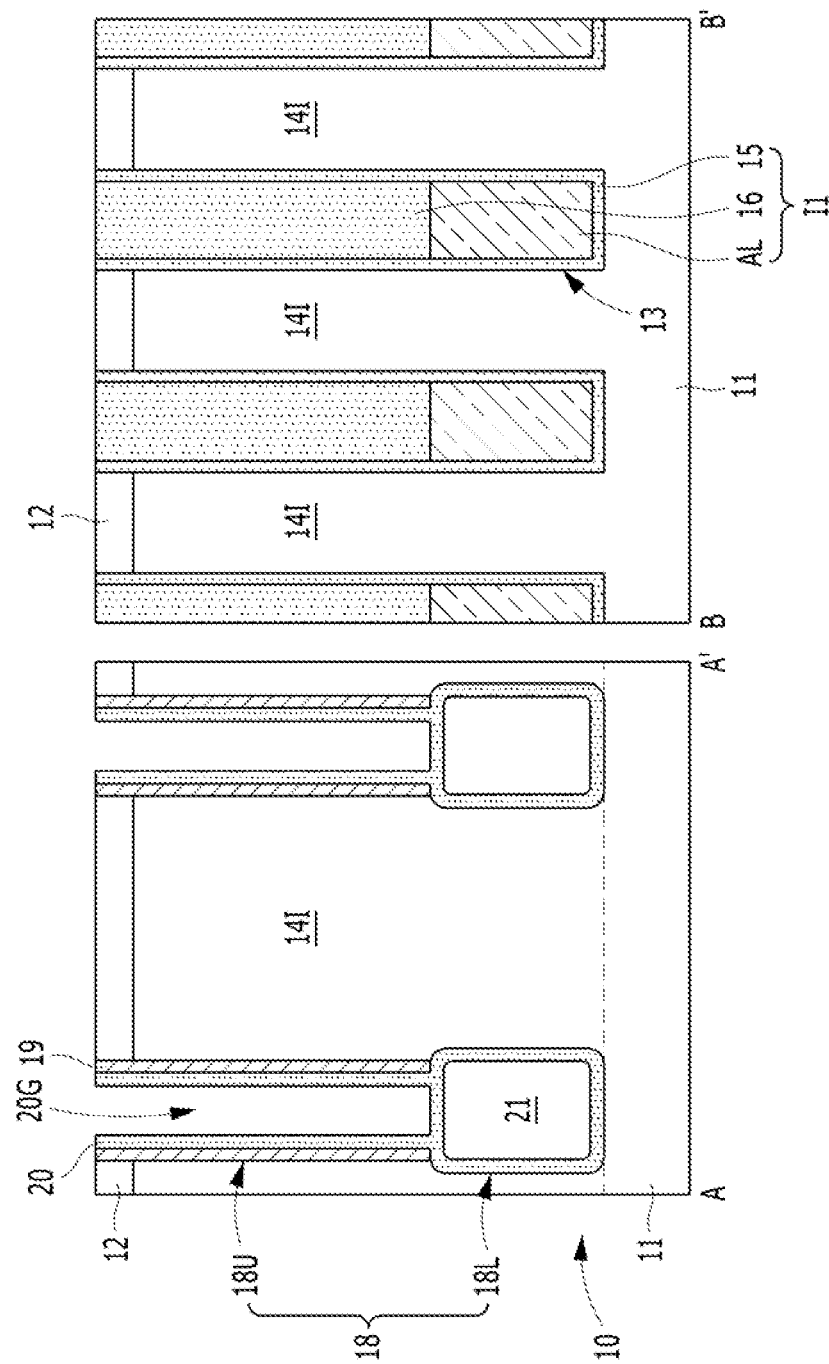

As shown in FIG. 10F, a second liner 20 may be formed. In order to form the second liner 20, a second liner layer 20A may be conformally deposited and then selectively etched (see, FIGS. 4F and 4G). Thus, the second liner 20 may be formed. The second liner 20 may remain in the upper second isolation trench 17 and the lower second isolation trench 19. The second liner 20 may be formed on the surface of the lower second isolation trench 18L and cover the spacer 19. The second liner 20 may be formed of silicon oxide. The upper portion of the lower second isolation trench 18L may be closed by the second liner 20, and thus an air gap 21 may be formed and self-aligned in the lower second isolation trench 18L. Hereinafter, the air gap 21 will be referred to as a first air gap 21. In the upper second isolation trench 18U, a gap 20G may be formed between the second liners 20. In the lower second isolation trench 18L, the first air gap 21 may be formed by the second liner 20.

Figure 10G:
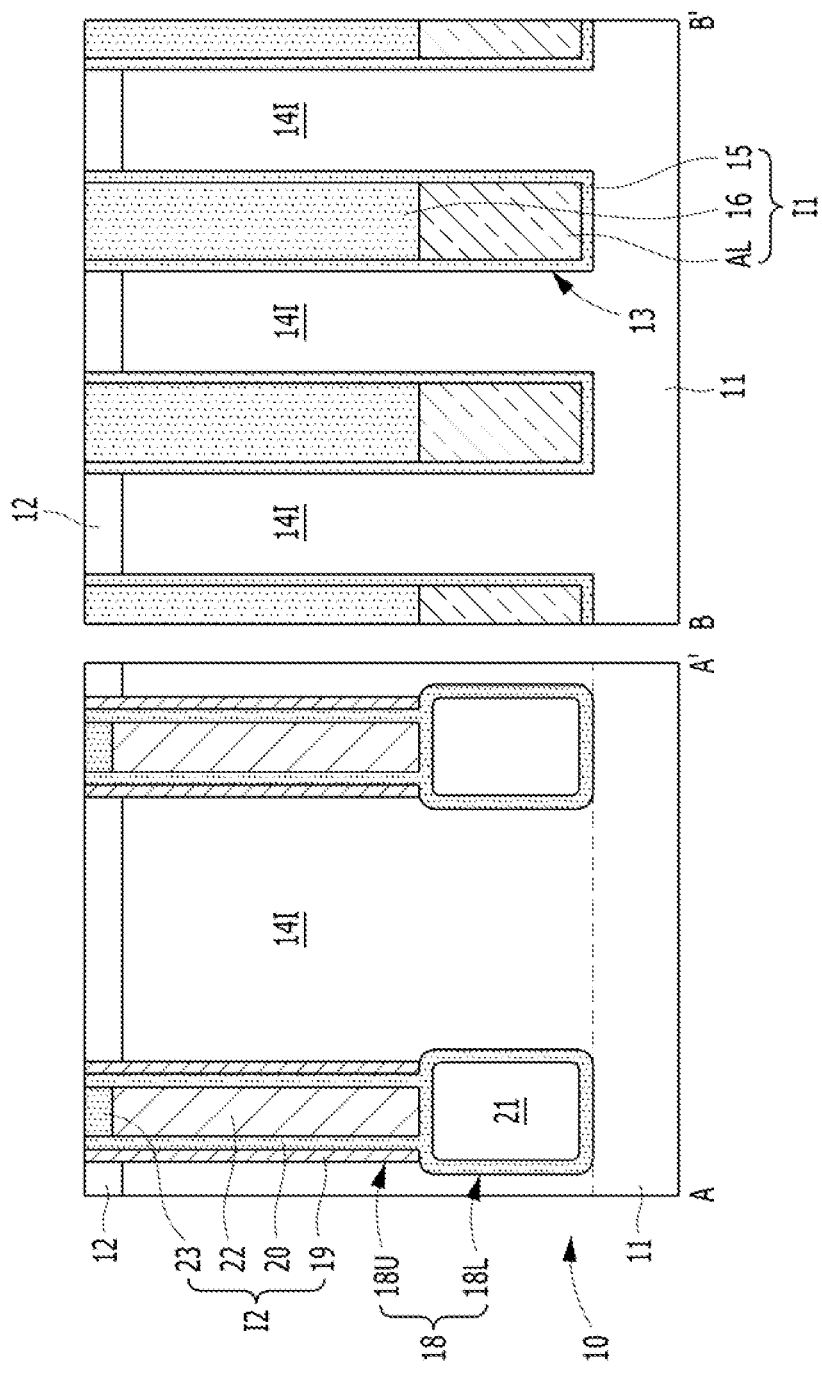

As shown in FIG. 10G, a second isolation dielectric layer 22 may be formed. The second isolation dielectric layer 22 may be formed of a material having etch selectivity with respect to the second liner 20. The second isolation dielectric layer 22 may be formed of silicon nitride. The second isolation dielectric layer 22 may fill the gap 20G. Subsequently, the second isolation dielectric layer 22 may be recessed. Therefore, the second isolation dielectric layer 22 may remain to fill the gap 20G.

Then, a third isolation dielectric layer 23 may be formed. The upper portion of the second isolation dielectric layer 22 may be filled with the third isolation dielectric layer 23. The third isolation dielectric layer 23 may be formed of a material having etch selectivity with respect to the second isolation dielectric layer 22. The third isolation dielectric layer 23 may be formed of oxides. Subsequently, the third isolation dielectric layer 23 may be planarized. The third isolation dielectric layer 23 may be planarized until the surface of the first hard mask layer 12 is exposed.

As above, a second device isolation region I2 may be formed by planarization of the third isolation dielectric layer 23. The second device isolation region I2 may include the spacer 19, the second liner 20 and the second and third isolation dielectric layers 22 and 23. The second device isolation region I2 may formed in the second isolation trench 18. The second isolation trench 18 may include the upper second isolation trench 18U and the lower second isolation trench 18L. The second device isolation region I2 may have the first air gap 21. Since the second liner 20 and the third isolation dielectric layer 23 are formed of silicon oxide, the second isolation dielectric layer 22 may be formed in silicon oxide.

The island type active region 14I may be defined by the first and second device isolation regions I1 and I2. The plurality of island type active regions 14I may be defined by the plurality of first device isolation regions I1 and the plurality of second device isolation regions I2. The plurality of island type active regions 14I may be parallel to each other, that is, parallel active regions.

Since the second device isolation region I2 including the first air gap 21 is positioned between the neighboring island type active regions 14I in the first direction, parasitic capacitance between the neighboring island type active regions ACT in the first direction may be reduced. As described below, the height of the first air gap 21 may overlap with at least bit lines. Therefore, parasitic capacitance between bit lines may be reduced.

FIGS. 11A to 11H are views for illustrating a method for forming a buried bit line of the semiconductor device in accordance with the second embodiment. Except for a first device isolation region having a second air gap, the method may be the same as or similar to the first embodiment. For the sake of convenience, FIGS. 11A to 11H illustrate the method along the line A-A', B-B' and C-C' of FIG. 9.

Figure 11A:
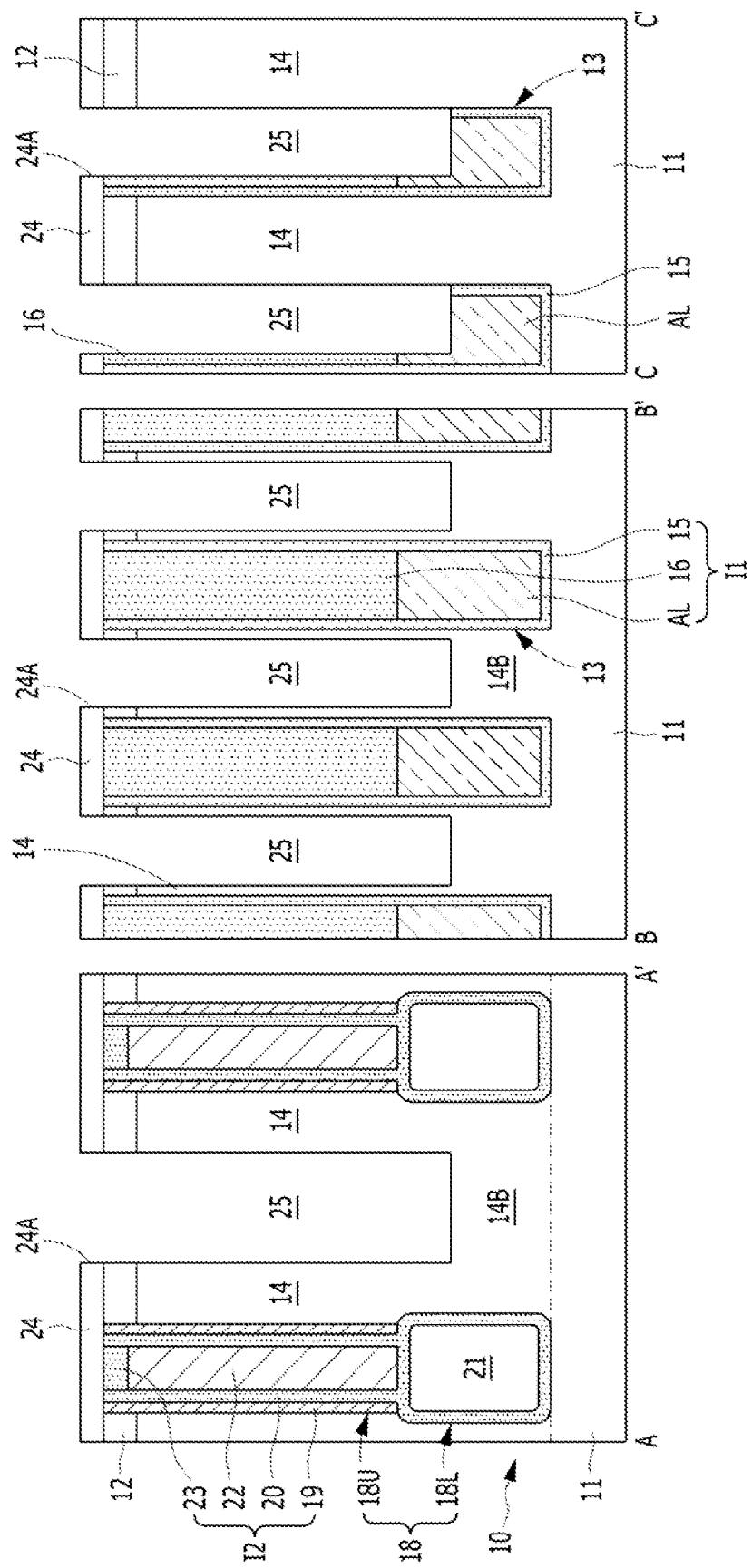
FIGS. 11A to 11H are views illustrating a method for forming a buried bit line of the semiconductor device in accordance with the second embodiment.

As shown in FIG. 11A, a second hard mask layer 24 may be formed. A plurality of line type openings 24A may be formed in the second hard mask layer 24. The second hard mask layer 24 may be formed of a material having etch selectivity with respect to the substrate 10. For example, the second hard mask layer 24 may include silicon nitride.

A bit line trench 25 may be formed. The island type active region 14I may be etched by using the second hard mask layer 24 having the line type opening as an etch mask. Thus, the line type bit line trench 25 may be formed. The bit line trench 25 may be a line type extending in a third direction ③. The bit line trench 25 may extend in a direction crossing with the second isolation trench 18. The bit line trench 25 may be shallower than the first and second isolation trenches 13 and 18. The bit line trench 25 may have a depth sufficient to increase the average cross-sectional area of a subsequent gate electrode. In order to form the bit line trench 25, in addition to the island type active region 14I, the first and second device isolation regions I1 and I2 may also be etched. The bit line trench 25 may have a depth such that a part of a preliminary air layer AL in the first device isolation region I1 is etched. A part of the island type active region 14I may be divided into preliminary pillars 14 by the bit line trench 25. A remaining portion 14B of the island type active region 14I may be formed under the preliminary pillar 14. The remaining portion 14B may be referred to as a body 14B.

Figure 11B:
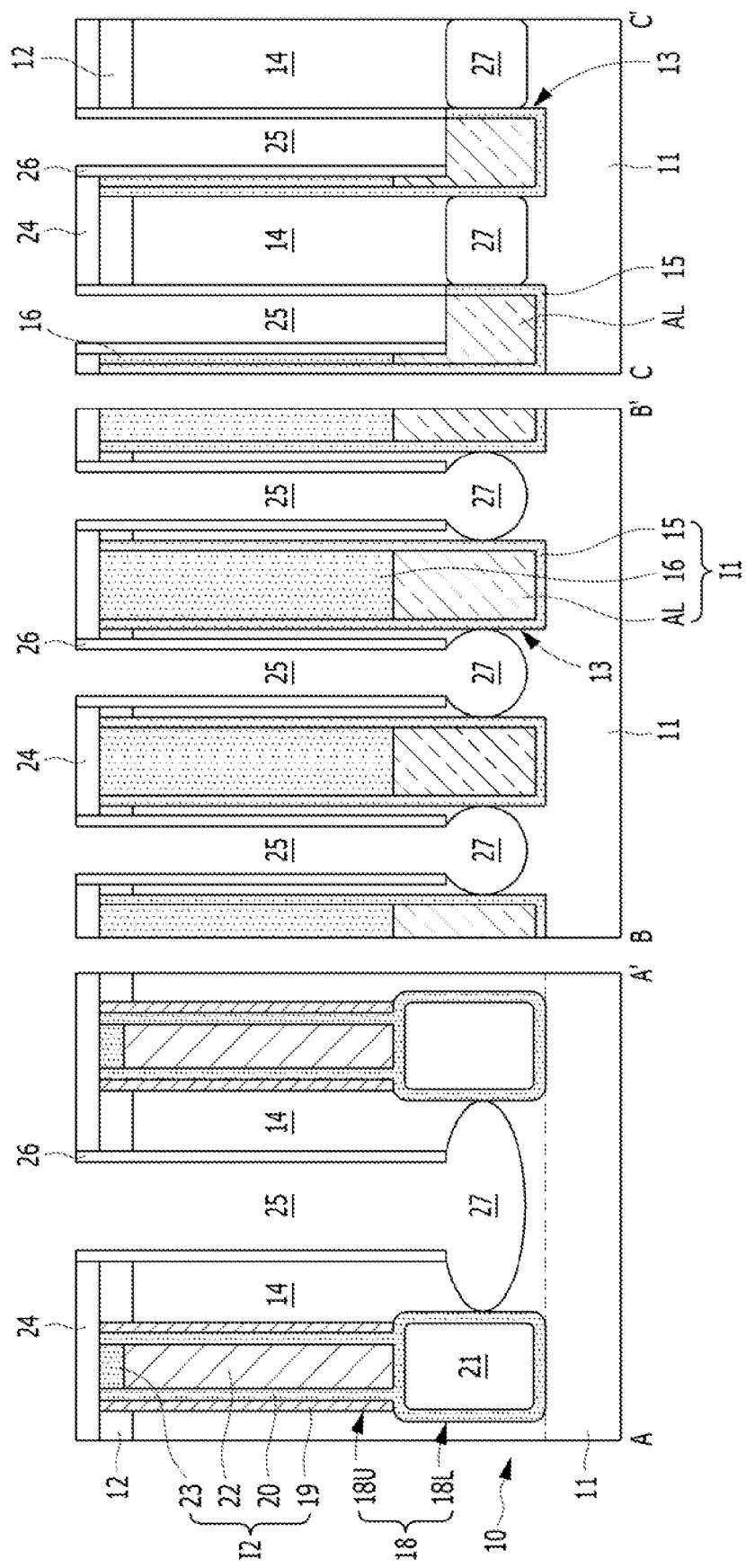

As shown in FIG. 11B, a liner spacer 26 may be formed. The liner spacer 26 may be formed on both sidewalls of the third isolation trench 25. The liner spacer 26 may be formed by depositing silicon oxide followed by an etch-back process.

A body trench 27 may be formed. The body trench 27 may be formed by etching the bottom surface of the bit line trench 25 to a given depth. The bottom surface of the bit line trench 25 may be extended by using the liner spacer 26 as an etch mask. Thus, a part of the body 14B may be etched to form the body trench 27. In order to form the body trench 27, an isotropic etch process may be performed. The body trench 27 may be a bulb type by isotropic etching. The line width of the body trench 27 may be larger than that of the bit line trench 25. The depth of the body trench 27 may be shallower than those of the first and second isolation trenches 13 and 18. The body trench 27 may extend in the first direction under the preliminary pillar 14. For example, the side surface of the body trench 27 may be extended to be adjacent to the sidewalls of the second isolation trench 18. Here, it may be prevented to expose the first air gap 21 by the second liner 20.

Thus, as the bit line trench 25 and the body trench 27 are formed, the island type active region 14I may divided into a pair of preliminary pillars 14. That is, the pair of preliminary pillars 14 may be spaced apart by the bit line trench 25 and the body trench 27.

Figure 11C:
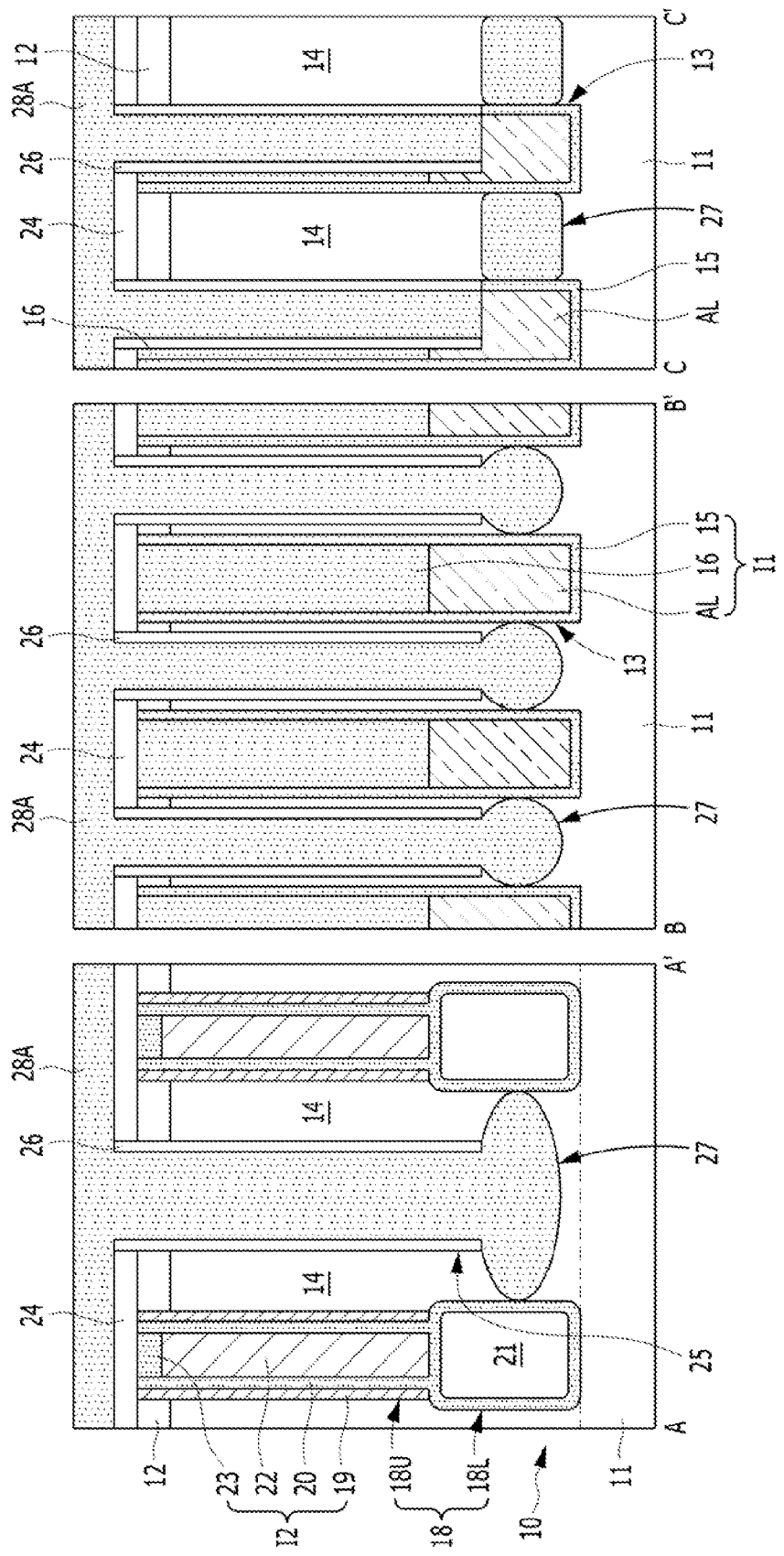

As shown in FIG. 11C, a preliminary anti-punch layer 28 may be formed in the body trench 27. The preliminary anti-punch layer 28A may be formed of a dielectric material. In order to form the preliminary anti-punch layer 28A, the bit line trench 25 and the body trench 27 may be filled with silicon oxide and then recessed to a given depth. The preliminary anti-punch layer 28A may fill at least the body trench 27. The height of the top surface of the preliminary anti-punch layer 28A may be positioned at the bottom of the bit line trench 25. The pair of the preliminary pillars 14 may float from a bulk 11 by the preliminary anti-punch layer 28A. Also, electrical connection between the pair of the preliminary pillars 14 may be suppressed by the preliminary anti-punch layer 28A.

Figure 11D:
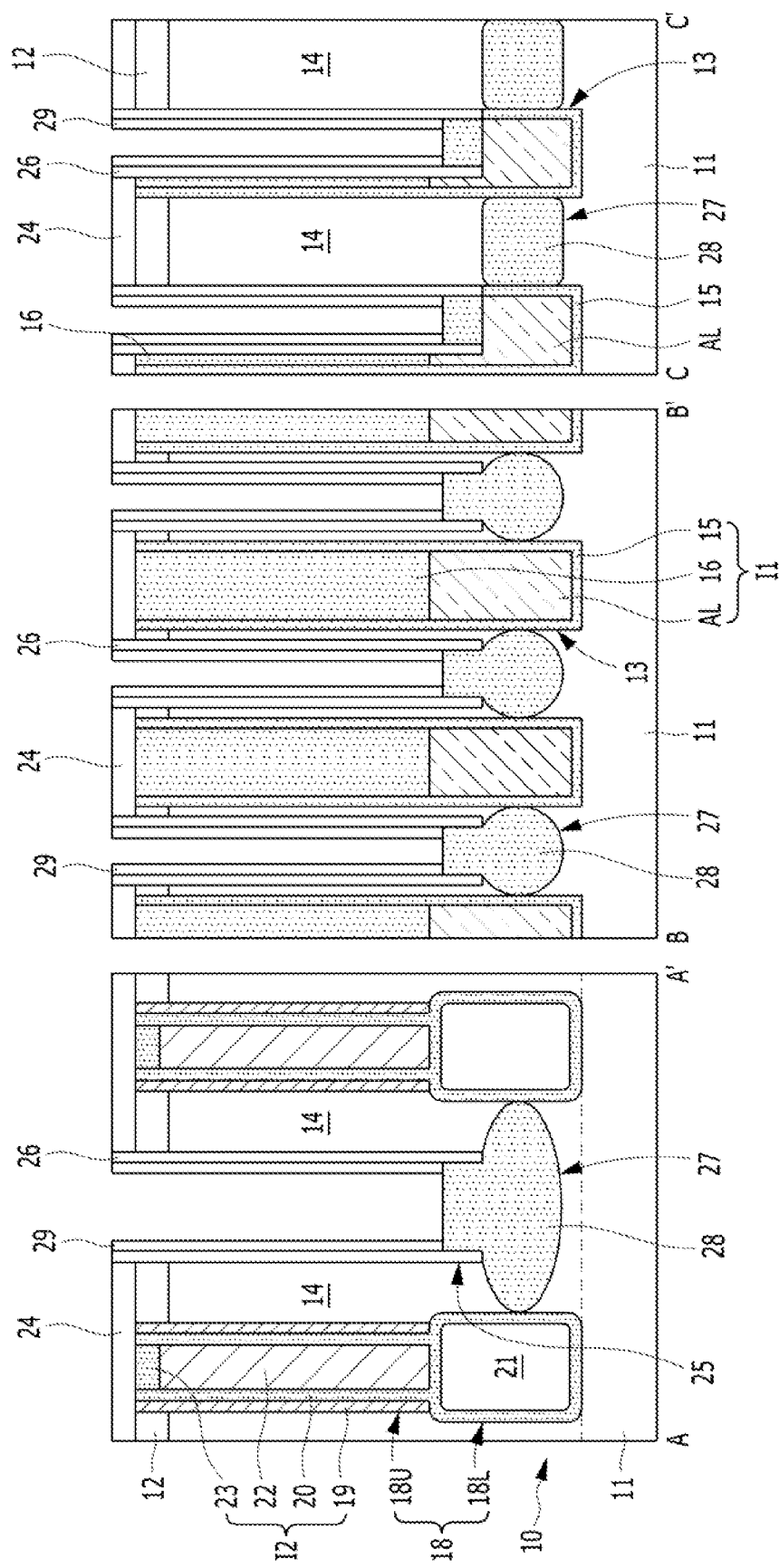

As shown in FIG. 11D, a sacrificial spacer 29 may be formed. The sacrificial spacer 29 may cover the sidewalls of the liner spacer 26. The sacrificial spacer 29 may be formed of titanium nitride. For example, the sacrificial spacer 29 may be formed by conformally depositing titanium nitride followed by an etch-back process.

The preliminary anti-punch layer 28A may be recessed to a given depth. Thus, a punch-through prevention layer 28 may be formed. The punch-through prevention layer 28 may fill the body trench 27.

As the preliminary anti-punch layer 28A is recessed, a part of the liner spacer 26 may be exposed.

Figure 11E:
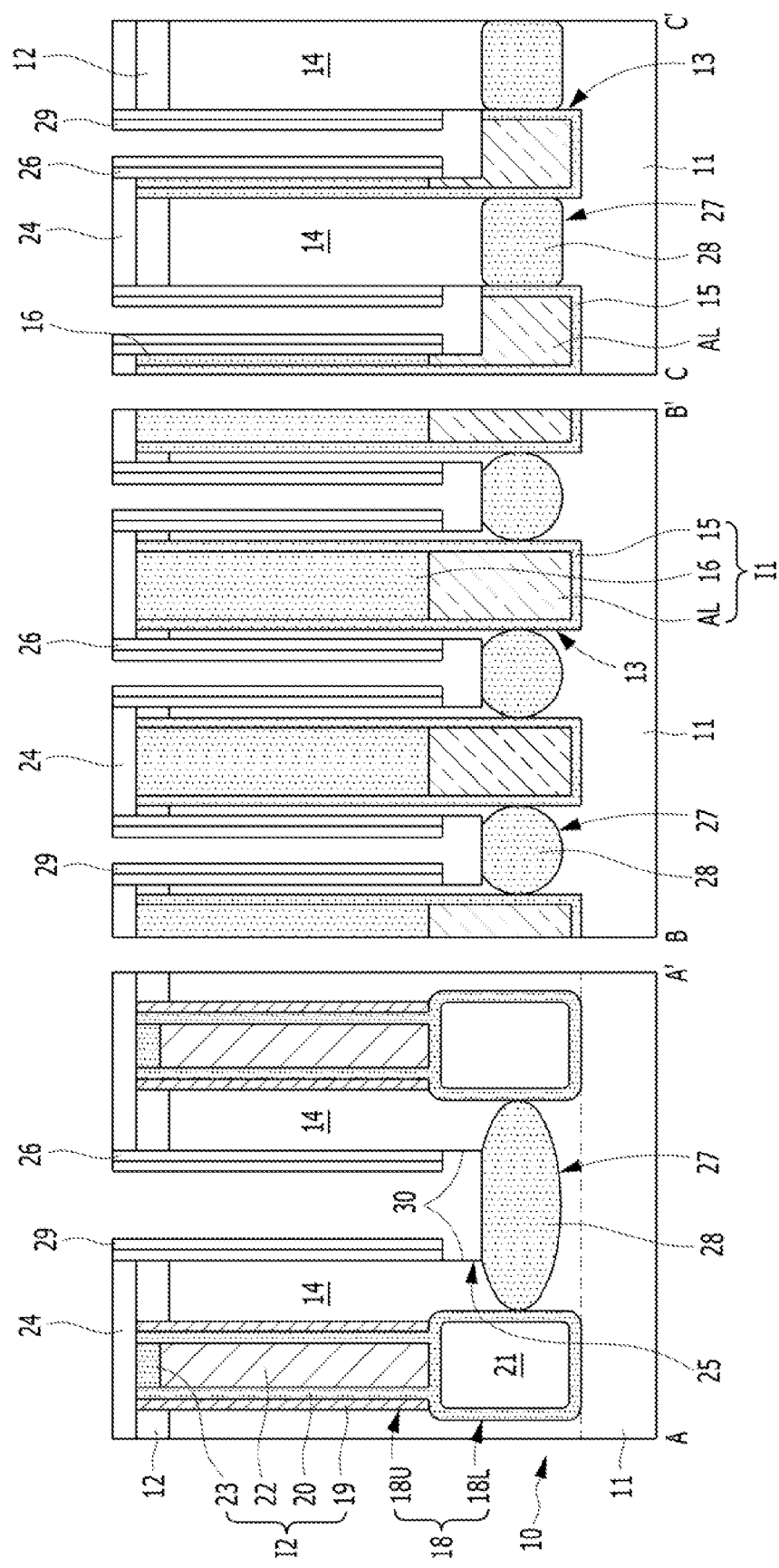

As shown in FIG. 11E, the exposed portion of the liner spacer 26 may be selectively removed. Therefore, an opening 30 exposing bottom sidewalls of the preliminary pillar 14 may be formed. The opening 30 may be a region contacting a subsequent buried bit line and may be both side contact (BSC) exposing the bottom sidewalls of neighboring preliminary pillars 14 simultaneously. For example, both sidewalls of the bit line trench 25 may be simultaneously exposed by the opening 30. The sidewalls of preliminary pillar 14 which are not exposed by the opening 30 may be covered by the liner spacer 26.

Thus, this embodiment does not require additional contact masks for forming the opening 30.

Figure 11F:
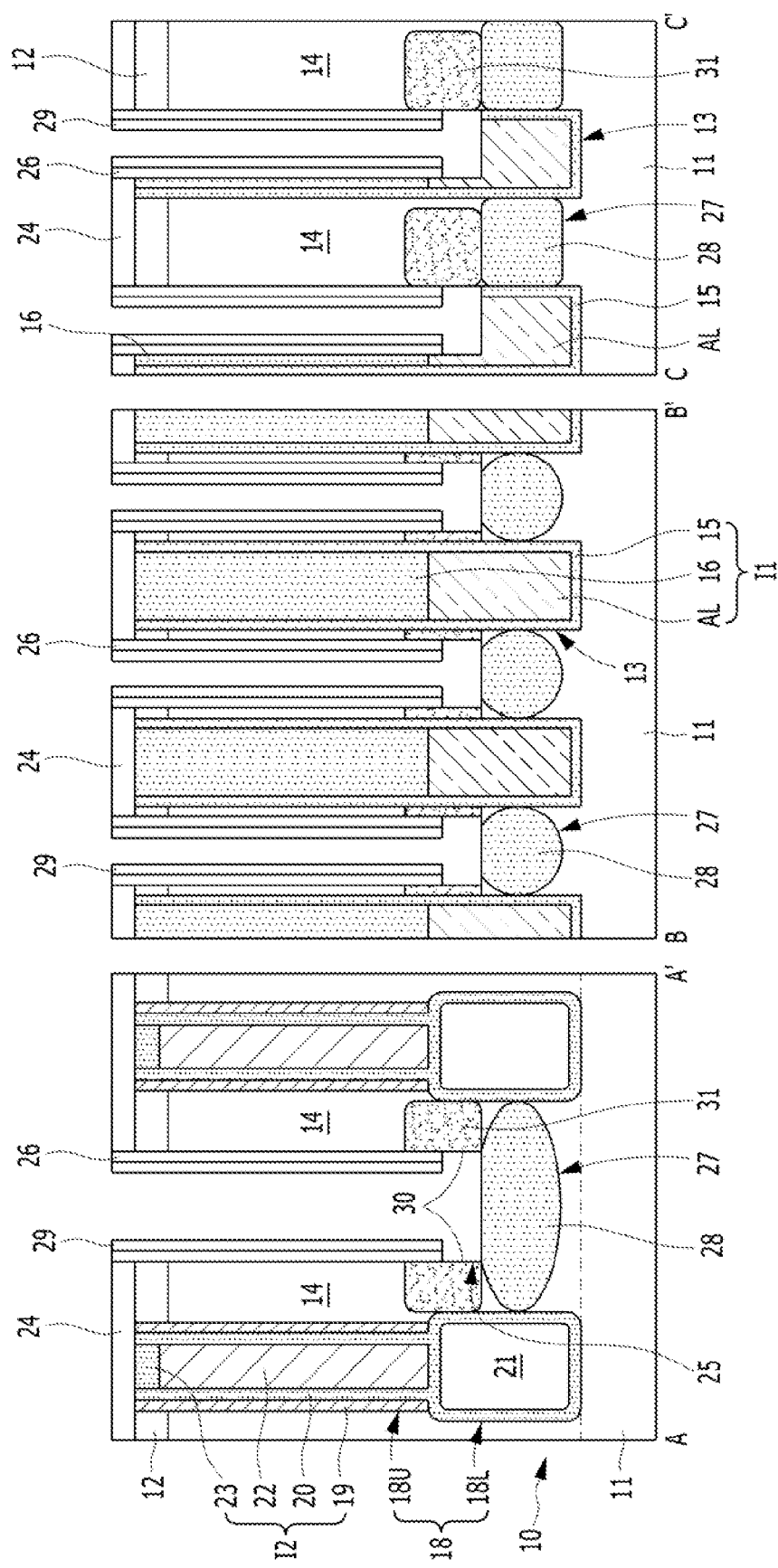

As shown in FIG. 11F, a first junction region 31 may be formed. In order to form the first junction region 31, an impurity doping process may be performed by a plasma doping technology. For example, the first junction region 31 may be formed by plasma doping impurities through the opening 30. In the doping process, the impurities may be N-type impurities and/or P-type impurities. For example, phosphorous (P) and arsenic (As) may be used as the impurity. The first junction region 31 may be formed at the bottom of the preliminary pillar 14. The first junction region 31 may be formed floating from the bulk 11. That is, it may be separated from the bulk 11 by the punch-through prevention layer 28. Also, lateral diffusion of the first junction region 31 may be suppressed by the second device isolation region I2.

Figure 11G:
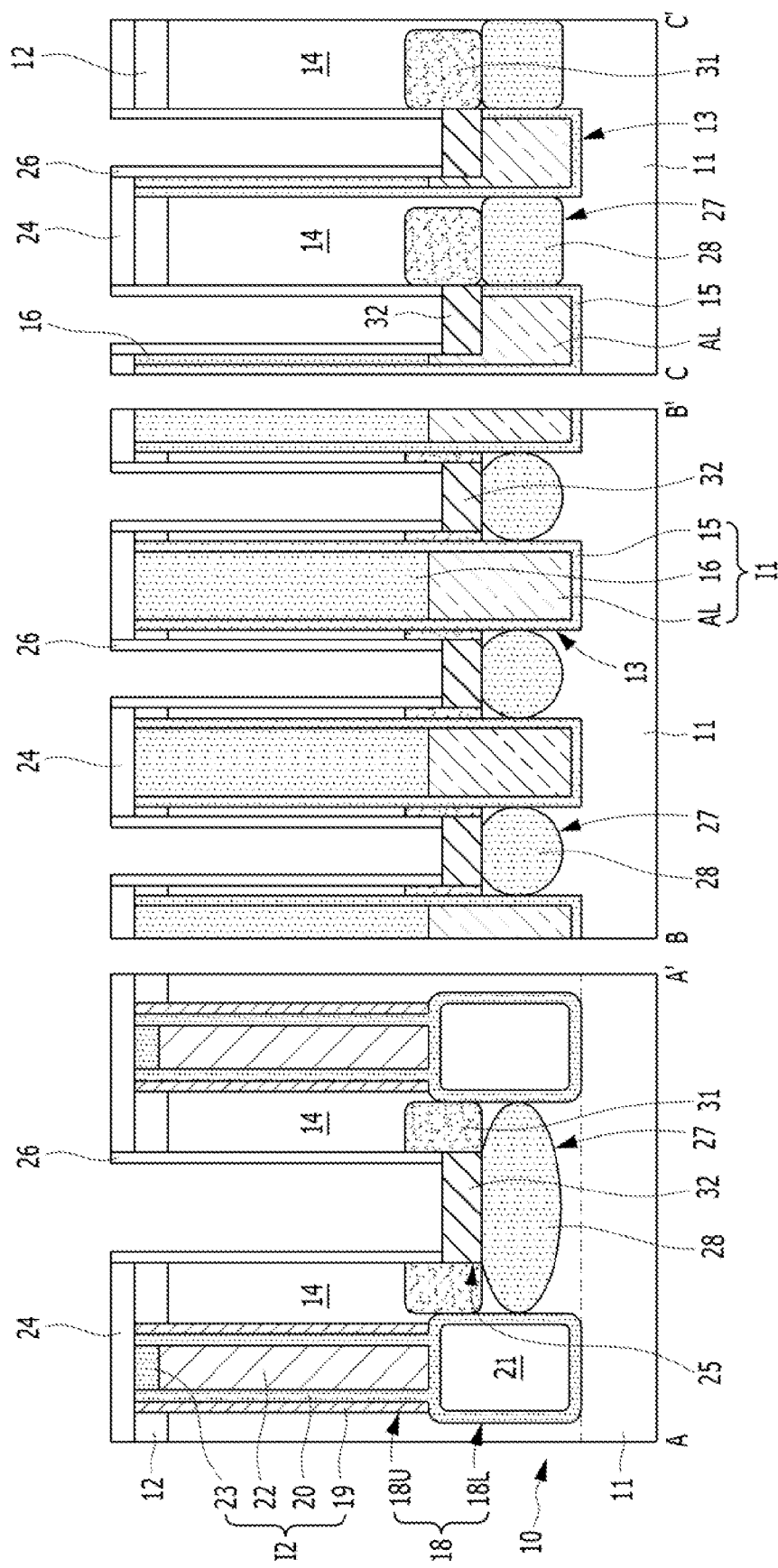

As shown in FIG. 11G, a bit line 32 may be formed. For example, the bit line 32 filling the bottom of the bit line trench 25 may be formed by forming a metal layer (not shown) to bury the bit line trench 25 and etching back the metal layer. The bit line 32 may include tungsten (W). Both ends of the bit line 32 may be electrically coupled to the first junction region 31 by filling the opening 30. The punch-through prevention layer 28 may be positioned between the bit line 32 and the bulk 11.

Although it is not shown, a metal silicide layer for ohmic contact can be formed between the bit line 32 and the first junction region 31. The metal silicide layer may be formed before the bit line 32. The metal silicide layer may include cobalt silicide.

As above, the bit line 32 may contact the first junction region 31 without a plug. In other words, it is a plugless contact.

Figure 11H:
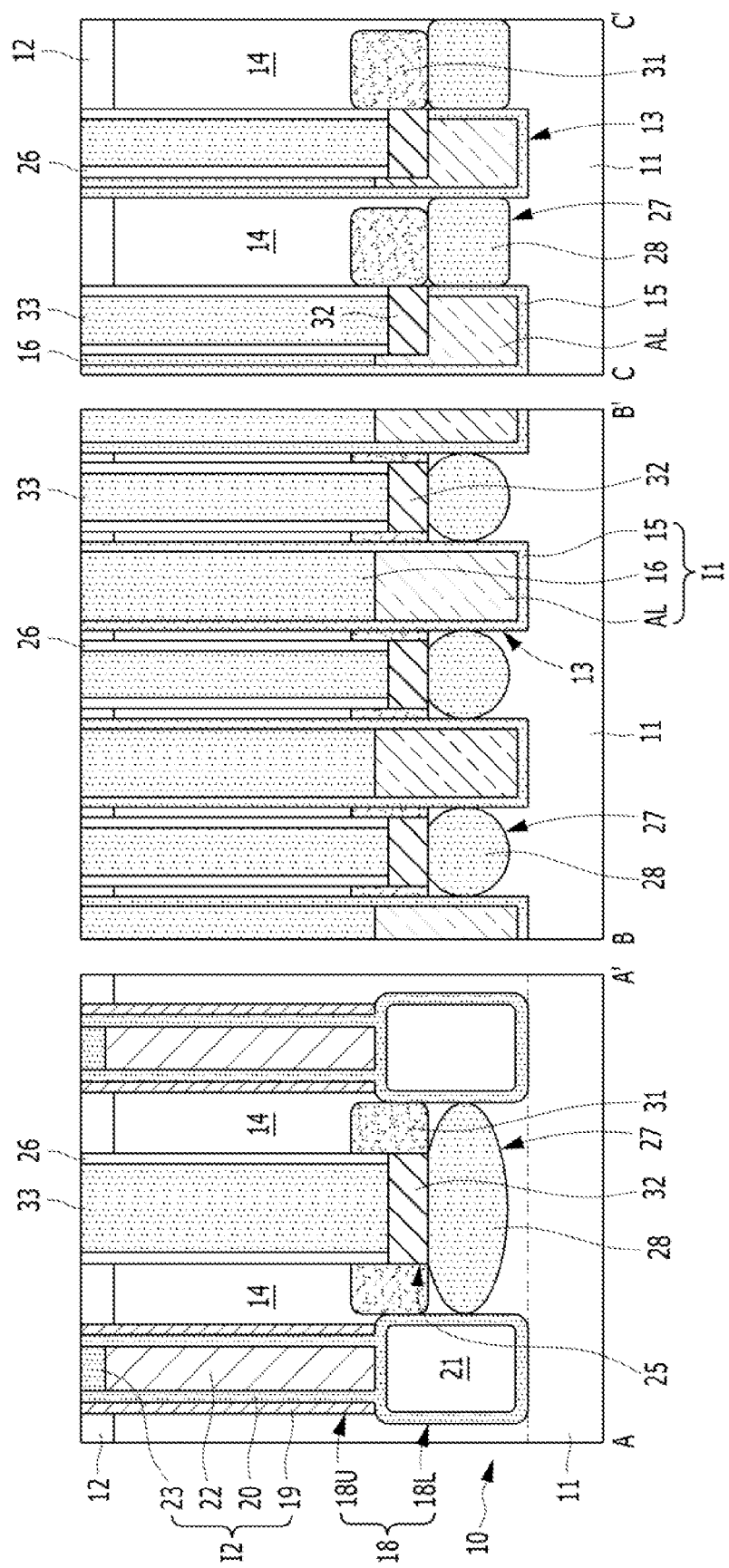

As shown in FIG. 11H, the sacrificial spacer 29 may be selectively removed.

In order to cover the bit line 32, a bit line capping layer 33 may be formed such that the bit line trench 25 is buried. Here, the bit line capping layer 33 may include silicon oxide.

Subsequently, the bit line capping layer 33 may be planarized until the surface of the first hard mask layer 12 is exposed. In this case, the second hard mask layer 24 may be removed.

FIGS. 12A to 12G are views illustrating a method for forming a gate electrode of the semiconductor device in accordance with the second embodiment. Except for a first device isolation region having a second air gap, the method may be the same as or similar to the first embodiment.

Figure 12A:
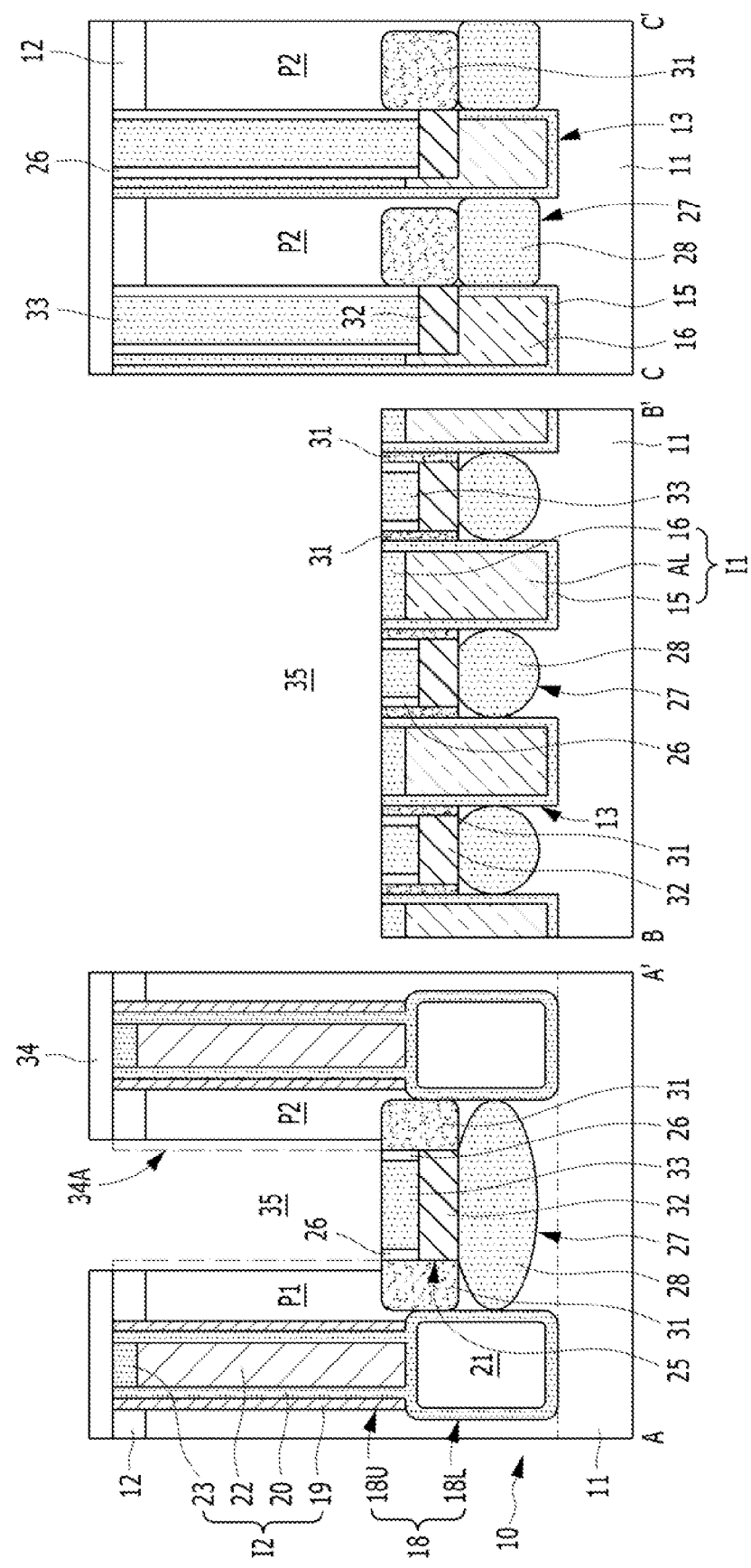
FIGS. 12A to 12G are views illustrating a method for forming a gate electrode of the semiconductor device in accordance with the second embodiment.

As shown in FIG. 12A, a preliminary gate trench 35 may be formed. For example, the preliminary gate trench 35 may be formed by etching the bit line capping layer 33, the first device isolation region I1 and the preliminary pillar 14 by using the third hard mask layer 34 as an etch mask (see, a reference number 34A). The etching process for forming the preliminary gate trench 35 may be performed until the bit line capping layer 33 remains to a given thickness. The preliminary gate trench 35 may be formed in a direction crossing with the bit line 32. The preliminary gate trench 35 may extend in the second direction. The first junction region 31 may be exposed at the bottom of the preliminary gate trench 35.

A pair of first and second pillars P1 and P2 may be formed by the preliminary gate trench 35. The first and second pillars P1 and P2 may be formed by etching the preliminary pillar 14. The first and second pillars P1 and P2 may have a structure with multiple sidewalls, respectively. During the etching process for forming the preliminary gate trench 35, a part of the liner spacer 26 may be etched. Along the line B-B', under the preliminary gate trench 35, the top surfaces of the liner spacer 26, the first device isolation region I1 and the bit line capping layer 33 may be at the same level.

Figure 12B:
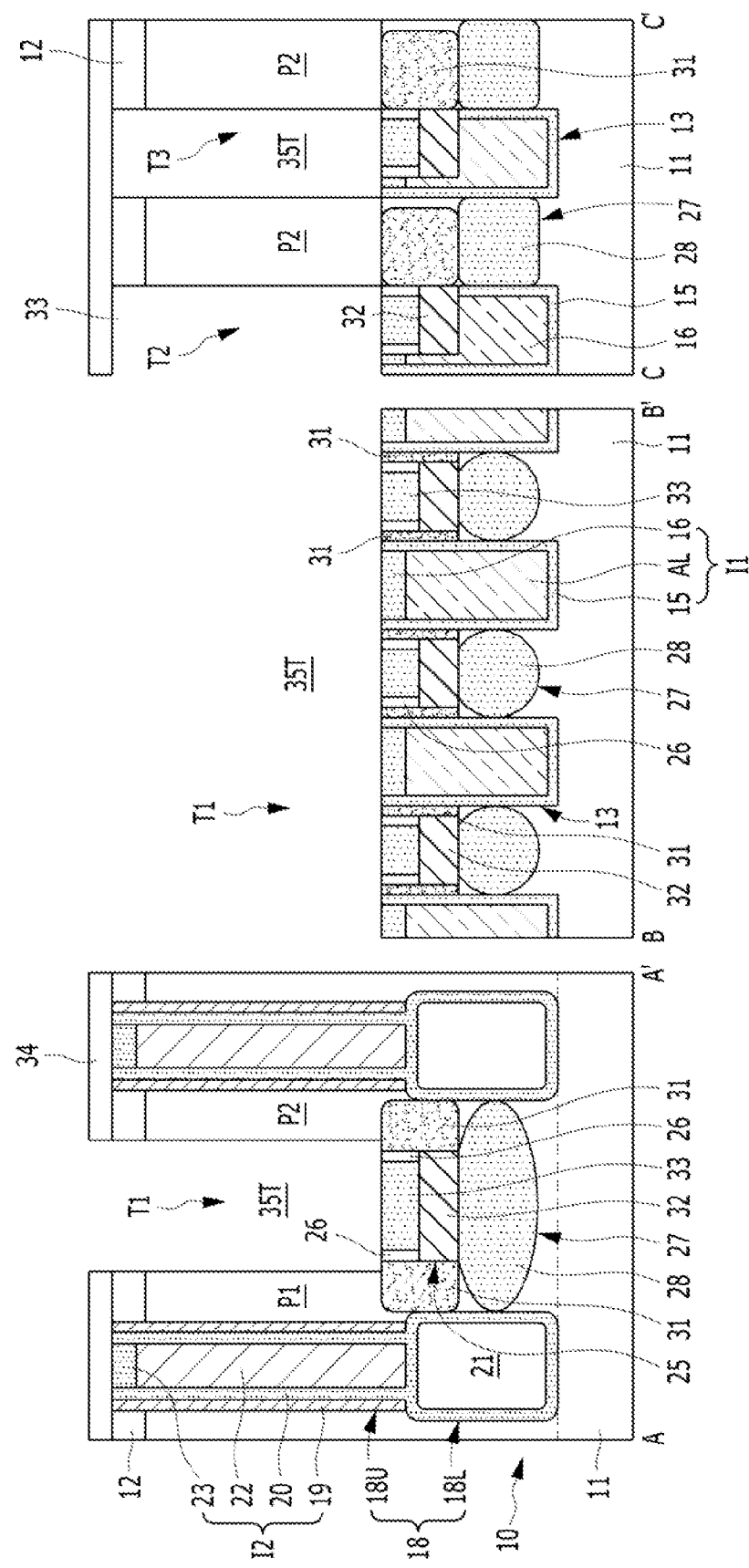

As shown in FIG. 12B, an extending process of the preliminary gate trench 35 may be performed. For example, the bit line capping layer 33 and the first device isolation region I1 may be selectively etched by wet etching. It may be referred to as a widening process. The widening process may use wet etching. A part of the first device isolation region I1 and a part of the bit line capping layer 33 may be etched by the wet etching so that the preliminary gate trench 35 may extend in the first direction. Oxides may be selectively removed by the wet widening. For example, the first liner, the first isolation dielectric layer, the liner spacer and the bit line capping layer may be selectively removed.

A preliminary gate trench extended by the wet etching may form a gate trench 35T. The gate trench 35T may include a first trench T1, a second trench T2 and a third trench T3. The first trench T1 may extend in the second direction. The first trench T1 may be positioned between the first and second pillars P1 and P2. The second and third trenches T2 and T3 may stem from the first trench T1. The second and third trenches T2 and T3 may extend in the first direction crossing with the second direction.

The side surfaces of first and second pillars P1 and P2 may be exposed by the first trench T1, and the second and third trenches T2 and T3. For example, a first side surface S1, a second side surface S2 and a third side surface S3 may be exposed. The first, second and third side surfaces S1, S2 and S3 may be exposed by the first, second and third trench T1, T2 and T3, respectively. The second and third trenches T2 and T3 may have the same size and shape. The first and second pillars P1 and P2 may further include a fourth side surface S4, and the fourth side surface S4 may contact the second device isolation region I2. The second device isolation region I2 may contact the second and third trenches T2 and T3.

After the wet widening process, the bit line capping layer 33 may remain to a given thickness on the bit line 32.

Figure 12C:
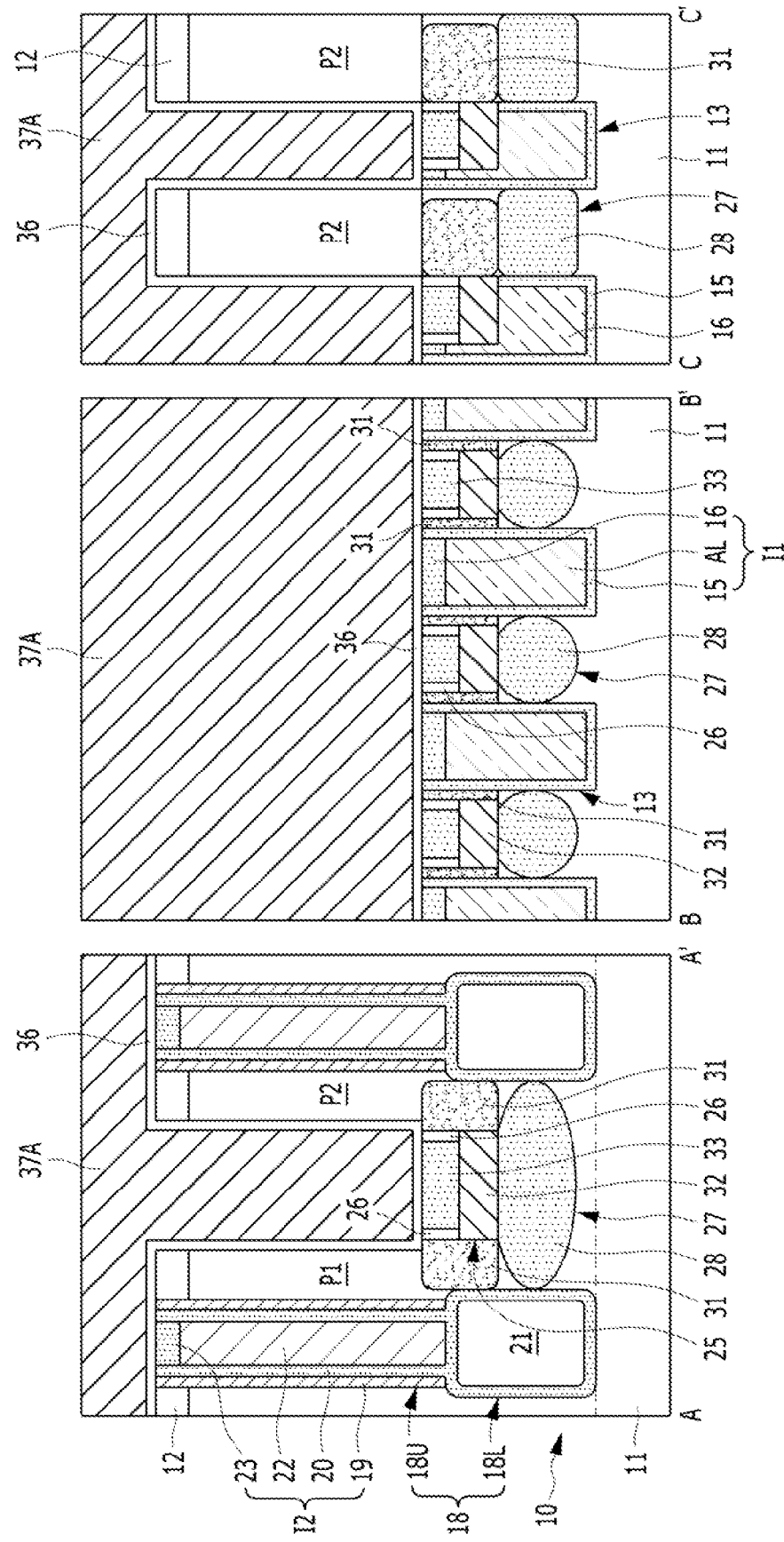

As shown in FIG. 12C, a gate dielectric layer 36 may be formed on the surface of the gate trench 35T.

The gate dielectric layer 36 may be formed by a thermal oxidation process. In another embodiment, the gate dielectric layer 36 may be formed by chemical vapor deposition (CVD) or atomic layer deposition (ALD). The gate dielectric layer 36 may include one or more of a high-k material, oxide, nitride, oxynitride, and a combination thereof. The high-k material may include a hafnium-containing material. The hafnium-containing material may include one or more of hafnium oxide, hafnium silicon oxide, hafnium silicon oxynitride, and a combination thereof. In another embodiment, the high-k material may include one or more of lanthanum oxide, lanthanum aluminum oxide, zirconium oxide, zirconium silicon oxide, zirconium silicon oxynitride, aluminum oxide, and a combination thereof. In another embodiment, other high-k materials known in the art may be used.

A gate conductive layer 37A may be formed on the gate dielectric layer 36. The gate conductive layer 37A may fill the gate trench 35T. The gate conductive layer 37A may include a low resistivity metal material. The gate conductive layer 37A may be formed of titanium nitride, tungsten, and so on.

Figure 12D:
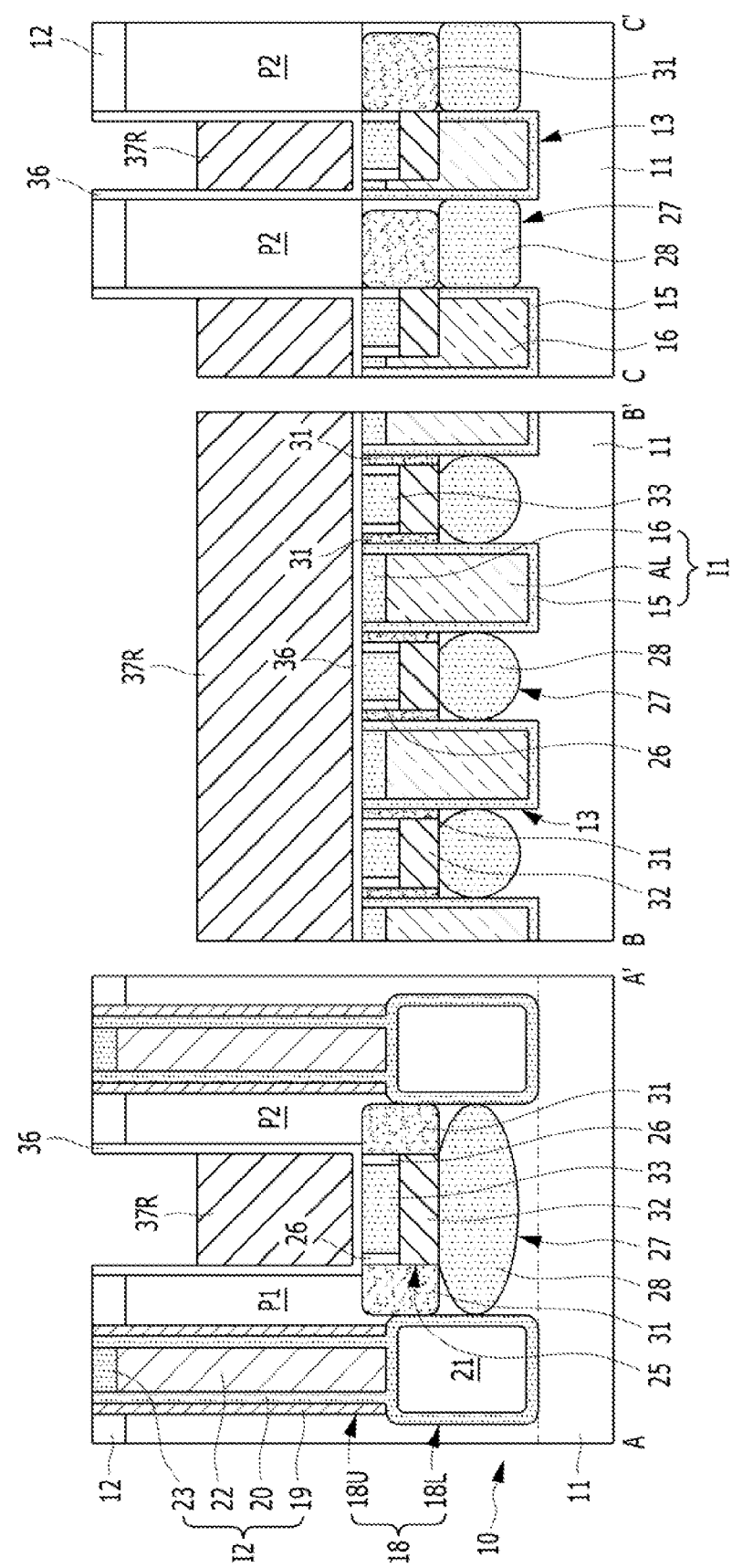

As shown in FIG. 12D, a recessing process may be performed such that a preliminary gate electrode 37R remains in the gate trench 35T. The recessing process may be performed by dry etching, for example, an etch-back process. The preliminary gate electrode 37R may be formed by etching back the gate conductive layer 37A. In another embodiment, the recessing process may be performed by a planarization process followed by an etch-back process.

The preliminary gate electrode 37R may be recessed to be lower than the top surfaces of the first and second pillars P1 and P2.

Figure 12E:
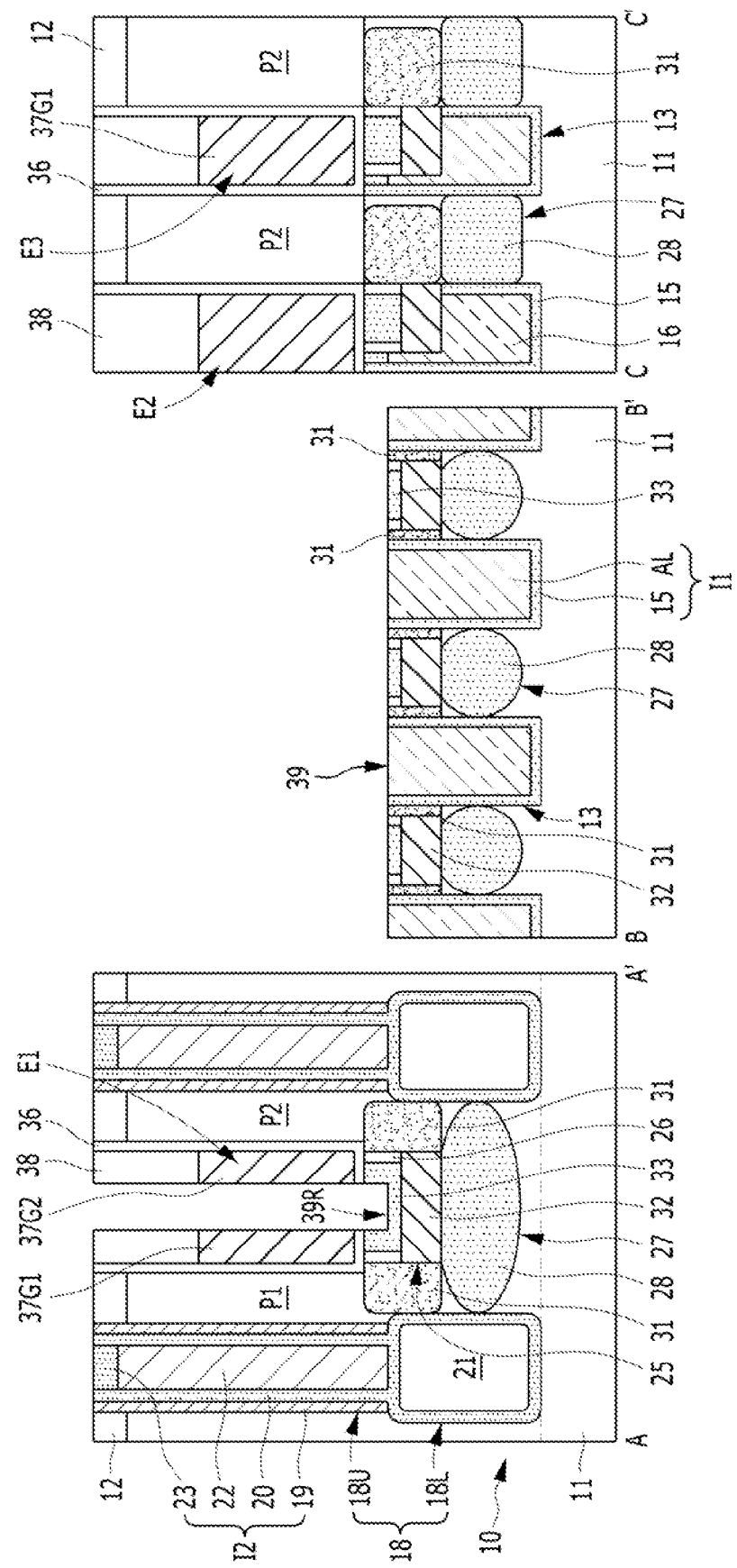

As shown in FIG. 12E, a gate separation mask 38 may be formed. The gate separation mask 38 may cover the side surfaces of the gate trench 35T on the preliminary gate electrode 37R. For example, the gate separation mask 38 may be formed by forming a mask material on the entire surface including the preliminary gate electrode 37R followed by an etch-back process. The gate separation mask 38 may be formed of a material having etch selectivity with respect to the preliminary gate electrode 37R.

A pair of the first and second gate electrodes 37G1 and 37G2 may be formed by etching the center portion of the preliminary gate electrode 37R by using the gate separation mask 38 as an etch mask. When etching the center portion of the preliminary gate electrode 37R, the etch depth may be controlled such that the first and second gate electrodes 37G1 and 37G2 are sufficiently spaced from each other.

Thus, the first and second gate electrodes 37G1 and 37G2 may be formed by separating the preliminary gate electrode 37R. The first and second gate electrodes 37G1 and 37G2 may be formed in the gate trench 35T.

As described above, the first and second gate electrodes 37G1 and 37G2 may be symmetrical. The first and second gate electrodes 37G1 and 37G2 may include a first electrode E1 extending in the second direction, and a second electrode E2 and a third electrode E3 extending in the first direction crossing with the second direction and stemming from the first electrode E1, respectively. The first, second and third electrodes E1, E2 and E3 may be formed in the first, second and third trenches T1, T2 and T3, respectively.

The first to third electrodes E1 to E3 may overlap with three or more side surfaces of the first and second pillars P1 and P2. A fourth side surface S4 may not overlap with the first and second gate electrodes 37G1 and 37G2.

In the etch process for forming the first and second gate electrodes 37G1 and 37G2, a preliminary air layer AL may be exposed without attacking the bit line 32 (see, a reference number 39).

Figure 12F:
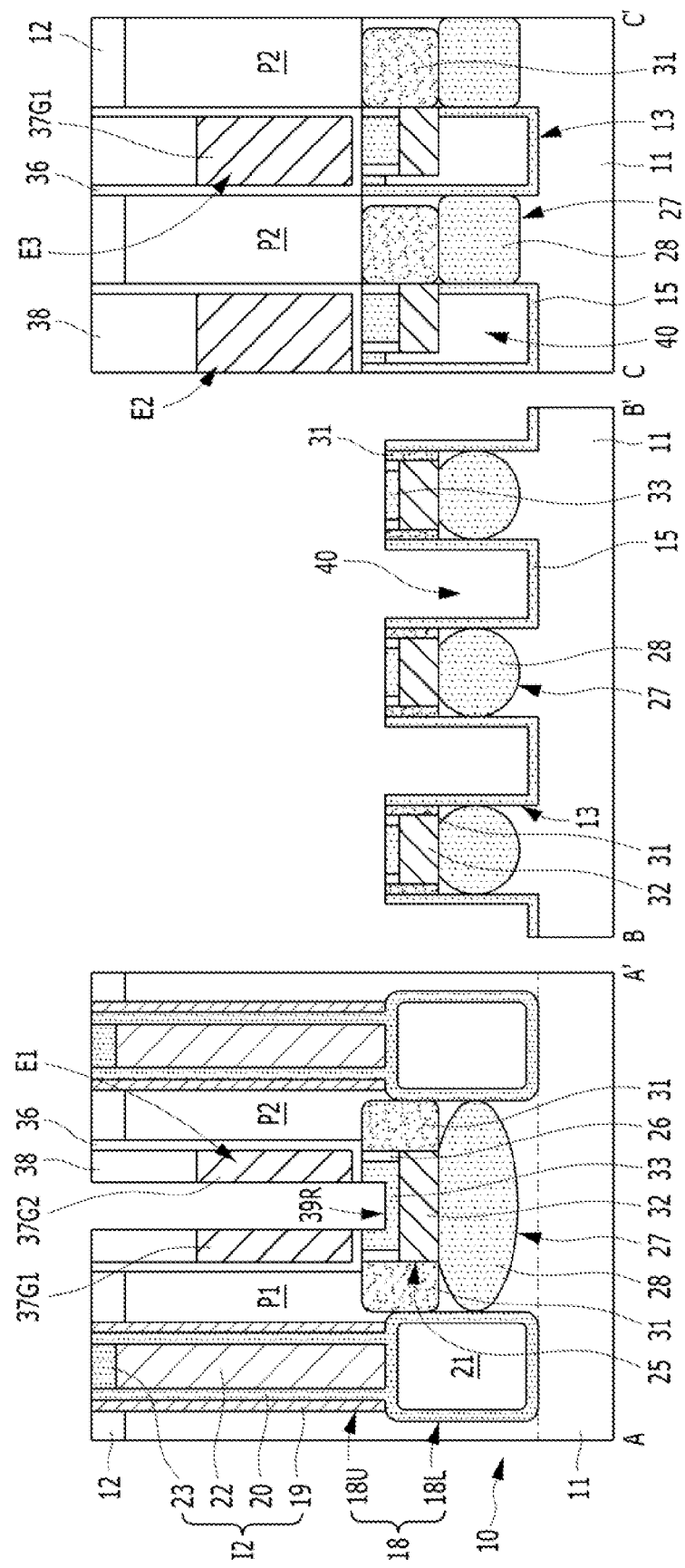

As shown in FIG. 12F, the preliminary air layer AL of the first device isolation region I1 may be selectively removed. Thus, a second air gap 40 may be formed. When forming the second air gap 40, the first liner 15 is not removed.

Figure 12G:
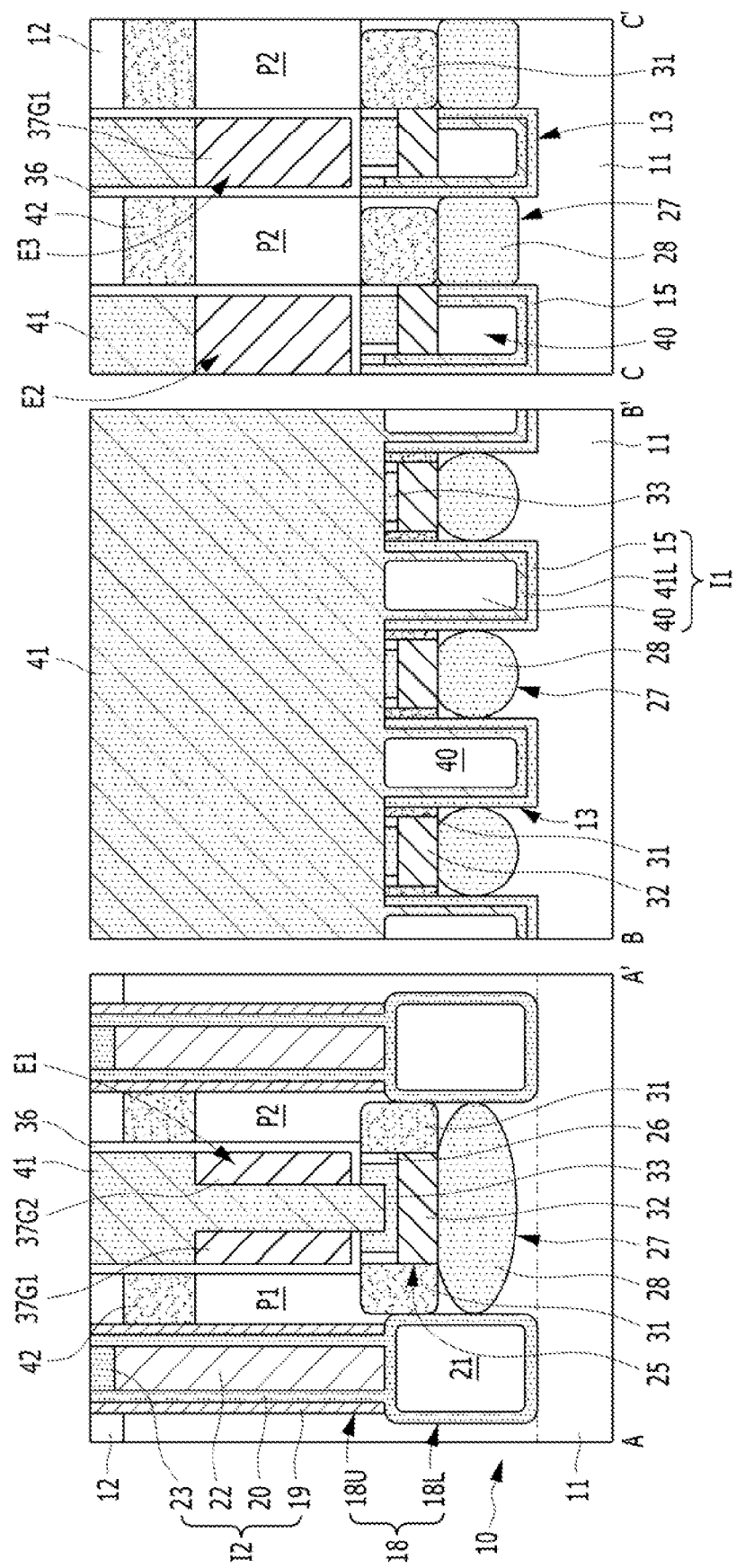

As shown in FIG. 12G, the gate separation mask 38 may be removed.

Then, a gate capping layer 41 may be formed. The gate capping layer 41 may include a dielectric material. The gate capping layer 41 may be filled between the first and second gate electrodes 37G1 and 37G2. The gate capping layer 41 may include silicon nitride. Subsequently, the gate capping layer 41 may be planarized such that the top surface of the first hard mask layer 12 is exposed.

During forming the gate capping layer 41, the upper portion of the second air gap 40 may be capped. That is, the upper portion of the second air gap 40 may be closed by the gate capping layer 41. For example, when initially forming the gate capping layer 41, the gate capping layer 41 may be thinly formed on the surface of the first liner 15. This may be the gate capping liner 41L. During continuously forming the gate capping layer 41, the second air gap 40 may be closed.

After forming the gate capping layer 41, an impurity doping process may be performed by implantation or other doping processes. As such, a second junction region 42 may be formed in the first and second pillars P1 and P2. When performing the impurity doping process, the gate capping layer 41 may be used as a barrier. The second junction region 42 may be either a source region or a drain region. The vertical channel VC may be defined between the first and second junction regions 31 and 42. The first and second gate electrodes 37G1 and 37G2 may overlap with the vertical channel VC. The second junction region 42 may be formed after the top surfaces of the first and second pillars P1 and P2 are exposed by etching the first hard mask layer 12.

As described above, the first gate electrode 37G1, and the first and second junction regions 31 and 42 may compose a first transistor Tr1. The second gate electrode 37G2, the first and second junction regions 31 and 42 may compose a second transistor Tr2.

Although it is not shown, a memory element 43 may be electrically coupled to the second junction region 42.

In another embodiment, the second junction region 42 may be formed by an impurity doping process after forming a contact hole. Here, the contact hole may expose the top surfaces of the first and second pillars P1 and P2.

A second junction region 42 and a first junction region 31 may formed in the first and second pillars P1 and P2. The first junction region 31 may be positioned in the lower portions of the first and second pillars P1 and P2, and the second junction region 42 may be positioned in the upper portions of the first and second pillars P1 and P2. The first junction region 31 may be electrically coupled to the buried bit line 32. The first junction region 31 may be positioned at a level lower than that of the second junction region 42. A vertical channel VC may be formed between the first and second junction regions 31 and 42. The first and second junction regions 31 and 42 may doped with a conductive type impurity. For example, the conductive type impurity may include phosphorus (P), arsenic (As), antimony (Sb) or boron (B). The first and second junction regions 31 and 42 may be doped with the same conductive type impurity. The first and second junction regions 31 and 42 may correspond to a source region and a drain region, respectively.

As above, the second air gap 40 may formed in the first device isolation region I1.

As a result, the second air gap 40 may be positioned between the neighboring island type active regions 14I in the second direction. Thus, parasitic capacitance between the neighboring island type active regions 14I in the second direction may be reduced.

According to the second embodiment, the first air gap 21 may be positioned between the neighboring island type active regions 14I in the first direction, and the second air gap 40 may be positioned between the neighboring island type active regions 14I in the second direction. Therefore, parasitic capacitance between neighboring bit lines 32 may be decreased to improve the speed of the semiconductor device.

According to the embodiments, an air gap formed in a device isolation region may be formed and thus parasitic capacitance can be reduced.

While the present invention has been described with respect to specific embodiments, it will be apparent to those skilled in the art that various changes and modifications may be made without departing from the spirit and scope of the invention as defined in the following claims.

What is claimed is:

1. A semiconductor device comprising:
 a semiconductor substrate comprising an active region, and a device isolation region that isolates the active region; and
 a buried bit line and a buried gate electrode formed in the semiconductor substrate,
 wherein the device isolation region comprises:
 a first device isolation region extending in a first direction; and
 a second device isolation region extending in a second direction crossing with the first direction, and having an air gap,
 wherein the buried bit line is formed in a bit line trench extending in a third direction crossing with the first and second directions.

2. The semiconductor device according to claim 1,
 wherein the active region extends in the first direction and the second direction,
 wherein the first device isolation region is positioned between neighboring active regions in the second direction, and
 wherein the second device isolation region is positioned between neighboring active regions in the first direction.

3. The semiconductor device according to claim 1,
 further comprising a first isolation trench extending in the first direction,
 wherein the first device isolation region is formed in the first isolation trench.

4. The semiconductor device according to claim 1,
 further comprising a second isolation trench extending in the second direction,
 wherein the second device isolation region is formed in the second isolation trench.

5. The semiconductor device according to claim 4,
 wherein the second isolation trench comprises:
 an upper isolation trench; and
 a lower isolation trench that has a bulb shape and is wider than the upper isolation trench,
 wherein the air gap is formed in the lower isolation trench.

6. The semiconductor device according to claim 1,
 further comprising a gate trench comprising a bottom surface, a first side surface and a second side surface opposite to the first side surface,
 wherein the buried gate electrode is formed in the gate trench.

7. The semiconductor device according to claim 6,
 wherein the gate trench comprises:
 a first trench extending in the second direction; and
 second and third trenches stemming from the first trench and extending in the first direction.

8. The semiconductor device according to claim 7,
 wherein the buried gate electrode comprises:
 a first electrode buried in the first trench of the gate trench;
 a second electrode buried in the second trench of the gate trench; and
 a third electrode buried in the third trench of the gate trench.

9. The semiconductor device according to claim 1,
 further comprising a body trench under the buried bit line and a punch-through prevention layer formed in the body trench,
 wherein the punch-through prevention layer is positioned in the active region.

10. The semiconductor device according to claim 1,
 wherein the active region comprises a body and a pillar vertically extending over the body, and
 wherein the pillar comprises:
 a first junction region electrically coupled to the bit line;
 a second junction region vertically positioned relative to the first junction region; and a channel positioned between the first and second junction regions, and overlapping with the buried gate electrode.

11. The semiconductor device according to claim 10, further comprising a memory element electrically coupled to the second junction region.

12. A semiconductor device comprising:
a semiconductor substrate comprising an active region, and a device isolation region that isolates the active region; and
a buried bit line and a buried gate electrode formed in the substrate,
wherein the device isolation region comprises:
a first device isolation region extending in a first direction and having a first air gap; and
a second device isolation region extending in a second direction crossing with the first direction, and having a second air gap, and
wherein the active region is defined by the first and second device isolation regions,
wherein the buried bit line is formed in a bit line trench extending in a third direction crossing with the first and second directions.

13. The semiconductor device according to claim 12, wherein the active region extends in the first direction and a the second direction,
wherein the first device isolation region is positioned between neighboring active regions in the second direction, and
wherein the second device isolation region is positioned between neighboring active regions in the first direction.

14. The semiconductor device according to claim 12, wherein the semiconductor substrate comprises a line type first isolation trench extending in the first direction, and
wherein the first device isolation region is formed in the first isolation trench.

15. The semiconductor device according to claim 12, wherein the semiconductor substrate further comprises a second isolation trench extending in the second direction, and
wherein the second device isolation region is formed in the second isolation trench.

16. The semiconductor device according to claim 15, wherein the second isolation trench comprises:
an upper isolation trench; and
a lower isolation trench that has a bulb shape and is wider than the upper isolation trench, and
wherein the first air gap is formed in the lower isolation trench.

17. The semiconductor device according to claim 12, further comprising a body trench under the buried bit line and a punch-through prevention layer formed in the body trench.

18. The semiconductor device according to claim 12, wherein the semiconductor substrate further comprises a pillar comprising:
a first junction region electrically coupled to the buried bit line;
a second junction region vertically positioned relative to the first junction region; and
a vertical channel positioned between the first and second junction regions, and overlapping with the gate electrode.

* * * * *